(12) United States Patent
Fujii

(10) Patent No.: US 7,470,604 B2
(45) Date of Patent: Dec. 30, 2008

(54) METHOD FOR MANUFACTURING DISPLAY DEVICE

(75) Inventor: Gen Fujii, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 473 days.

(21) Appl. No.: 11/244,039

(22) Filed: Oct. 6, 2005

(65) Prior Publication Data
US 2006/0121745 A1 Jun. 8, 2006

(30) Foreign Application Priority Data
Oct. 8, 2004 (JP) .............................. 2004-296525

(51) Int. Cl.
H01L 21/24 (2006.01)
H01L 21/40 (2006.01)
G02F 1/136 (2006.01)

(52) U.S. Cl. ..................... 438/538; 349/42; 349/43; 349/45; 349/46; 349/47

(58) Field of Classification Search ................. 438/538, 438/164; 349/42–47
See application file for complete search history.

(56) References Cited

U.S. PATENT DOCUMENTS 7,273,773 B2 9/2007 Yamazaki et al.
2004/0253368 A1 12/2004 Tokuda
2005/0196710 A1 9/2005 Shiroguchi
2005/0221203 A1 10/2005 Fujii
2006/0038174 A1 2/2006 Mackawa
2006/0040435 A1 2/2006 Morisue et al.
2008/0012076 A1 1/2008 Yamazaki et al.

FOREIGN PATENT DOCUMENTS

| JP | 11-251259 | 9/1999 |
| WO | WO 2004/060025 A1 | 7/2004 |
| WO | WO 2005/077549 A1 | 8/2005 |
| WO | WO 2005/091375 A1 | 9/2005 |
| WO | WO 2005/093813 A1 | 10/2005 |

*Primary Examiner*—Ha Tran T Nguyen
*Assistant Examiner*—Valerie Brown
(74) *Attorney, Agent, or Firm*—Nixon Peabody LLP; Jeffrey L. Costellia

(57) ABSTRACT

The present invention, the quality of the surface of a substrate is improved and the wettability thereof is controlled by light irradiation from the reverse side with respect to the substrate having the conductive layer. A conductive material or an insulating material is adhered on the modified surface by discharging it (including jetting, etc.), or the like to form a conductive layer and an insulating layer. The processing efficiency by the light can be enhanced by function of the light absorption and energy radiation of the photocatalytic substance. Furthermore, the mask layer is formed selectively on the conductive layer and the wettability of the region on the conductive layer that is a non-irradiation region is also controlled.

11 Claims, 30 Drawing Sheets

119

A　　　　　　　　　　　　　　　C

B　　　　　　　　　　　　　　　D

METHOD FOR MANUFACTURING DISPLAY DEVICE

TECHNICAL FIELD

The present invention relates to a method for manufacturing a display device.

BACKGROUND ART

A thin film transistor (hereinafter, also referred to as a TFT) and an electronic circuit using the TFT have been formed as follows: various kinds of thin films such as a semiconductor, an insulator, and a conductor are laminated over a substrate, and the thin films are processed into a predetermined pattern appropriately by a photolithography technique. The photolithography technique is a technique for transferring a pattern such as a circuit which is formed of a light-shielding material over a flat transparent plate that is referred to as a photomask, over a substrate by using light. The technique has been widely used in a process of manufacturing a semiconductor integrated circuit and the like.

In the conventional manufacturing process using the photolithography technique, many processes such as light-exposing, developing, baking, and separating are required even in the case of handling a mask pattern, which is formed of a photosensitive organic resin material that is referred to as a photoresist. Increasing the number of processes for photolithography increases the manufacturing cost eventually. In order to overcome such a problem manufacturing a TFT has been attempted by reducing the photolithography process (e.g., see patent document 1).

[Patent document 1]: Japanese Patent Application Laid-Open No. Hei 11-251259

SUMMARY OF THE INVENTION

It is an object of the present invention to provide a technique for reducing the number of photolithography processes in processes for manufacturing a TFT, an electronic circuit using the TFT, and a display device using the TFT so as to simplify the manufacturing processes, and to provide a large-size substrate with 1 m or more on a side at lower cost with good yield.

It is another object of the present invention to provide a technique for forming a formation of such as a wiring constituting a display device in a desired shape with good controllability.

According to the present invention, by light irradiation, an irradiation region is modified and a wettability of the region is controlled. A substance controlling the wettability of a surface by light irradiation is formed at the irradiation region. The substance controlling the wettability is formed over a light-transmitting substance, and the surface of substance controlling the wettability is irradiated with light through the light-transmitting substance from the light-transmitting substance side. On this occasion, an unirradiated region is provided by forming a conductive layer as a mask between the light-transmitting substance and the substance controlling the wettability; thus, a region to be modified can be accurately controlled. Then, a conductive material or an insulating material is adhered on the modified surface by discharging method (including jetting or the like), or the like to form a conductive layer and an insulating layer.

A photoactive substance having a characteristic that the wettability is changed by light is formed at a light irradiation region as a method of changing and controlling the wettability of a surface. When the photoactive substance is irradiated with light, the wettability with respect to a subject material is changed in the surface of the region. In other words, a contact angle and surface energy with respect to the subject material is changed. Using this characteristic, a wavelength of light which the photoactive substance reacts with is selected, and the wettability with respect to the subject material can be controlled.

In addition, as another method of changing and controlling the wettability of the surface, there is a method of decomposing the substance of the surface, modifying the surface of the region, and changing the wettability by energy of light irradiation. In this case, it is preferred that a substance enhancing processing efficiency by light is formed in a light irradiation region and a low-wettability substance with respect to the subject material is formed. A photocatalytic substance can be used as the substance enhancing processing efficiency by the light. The photocatalytic substance enhances the processing efficiency by the light by function of the light absorption and energy radiation. By a light active energy of the photocatalytic substance, a low-wettability substance with respect to the subject material to be laminated is decomposed and modified, and the wettability of the substance surface is changed. As the low-wettability substance, a substance containing a fluorocarbon chain or a substance containing a silane coupling agent can be used. Since a silane coupling agent can form a monomolecular film, decomposition and modification can be efficiently carried out, and the wettability can be changed in a short time. In addition, the silane coupling agent can be used since the low-wettability is presented by arranging not only a substance containing a fluorocarbon chain but also a substance containing an alkyl group on the substrate.

In the present invention, before forming the photoactive substance or the low-wettability substance, a mask layer is formed in a part of a region not irradiated by light in which the wettability can not be controlled by light irradiation. Since the photoactive substance, or the low-wettability substance can be formed selectively by the mask layer, the wettability of the subject region of the mask layer can be controlled.

A display device according to the present invention includes a light emitting display device including an a TFT connected to a light emitting element in which an organic material producing luminescence referred to as electroluminescence (hereinafter also referred to as "EL") or a layer including a mixture of an organic material and an inorganic material is sandwiched between electrodes; and a liquid crystal display device in which a liquid crystal element having a liquid crystal material is used as a display element.

In an aspect of the present invention, a method for manufacturing a display device includes the steps of: forming a first conductive layer having a non-light-transmitting property over a substrate having a light-transmitting property; forming an insulating layer over the substrate and the first conductive layer; forming a mask layer selectively on the insulating layer overlapping with the first conductive layer; forming a photoactive substance on the insulating layer and the mask layer; forming a first region and a second region having higher-wettability with respect to a composition containing a conductive material than the first region by passing light through the substrate and irradiating the photoactive substance with light; removing the mask layer and the photoactive substance which is formed over the mask layer; forming a third region having higher-wettability with respect to the composition containing the conductive material than the first region; and forming a second conductive layer using the composition containing the conductive material on the second region and the third region.

In an aspect of the present invention, a method for manufacturing a display device includes the steps of: forming a first conductive layer containing a gate electrode region and a gate wiring region and having a non-light-transmitting property on a substrate having a light-transmitting property; forming an insulating layer on the substrate and the first conductive layer; forming a semiconductor layer on the insulating layer overlapping with the gate electrode region; forming a mask layer selectively on the insulating layer overlapping with the gate wiring region; forming a photoactive substance on the semiconductor layer and the mask layer; irradiating the photoactive substance by passing light through the substrate to form a first region and a second region having higher-wettability with respect to a composition containing a conductive material than the first region; removing the mask layer and the photoactive substance which is formed over the mask layer; forming a third region having higher-wettability with respect to the composition containing the conductive material than the first region; and forming a second conductive layer using the composition containing a conductive material on the second region and the third region.

In an aspect of the present invention, a method for manufacturing a display device includes the steps of: forming a first conductive layer having a non-light-transmitting property over a substrate having a light-transmitting property; forming an insulating layer over the substrate and the first conductive layer; forming a photocatalytic substance over the insulating layer; forming a mask layer selectively over the insulating layer and the photocatalytic substance overlapping with the first conductive layer; forming a substance containing a fluorocarbon chain on the photoactive substance and the mask layer; irradiating the photocatalytic substance by passing light through the substrate to form a first region and a second region having higher-wettability with respect to a composition containing a conductive material than the first region; removing the mask layer and the substance containing a fluorocarbon chain which is formed over the mask layer; forming a third region having higher-wettability with respect to the composition containing the conductive material than the first region; and forming a second conductive layer using the composition containing the conductive material on the second region and the third region.

In an aspect of the present invention, a method for manufacturing a display device includes the steps of: forming a first conductive layer containing a gate electrode region and gate wiring region and having a non-light-transmitting property over the substrate having a light-transmitting property; forming an insulating layer over the substrate and the first conductive layer; forming a semiconductor layer on the insulating layer overlapping with the gate electrode region; forming a photocatalytic substance over the insulating layer and the semiconductor layer; forming a mask layer selectively over the photocatalytic substance overlapping with the gate wiring region; forming a substance containing a fluorocarbon chain over the photocatalytic substance and the mask layer; irradiating the photocatalytic substance by passing light through the substrate to form a first region and a second region having higher-wettability with respect to a composition containing a conductive material than the first region; removing the mask layer and the substance containing a fluorocarbon chain which is formed over the mask layer; forming a third region having higher-wettability with respect to the composition containing the conductive material than the first region; and forming a second conductive layer using the composition containing the conductive material on the second region and the third region.

In an aspect of the present invention, a method for manufacturing a display device includes the steps of: forming a first conductive layer having a non-light-transmitting property over a substrate having a light-transmitting property; forming an insulating layer over the substrate and the first conductive layer; forming the photoactive substance over the insulating layer; forming a mask layer selectively over the insulating layer and the photoactive substance overlapping with the first conductive layer; forming a substance containing a silane coupling agent on the photocatalytic substance and the mask layer; irradiating the photocatalytic substance by passing light through the substrate to form a first region and a second region having higher-wettability with respect to a composition containing a conductive material than the first region; removing the mask layer and the substance containing the silane coupling agent which is formed over the mask layer; forming a third region having higher-wettability with respect to the composition containing the conductive material than the first region; and forming a second conductive layer using the composition containing the conductive material on the second region and the third region.

In an aspect of the present invention, a method for manufacturing a display device includes the steps of: forming a first conductive layer containing a gate electrode region and a gate wiring region and having a non-light-transmitting property over a substrate having a light-transmitting property; forming an insulating layer over the substrate and the first conductive layer; forming a semiconductor layer on the insulating layer overlapping with the gate electrode region; forming a photocatalytic substance over the insulating layer and the semiconductor layer; forming a mask layer selectively over the photocatalytic substance overlapping with the gate wiring region; forming a substance containing a silane coupling agent over the photocatalytic substance and the mask layer; irradiating the photocatalytic substance by passing light through the substrate to form a first region and a second region having higher-wettability with respect to a composition containing a conductive material than the first region; removing the mask layer and the substance containing the silane coupling agent which is formed over the mask layer; forming a third region having higher-wettability with respect to the composition containing the conductive material of the first region; and forming a second conductive layer using the formation containing the conductive material on the second region and the third region.

In the above mentioned structures, a substance containing a triphenylmethane derivative, a substance containing an azobenzene derivative, or a substance containing a spiropyran derivative may also be used as the photoactive substance. In the above mentioned structures, a silane coupling agent having an alkyl group may also be used as the silane coupling agent. In addition, in the above mentioned structures, a titanium oxide film can be formed using a titanium oxide having a photocatalytic function as the photocatalytic substance.

According to the present invention, a desired pattern can be formed with good controllability, and cost can be reduced with minimal loss of materials, making it possible to manufacture a high-performance and highly reliable display device at good yield.

DETAILED DESCRIPTION OF THE PREFERRED EMBODIMENTS

Figure 1A:
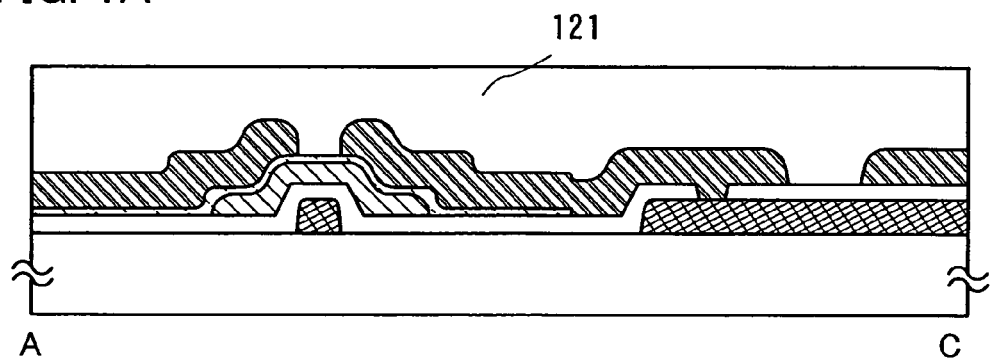
FIGS. 1(A) and 1(B) a method for manufacturing a display device according to the present invention.

The embodiment modes according to the present invention will hereinafter be described referring to the accompanying drawings. It is easily understood by those who skilled in the art that the embodiment modes and details herein disclosed can be modified in various ways without departing from the purpose and the spirit of the present invention. The present invention should not be interpreted as being limited to the description of the embodiment modes to be given below. Identical portions or portions having similar functions are marked by same reference numerals throughout the drawings so as to eliminate repeated explanation.

Embodiment Mode 1

Figure 25A:
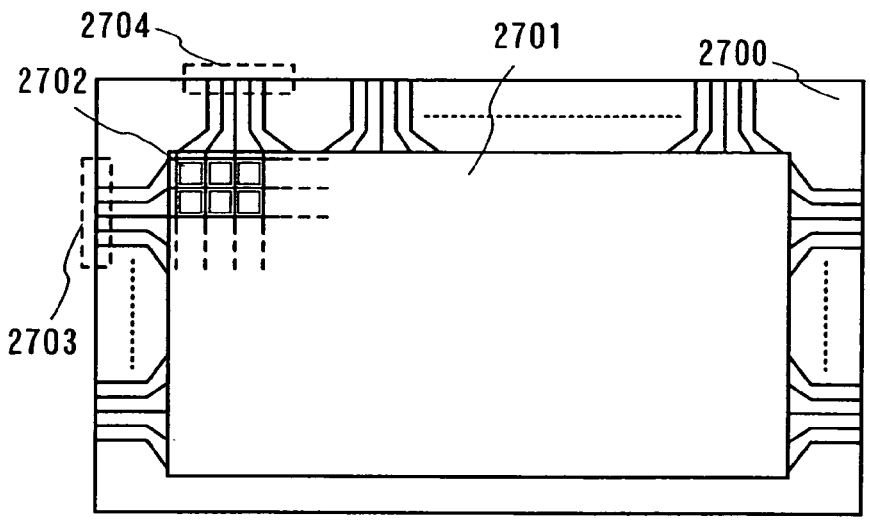
FIGS. 25(A) to 25(C) are top views of display devices according to the present invention.

FIG. 25(A) is a top view showing a structure of a display panel according to the present invention. A pixel portion 2701 in which pixels 2702 are arranged in a matrix form, a scanning line side input terminal 2703 and a signal line side input terminal 2704 are formed over a substrate 2700 with an insulated surface. The number of pixels may be determined in accordance with various standards. The number of pixels for XGA may be 1,024×768×3 (RGB), and that for UXGA may be 1,600×1,200×3 (RGB). In the case of forming a display panel corresponding to a full-specification high-definition, the number of pixels may be 1,920×1,080×3 (RGB).

The pixels 2702 are arranged in a matrix form by intersecting scanning lines that extend from the scanning line side input terminal 2703 with signal lines that extend from the signal line side input terminal 2704. Each pixel 2702 includes a switching element and a pixel electrode connecting to the switching element. A TFT is a representative example of the switching element. Connecting a gate electrode side of the TFT to the scanning line and connecting a source or drain side thereof to the signal line allows to control respective pixels independently by a signal inputted from an external portion.

Figure 30A:
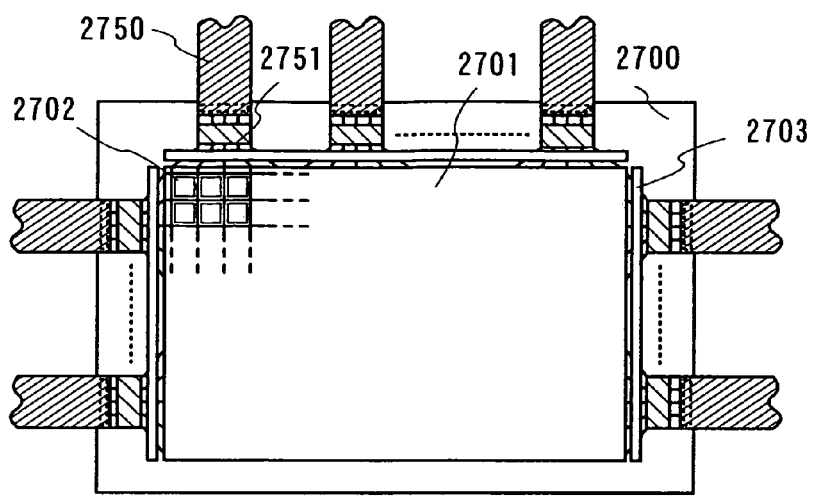
FIGS. 30(A) to 30(B) are top views of display devices according to the present invention.
Figure 30B:
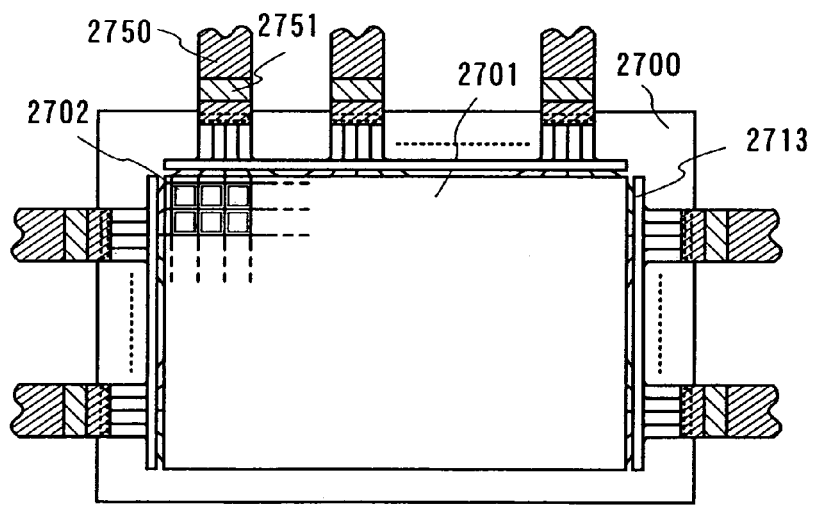

FIG. 25(A) shows a structure of a display panel that controls a signal being inputted into the scanning lines and the signal lines by an external driver circuit. As shown in FIG. 30(A), driver ICs 2751 may be mounted over a substrate 2700 by a COG (Chip on Glass) technology. As shown in FIG. 30(B), a TAB (Tape Automated Bonding) technology may be used as another mounting mode. The driver ICs may be formed over a single crystal semiconductor substrate or may have a circuit formed with a TFT over a glass substrate. In FIGS. 30(A) and 30(B), the driver ICs 2751 are connected to FPCs 2750, respectively.

Figure 25B:
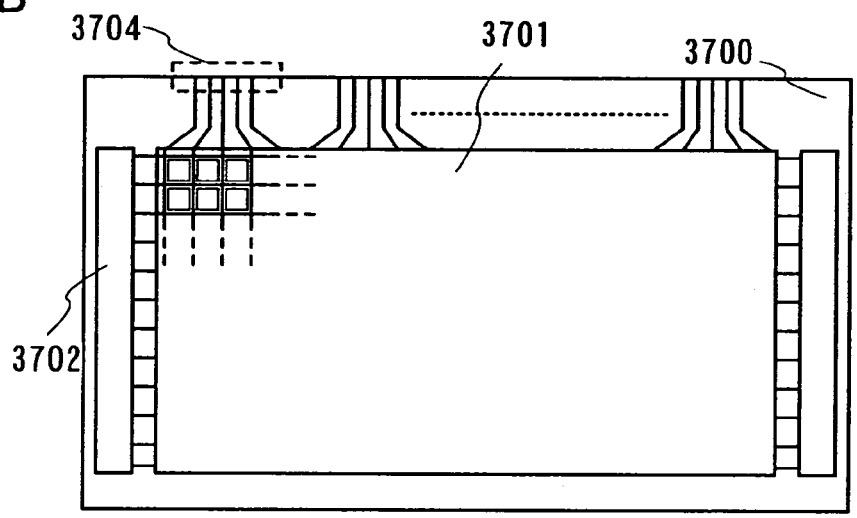
Figure 25C:
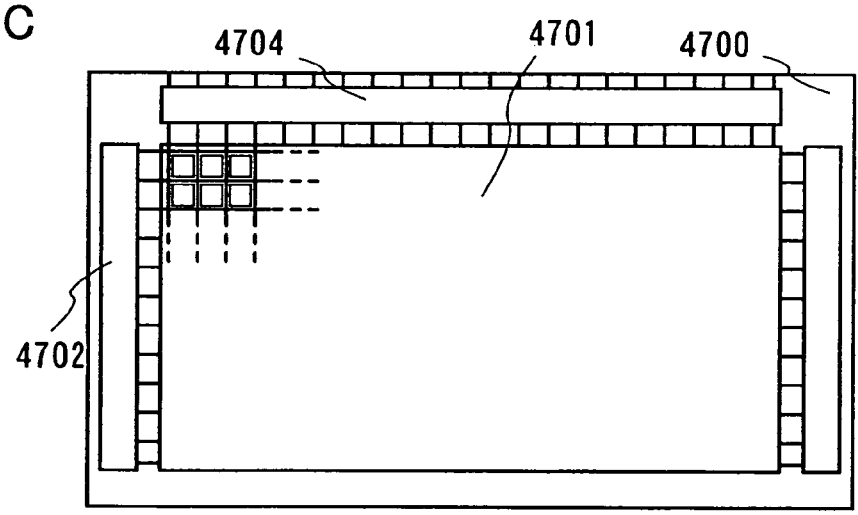

In the case where a TFT that is formed in a pixel is made using a polycrystalline (microcrystalline) semiconductor having high crystallinity, a scanning line side driver circuit 3702 can be integrated over a substrate 3700 as shown in FIG. 25(B). In FIG. 30(B), reference numeral 3701 represents a pixel portion and a signal line side driver circuit is controlled by an external driver circuit as well as FIG. 25(A). When a TFT formed in the pixel is made using a polycrystalline (microcrystalline) semiconductor, a single crystalline semiconductor or the like having high mobility like a TFT formed by the present invention, a scanning line driver circuit 4702 and a signal line driver circuit 4704 can be integrated over a glass substrate 4700 as shown in FIG. 25(C).

One feature of the present invention is that at least one or more of materials (existing in various modes like a film or a layer according to a purpose and a function) necessary for manufacturing a display panel such as a conductive layer for forming a wiring layer or an electrode, and a mask layer used for forming a predetermined pattern is/are selectively formed to have a desired shape or desired shapes so as to manufacture a display device. The present invention can be applied to all component elements formed to have predetermined shapes like conductive layers such as a gate electrode layer, a source electrode layer and a drain electrode layer, a semiconductor layer, a mask layer, an insulating layer, and the like which are used for forming a thin film transistor or a display device. A droplet discharging (jetting) method (also referred to as an ink jet method depending on its system) in which a conductive layer, an insulating layer or the like is formed and a liquid of composition that is prepared for a certain purpose is selectively discharged (jetted) thereon to form a predetermined pattern is used as a method for forming a pattern having a predetermined shape selectively. Additionally, a technique in which the material having a predetermined shape can be transferred or written, for example, various kinds of printing methods (e.g., methods for forming predetermined patterns such as a screen (mimeograph) printing method, an offset (planography) printing method, a relief printing method, and a gravure (copperplate) printing method can be used.

A method in which a composition containing a material having fluidity is discharged (jetted) as a droplet to form a desired pattern is used in this embodiment mode. A droplet containing a material to be formed is discharged in a subject region on which a formation will be formed, and then baking and drying and the like are performed to solidify the droplet, thereby obtaining a desired pattern. In the present invention, a pretreatment is carried out in the subject region on which the formation will be formed.

Figure 23:
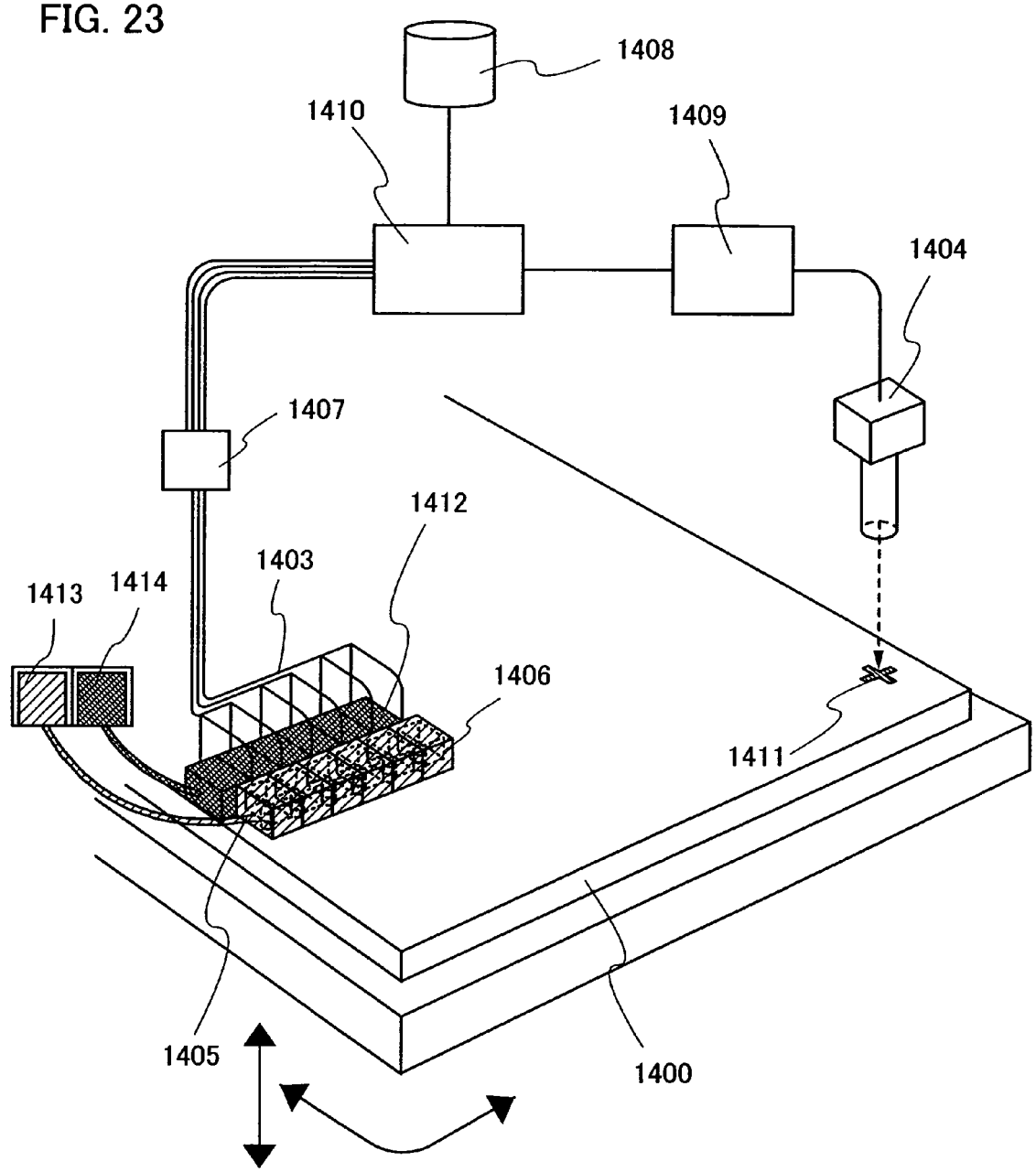
FIG. 23 is a view describing a structure of a droplet discharge device which is applicable to the present invention.

One mode of a droplet discharging device used for the droplet discharging method is shown in FIG. 23. Individual heads 1405 and 1412 of a droplet discharging portion 1403 are connected to a controlling portion 1407. By controlling the respective heads using a computer 1410, a pattern that has been programmed in the computer in advance can be written. For example, the timing of writing the pattern may be determined with reference to a marker 1411 formed over a substrate 1400. Alternatively, the edge of the substrate 1400 may be determined as a reference point. The marker 1411 is detected by an imaging portion 1404 and converted into a digital signal in an image processing portion 1409. When the digital signal is recognized by the computer 1410, a control signal is generated and sent to the controlling portion 1407. As the imaging portion 1404, a charge-coupled device (CCD), an image sensor utilizing a complementary metal-oxide semiconductor, or the like can be used. Of course, information of the pattern to be formed over the substrate 1400 is stored in a recording medium 1408. The control signal is sent to the controlling portion 1407 based on this information so that the heads 1405 and 1412 of the droplet discharging portion 1403 can be controlled individually. The material to be discharged is supplied to the head 1405 and the head 1412 respectively through piping from a material supply source 1413 and a material supply source 1414.

Spaces to be filled with a liquid material as depicted by dashed lines 1406 and nozzles, which are discharge ports, are formed inside of the head 1405. The head 1412 also has a similar inner structure to the head 1405, though not shown in the drawing. When the different-sized nozzles for the head 1405 and the head 1412 are provided, patterns with different widths can simultaneously be written using different materials. A conductive material, an organic material, an inorganic material and the like can be discharged respectively through one head to write patterns. When, for example, a pattern like an interlayer film is written in a large region, a same material can be simultaneously discharged through plural nozzles to write the pattern so that throughput can be increased. In the case of using a large size substrate, the heads 1405 and 1412 can scan freely over the substrate in directions of arrows, and therefore, a region to be written can be set freely. Accordingly, plural same patterns can be written over one substrate.

In the present invention, the vicinity of a subject region to be provided with a formation is irradiated with light to modify the surface selectively as the pretreatment. According to this modification treatment, at least two or more kinds of regions having different adherence properties with respect to the formation can be formed in the region on which the composition containing a material to be formed is discharged. A composition containing a conductive material or an insulating material is adhered to the modified surface to form the conductive layer or the insulating layer. The conductive layer or the insulating layer can be formed in a self-aligned manner by light-exposure from the back of the substrate. Consequently, according to the present invention, a thin film transistor can be formed in a self-aligned manner.

Light used for the modification treatment includes, but not limited to, infrared light, visible light, or ultraviolet light or a combination thereof. For example, light emitted from an ultraviolet lamp, a black light, a halogen lamp, a metal halide lamp, a xenon arc lamp, a carbon arc lamp, a high pressure sodium lamp, or a high pressure mercury lamp may be used. In that case, the lamp light source may be lighted and irradiated for a required time, or may be irradiated plural times.

Further, a laser light may be used as the light for modification. A laser oscillator capable of emitting ultraviolet light, visible light, or infrared light can be used. For example, an excimer laser oscillator of ArF, KrF, XeCl, Xe, or the like, a gas laser oscillator of He, He—Cd, Ar, He—Ne, HF, or the like, a solid-state laser oscillator using a crystal of YAG, $GdVO_4$, $YVO_4$, YLF, $YAlO_3$, or the like doped with Cr, Nd, Er, Ho, Ce, Co, Ti, or Tm, or a semiconductor laser oscillator of GaN, GaAs, GaAlAs, InGaAsP, or the like can be used. In the case of using a solid-state laser oscillator, it is preferable to apply first to fifth harmonics of the fundamental wave. An optical system including a shutter, a reflector such as a mirror or a half mirror, and a cylindrical lens or a convex lens, and the like may be used for controlling the shape and the course of the laser beam emitted from a laser oscillator.

The substrate may be moved for selective light irradiation, or light may be moved in X-Y axes direction for light irradiation. In this case, a polygon mirror or a galvanometer mirror is preferably used in the optical system.

Also, light of a lamp source can be used in combination with laser light. In this case, the region which is carried out comparatively wide patterning performs the irradiating treatment by using the lamp and can also be performed the irradiating treatment by using the laser light with respect to only a microscopic region. According to this light irradiation treatment, the throughput can be improved and a wiring substrate and a display device or the like that is patterned precisely can be obtained.

An example of forming a conducting layer as a formation is described. In the case of forming an insulating layer, a composition including an insulating material may be used as a discharging material. In this embodiment mode, light is irradiated from the back of the substrate to modify so as to change the wettability of the irradiated region. Thus, regions having different wettabilities for a composition containing a conductive material are formed in the vicinity of a region where the conductive layer is to be formed. The wettability of the regions for the composition containing the conductive material may have relative difference between the wettability of the formation forming region and the periphery thereof where a formation is not formed. The regions having different wettabilities have different contact angles to the composition including a conductive material. A region having a larger contact angle to the composition including a conductive material is a region having lower wettability (hereinafter, also referred to as a low-wettability region), and a region having a smaller contact angle is a region having high-wettability (hereinafter, also referred to as a high-wettability region). This is because when a contact angle is large, a liquid composition having fluidity does not spread and is repelled on the surface of the region; therefore, the surface is not wetted; and when a contact angle is small, a composition having fluidity spreads over the surface, and the surface is wetted. Accordingly, the regions having different wettability have different surface energy. The surface of the low-wettability region has low surface energy, and the surface of the high-wettability region has high surface energy. In the present invention, the difference of contact angles between the regions having different wettability is 30° or more, preferably, 40° or more.

In this embodiment mode, light irradiation treatment is performed to form regions having different wettability. The subject region is modified selectively by the light. A photoactive substance having a characteristic that the wettability is changed by the light is formed at a light irradiation region as a method of changing and controlling the wettability of a surface. When the photoactive substance is irradiated with light, the wettability with respect to a subject region is changed in the surface of the region. In other words, a contact angle and surface energy with respect to the subject material are changed. Using this characteristic, a wavelength of the light which the photoactive substance reacts with is selected, and the wettability with respect to the subject material can be controlled.

In the subject region, the high-wettability photoactive substance, or the low-wettability photoactive substance with respect to a forming material is formed as the pretreatment in order to modify processing efficiency is enhanced, and make larger differential of the wettability with the irradiation region and the non-irradiation region, and it is preferred that the wettability of the surface of the subject region is comparatively high state or low state. Those substances are formed over the subject region and the periphery thereof, and treatment for selectively enhancing wettability and treatment for selectively decreasing wettability are performed with the use of the light. In this embodiment mode, the photoactive substance which is the low-wettability with respect to the composition containing the conductive material in the subject region of the conductive layer and, irradiates the photoactive substance with light of such a degree that the substance is changed in quality (modifying). The wettability of the processing region is enhanced, and a high-wettability region is formed by changing in quality (modifying) of the photoactive substance in the processing region (or decomposition, and removing may be performed). The photoactive substance should be a substance containing a material having the advantage that changes the wettability by light irradiation, and a change of the quality of this photoactive substance is produced by the light irradiation processing.

Figure 1B:
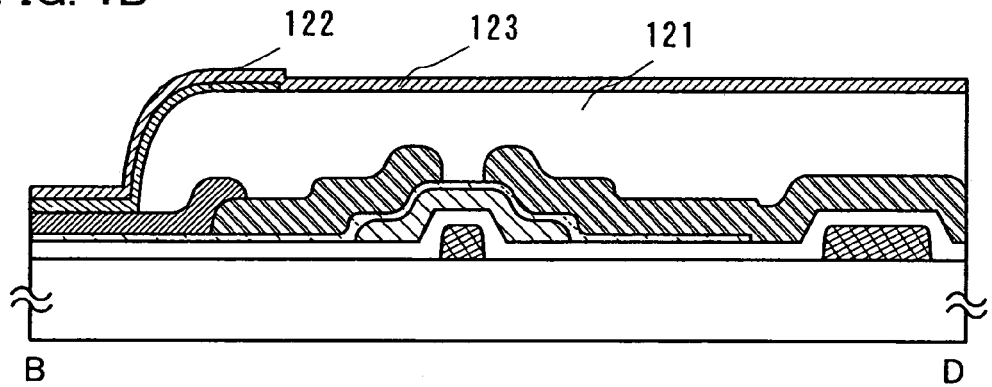
Figure 2A:
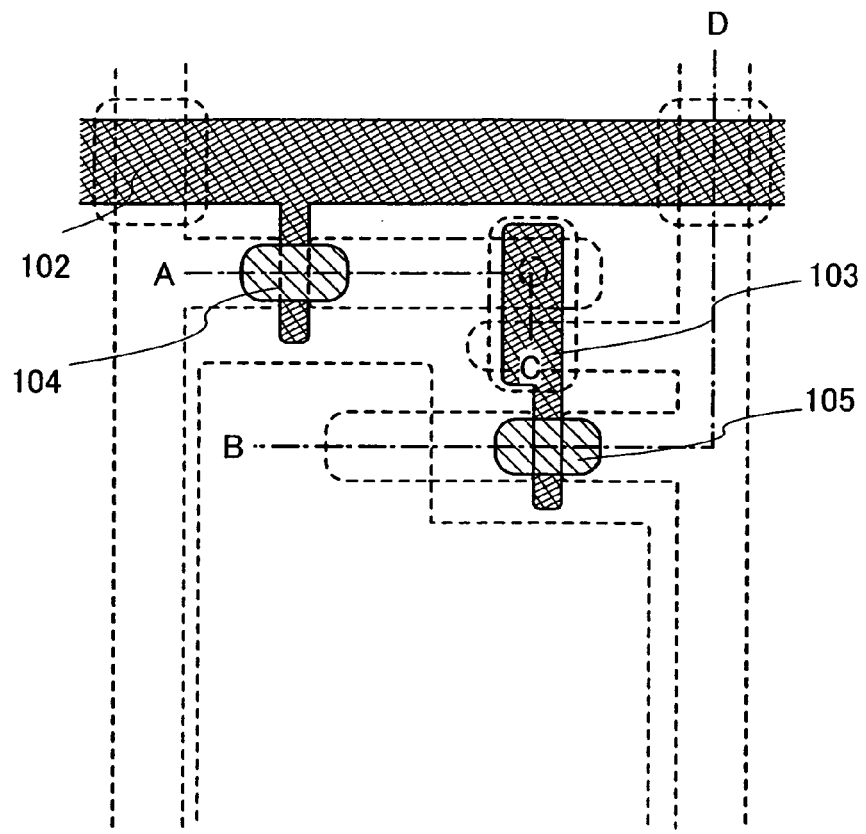
FIGS. 2(A) to 2(C) illustrate a method for manufacturing a display device according to the present invention.
Figure 2B:
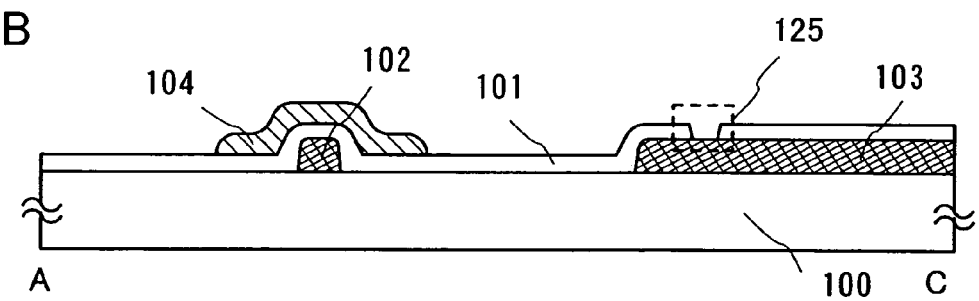
Figure 2C:
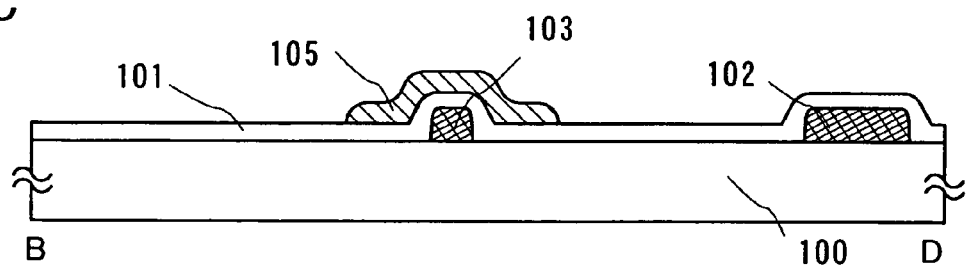
Figure 6A:
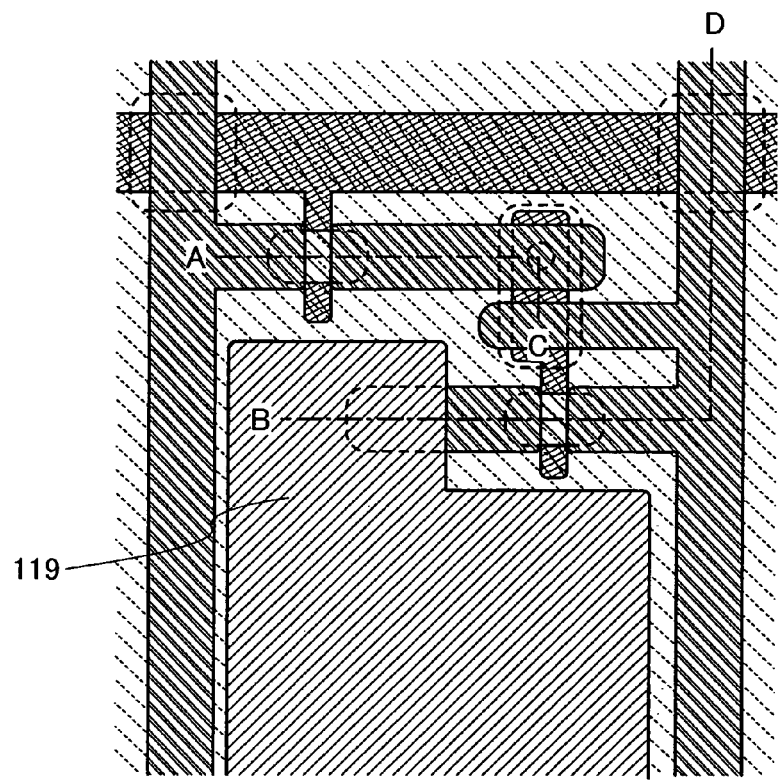
FIGS. 6(A) to 6(C) illustrate a method for manufacturing a display device according to the present invention.
Figure 6B:
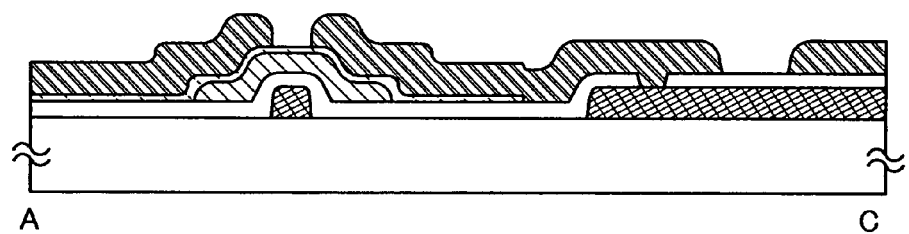
Figure 6C:
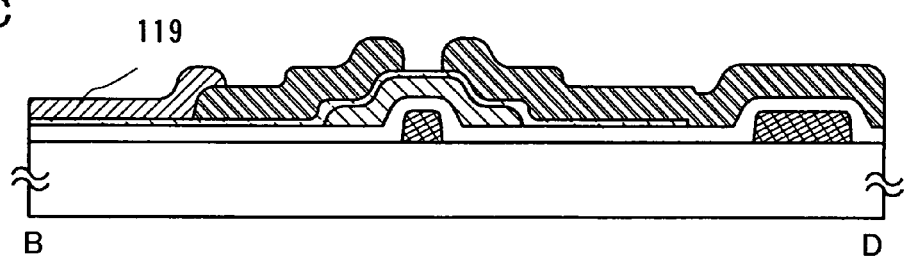
Figure 7A:
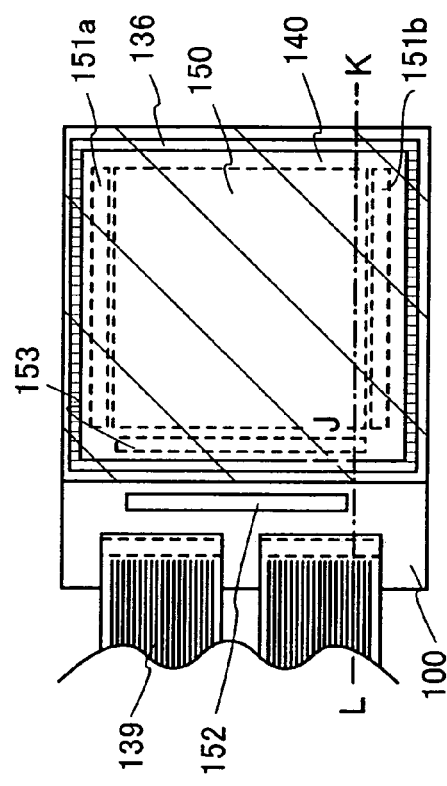
FIGS. 7(A) and 7(B) illustrate a method for manufacturing a display device according to the present invention.
Figure 7B:
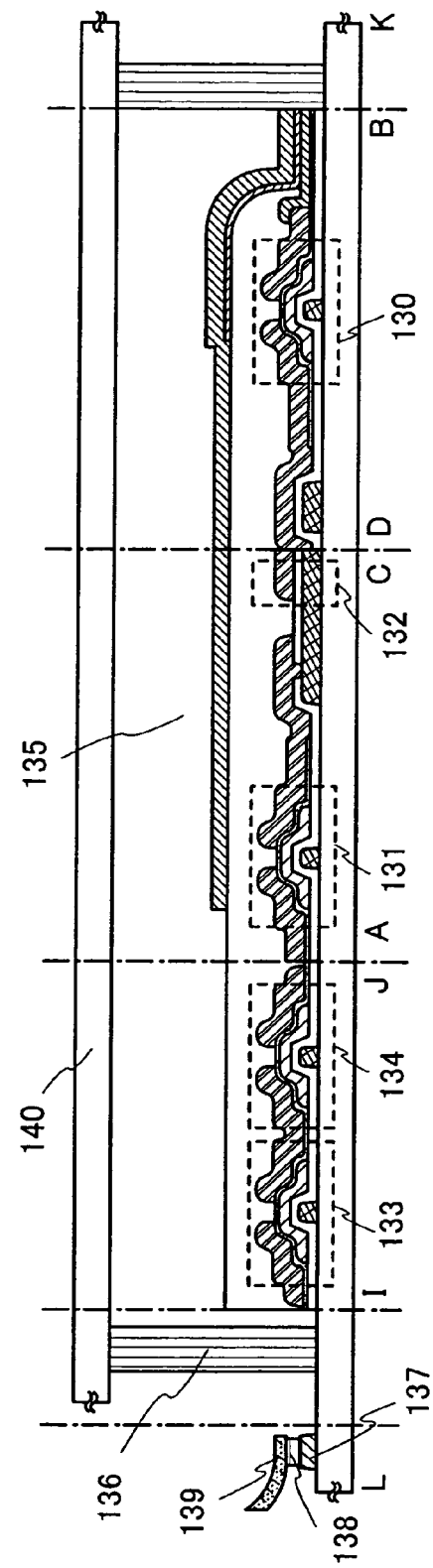

One embodiment mode of the present invention will be described with reference to FIGS. 1(A) to 7(B). Specifically, a method for manufacturing a display device having an inversely staggered thin film transistor according to the present invention will be described. FIGS. 2(A), 3(A), 4(A), 5(A) and 6(A) are top views of a pixel portion of the display device. FIGS. 2(B), 3(B), 4(B), 5(B) and 6(B) are cross sectional views along lines A-C at FIGS. 2(A), 3(A), 4(A), 5(A) and 6(A) while FIGS. 2(C), 3(C), 4(C), 5(C) and 6(C) are cross sectional views along lines B-D at FIGS. 2(A), 3(A), 4(A), 5(A) and 6(A). FIGS. 1(A) and 1(B) are cross sectional views of the display device and FIG. 7(A) is a top view of the display device. FIG. 7(B) is a cross sectional view along lines L-K (including lines I-J) at FIG. 7(A).

As a substrate 100 having a light-transmitting property, a glass substrate including a barium borosilicate glass, an alumino borosilicate glass, or the like, a quartz substrate, a heat-resistant plastic substrate that can withstand a processing temperature of the manufacturing process, or the like can be used. The surface of the substrate 100 having the light-transmitting property may be polished by a CMP method or the like so as to planarize the surface thereof. An insulating layer may be formed on the substrate 100 having the light-transmitting property. The insulating layer is formed with an oxide material containing silicon or a nitride material containing silicon by a known method such as a CVD method, a plasma CVD method, a sputtering method or a spin coating method so as to have a single layer or a lamination layer. This insulating layer may not necessarily be formed. When the insulating layer is formed, it can prevent contaminants from penetrating, from the substrate 100 having the light-transmitting property. In the present invention, in modifying the formation subject region, a surface of the formed substance is modified by being irradiated with light through the light-transmitting substrate 100 by back light exposure. Accordingly, the light-transmitting substrate 100 is required to be a substance which transmits enough light to modify the formation subject region.

Gate electrode layers 102 and 103 are formed over the light-transmitting substrate 100. The gate electrode layers 102 and 103 can be formed by a CVD method, a sputtering method, a droplet discharging method, or the like. The gate electrode layers 102 and 103 may be formed with an element selected from Ag, Au, Ni, Pt, Pd, Ir, Rh, Ta, W, Ti, Mo, Al, and Cu, an alloy material or a compound material containing the above element as its main component. Alternatively, a semiconductor film typified by a polycrystalline silicon film doped with an impurity element such as phosphorus, or AgPdCu alloy may be used. Either a single layer structure or a layered structure may be used. For example, a two-layer structure of a tungsten nitride (TiN) film and a molybdenum (Mo) film, or a three-layer structure in which a 50-nm-thick tungsten film, a 500 mm thick alloy (Al—Si) film of aluminum and silicon, and a 30-nm-thick titanium nitride film are stacked in order may be used. Further, in the case of the three-layer structure, tungsten nitride may be used instead of the tungsten of the first conductive film, an alloy (Al—Ti) film of aluminum and titanium may be used instead of the alloy (Al—Si) film of silicon and aluminum of the second conductive film, and a titanium film may be used instead of the titanium nitride film of the third conductive film.

In the case where patterning into shapes of the gate electrode layer 102 and the gate electrode layer 103 is necessary, patterning may be carried out by dry etching or wet etching after forming a mask. The electrode layers can be etched to a tapered shape by an ICP (Inductively Coupled Plasma) etching method appropriately controlling the etching condition (the amount of electric power applied to a coiled electrode, the amount of electric power applied to an electrode of a substrate side, the temperature of the electrode of the substrate side, or the like). Note that a gas including chlorine typified by $Cl_2$, $BCl_3$, $SiCl_4$, and $CCl_4$; a gas including fluorine typified by $CF_4$, $SF_6$, and $NF_3$; or $O_2$ can be appropriately used for the etching gas.

The mask for patterning can be formed by selectively discharging the composition. The patterning processes can be simplified by thus forming a mask selectively. A resin material such as an epoxy resin, a phenol resin, a novolac resin, an acrylic resin, a melamine resin, or a urethane resin is used for the mask. In addition, the mask may be formed by a droplet discharging method using an organic material such as benzocyclobutene, parylene, flare, or transmitting polyimide; a compound material made by the polymerization of a siloxane-based polymer or the like; a composition material containing a water-soluble homopolymer and a water-soluble copolymer; or the like. Alternatively, a commercial resist material containing a photosensitizer may be used. For example, a typical positive type resist such as a novolac resin and a naphthoquinone diazide compound that is a photosensitizer, or a negative type resist such as a base resin and diphenylsilanediol and an acid generator may be used. In using any material, the surface tension and the viscosity are appropriately controlled by adjusting the concentration of a solvent or adding a surfactant or the like.

In this embodiment mode, when the mask for performing the patterning is formed by a droplet discharging method, treatment for forming a pattern forming region and the periphery thereof to have different wettability may be performed for pretreatment. In the present invention, when a pattern is formed by discharging a droplet by a droplet discharging method, the pattern shape can be controlled by forming a low-wettability region and a high-wettability region in a pattern forming region. Performing the treatment on the pattern formation region causes difference in wettability therein, so that a droplet remains only on the high-wettability region. Accordingly, the pattern can be formed with good controllability. This process is applicable to pretreatment for forming any pattern in the case of using a liquid material.

In this embodiment mode, the gate electrode layer 102 and the gate electrode layer 103 are formed by using a droplet discharging portion. This droplet discharging portion generically represents means for discharging a droplet such as a nozzle comprising a discharge port for a composition and a head comprising one or plural nozzles. The diameter of a nozzle provide to the droplet discharging portion is set to be 0.02 to 100 µm (preferably, 30 µm or less). The amount of the droplet discharged through the nozzle is set to be 0.001 to 100 pl (preferably, 0.1 pl or more and 40 pl or less, more preferably, 10 pl or less). The discharged amount is increased in proportion to the size of the nozzle. The discharge port of the nozzle is preferably as close to a predetermined portion as possible. Preferably, the distance between the discharge port and the predetermined portion is set to be about 0.1 to 3 mm (more preferably, 1 mm or less).

As the composition discharged through the discharge port, a conductive material dissolved or dispersed in a solvent is used. As the conductive material, metal such as Ag, Au, Cu, Ni, Pt, Pd, Ir, Rh, W and Al, metallic sulfide such as Cd and Zn, oxide such as Fe, Ti, Si, Ge, Zr and Ba, a fine particle or a dispersant nanometer-size particle of silver halide or the like can be used. The conductive material may be mixtures thereof. In addition, since a transparent conductive film has light-transmitting property, the film transmits light when light-exposing from the backside is performed. However, the transparent conductive film can be used if a laminated body is formed of the transparent conductive film and a material which does not transmit light. As a transparent conductive film, Indium tin oxide (ITO), ITSO including indium tin oxide and silicon oxide, organic indium, organic tin, zinc oxide, titanium nitride and the like can be used. Further, in consideration of a specific resistance value, a solution in which any one of gold, silver and copper is dissolved or dispersed is preferably used as the composition to be discharged through the discharge port. More preferably, low-resistance silver or copper is used. When using silver or copper, a barrier film is additionally formed to prevent an impurity. As the barrier film, a silicon nitride film or nickel boron (NiB) can be used.

Also, a particle having plural layers in which a conductive material is coated with another conductive material may be used. For example, a three-layered particle in which copper is coated with nickel boron (NiB) and the nickel boron is coated with silver, or the like may be used. As for the solvent, ester type such as butyl acetate and ethyl acetate; alcohol type such as isopropyl alcohol and ethanol; an organic solvent such as methyl ethyl ketone and acetone; and water and the like is used. The viscosity of the composition is preferably set to be 20 cp or less in order to prevent dryness of the composition and discharge the composition fluently through the discharge port. The surface tension of the composition is preferably set to be 40 mN/m or less. The viscosity and the like of the composition may be adjusted properly according to a solvent to be used and an intended purpose. For example, the viscosity of a composition in which ITO, organic indium and organic tin are dissolved or dispersed in a solvent is preferably set to be 5 to 20 mPa·s; the viscosity of a composition in which silver is dissolved or dispersed in a solvent may be set to be 5 to 20 mPa·s; and the viscosity of a composition in which gold is dissolved or dispersed in a solvent may be set to be 5 to 20 mPa·s.

The conductive layers may be formed by laminating a plurality of conductive materials. Alternatively, the conductive layers may be formed using silver as a conductive material by the droplet discharging method and then the conductive layers may be plated with copper and the like. The plating may be performed by an electroplating or chemical (electroless) plating method. A surface of the substrate may be soaked in a container filled with a solution including a material for plating. Alternatively, the substrate may be fixed obliquely (or perpendicularly) and a solution including a material for plating may be flowed on the surface of the substrate such that the surface thereof is coated with the solution. This case has an advantage of miniaturizing a processing device.

Although the diameter of a conductive particle depends on the diameter of each nozzle and a shape of a desired pattern, the diameter of the conductive particle is preferably as small as possible for the purpose of preventing a clogged nozzle and manufacturing a microscopic pattern. Preferably, the diameter of the particle is set to be 0.1 µm or less. The composition is formed by a known method such as an electrolyzing method, an atomizing method and a wet reducing method, and the particle size thereof is typically about 0.01 to 10 µm. However, in the case of using an evaporation method in a gas, each nanometer-size particle protected with a dispersing agent is microscopic and is about 7 nm in size. Further, when each surface of the nanometer-size particles is covered with a coating material, the nanometer particles among the solvent are not aggregated but are uniformly dispersed in the solvent at a room temperature, and show a property similar to that of liquid. Therefore, the coating material is preferably used.

In the present invention, it is necessary that the composition has fluidity even after it touches the object to be processed since it is processed to have a desired pattern shape by using the difference in wettability between the fluid composition and a pattern forming region and the periphery thereof. However, the process of discharging a composition may be performed under low pressure if fluidity is not lost. In addition, when the process is performed under low pressure, an oxide film or the like is not formed over the surface of the conductor which is preferable. After discharging the composition, either or both processes of drying and baking is/are performed. Each process of drying and baking is carried out by heat treatment. For example, drying is performed for 3 minutes at 100° C. and baking is performed for 15 minutes to 60 minutes at a temperature of from 200° C. to 350° C., each of which has different purpose, temperature, and period. The processes of drying and baking are performed at normal pressure or under low pressure by laser light irradiation, rapid thermal annealing, a heating furnace, or the like. Note that the timing of the heat treatment is not particularly limited. The substrate may be heated to favorably perform the processes of drying and baking. The temperature of the substrate at the time depends on the material of the substrate or the like, but it is typically 100° C. to 800° C. (preferably, from 200° C. to 350° C.). With the processes, nanoparticles are made in contact with each other and fusion and welding are accelerated by hardening and shrinking a peripheral resin as well as evaporating the solvent in the composition or chemically removing the dispersant.

A continuous wave or pulsed gas laser or solid-state laser may be used for laser light irradiation. An excimer laser, a YAG laser, and the like can be used as the former gas laser. A laser using a crystal of YAG, $YVO_4$, $GdVO_4$, or the like which is doped with Cr, Nd, or the like can be used as the latter solid-state laser. Note that it is preferable to use a continuous wave laser in relation to the absorptance of laser light. Moreover, an irradiation method which combines pulse and continuous wave may be used. However, it is preferable that the heat treatment by laser light irradiation is instantaneously performed within several microseconds to several tens of seconds so as not to damage the substrate 100, depending on heat resistance of the substrate 100. Rapid thermal annealing (RTA) is carried out by raising the temperature rapidly and heating instantaneously for several microseconds to several minutes using an infrared lamp, a halogen lamp, or the like emitting light of from ultraviolet to infrared in an inert gas atmosphere. Since the treatment is performed instantaneously, only a thin film on a top surface can be substantially heated and a lower layer film is not affected. Accordingly, even a substrate having low heat resistance such as a plastic substrate is not affected.

After forming the gate electrode layers 102 and 103 by discharging a composition by a droplet discharging method, the surface thereof may be planarized by pressing it with pressure to enhance its planarity. As a pressing method, unevenness may be smoothed by making a roller-shaped object move over the surface, or the surface may be vertically pressed with a flat plate-shaped object. A heat process may be performed at the time of pressing. Alternatively, unevenness on the surface may be eliminated with an air knife by softening or melting the surface with a solvent or the like. A CMP method may be also used for polishing the surface. This process may be applied for planarizing a surface when unevenness is caused by a droplet discharging method.

Subsequently, a gate insulating layer 101 is formed over the gate electrode layer 102 and the gate electrode layer 103. The gate insulating layer 101 is required to transmit light so that a substance formed thereover is modified by light irradiation. The gate insulating layer 101 may be formed of a known material such as an oxide or nitride of silicon, and may be a laminated layer or a single layer. In this embodiment mode, a laminated layer of three layers of a silicon nitride film, a silicon oxide film, and a silicon nitride film is used. Alternatively, a single layer of them or of a silicon oxynitride film, or a laminated layer of two layers may be used. A silicon nitride film having fine film quality may be preferably used. In the case of using silver, copper, or the like for the conductive layer formed by a droplet discharging method, forming a silicon nitride film or a NiB film thereover as a barrier film is effective in preventing impurities from diffusing and in planarizing the surface. Note that a rare gas element such as argon is preferably included in a reactive gas and is preferably mixed into the insulating film to be formed in order to form a fine insulating film with little gate leak current at a low film-formation temperature.

Next, a semiconductor layer is formed. A semiconductor layer having one conductivity type may be formed, if necessary. Alternatively, an NMOS structure of an N-channel TFT in which an N-type semiconductor layer is formed, a PMOS structure of a P-channel TFT in which a P-type semiconductor layer is formed, and a CMOS structure of the N-channel TFT and the P-channel TFT can be manufactured. In order to impart conductivity, an element imparting conductivity is added to a semiconductor layer by doping and an impurity region is formed in the semiconductor layer so that an N-channel TFT and a P-channel TFT can be formed. Conductivity may be imparted to the semiconductor layers by performing plasma processing using $PH_3$ gas, rather than forming the N-type semiconductor layer.

As a material of the semiconductor layers, an amorphous semiconductor (hereinafter, also referred to as "AS") manufactured by a vapor growth method using a semiconductor material gas typified by silane or germanium or a sputtering method; a polycrystalline semiconductor that is formed by crystallizing the amorphous semiconductor by using light energy or heat energy; a semiamorphous semiconductor (also referred to as a microcrystalline or a microcrystal, hereinafter, also referred to as "SAS") or the like can be used. The semiconductor layers may be formed by using a known method (such as a sputtering method, an LPCVD method and a plasma CVD method).

The SAS has an intermediate structure between an amorphous structure and a crystalline structure (including a single crystal and a polycrystal), and a third condition that is stable in term of free energy. The SAS further includes a crystalline region having a short range order along with lattice distortion. A crystal region with a size of 0.5 to 20 m can be observed in at least a part of a semiamorphous semiconductor film. In the case of containing silicon as its principal constituent, Raman spectrum is shifted toward to the side of lower wavenumbers than 520 $cm^{-1}$. The diffraction peaks of (111) and (220), which are believed to be derived from silicon crystal lattice, are observed by X-ray diffraction. The SAS contains hydrogen or halogen of at least 1 atom % or more to terminate dangling bonds. The SAS is formed by glow discharge decomposition (plasma CVD) with silicide gas (plasma CVD). As for the silicide gas, $SiH_4$, $Si_2H_6$, $SiH_2Cl_2$, $SiHCl_3$, SiCl, $SiF_4$ and the like can be used. In addition, $F_2$ or $GeF_4$ may be mixed in the silicide gas. The silicide gas may also be diluted with $H_2$, or a mixture of $H_2$ and one or more of rare gas elements selected from He, Ar, Kr and Ne. The dilution ratio is set to be in the range of 1:2 to 1:1,000. The pressure is set to be approximately in the range of 0.1 to 133 Pa. The frequency of the power supply is set to be 1 to 120 MHz, preferably, 13 to 60 MHz. Preferably, the substrate heating temperature may be set to be 300° C. or less, and the formation is possible even at the substrate heating temperature from 100 to 200° C. As impurity elements mainly contained in the film, each concentration of impurities of atmospheric constituents such as oxygen, nitrogen and carbon is preferably set to be $1 \times 10^{20}$ $cm^{-3}$ or less. In particular, the oxygen concentration is set to be $5 \times 10^{19}$ $cm^{-3}$ or less, preferably, $1 \times 10^{19}$ $cm^{-3}$ or less. In addition, when the lattice distortion is further promoted by adding a rare gas element such as helium, argon, krypton or neon, a favorable SAS having an increased stability can be obtained. In addition, an SAS layer formed by using gas including fluorine may be laminated with an SAS layer formed by gas including hydrogen.

A hydrogenated amorphous silicon can be typically cited as the amorphous semiconductor, while a polysilicon or the like can be typically cited as a crystalline semiconductor layer. The polysilicon (poly-crystalline silicon) includes a so-called high-temperature polysilicon mainly using a polysilicon that is formed at a process temperature of 800° C. or more; a so-called low-temperature polysilicon mainly containing a polysilicon that is formed at a process temperature of 600° C. or less; a polysilicon that is crystallized by being added with an element that promotes crystallization; and the like. As above mentioned, a semiamorphous semiconductor or a semiconductor containing a crystal phase in a part of a semiconductor layer may be used.

When a crystalline semiconductor layer is used as a semiconductor layer, the crystalline semiconductor layer may be formed by a known method (e.g., a laser crystallization method, a thermal crystallization method, a thermal crystallization method using an element that promotes crystallization such as nickel, and the like). Also, a microcrystalline semiconductor, which is an SAS, can be crystallized by irradiating laser light to increase its crystallinity. When the element that promotes the crystallization is not introduced, prior to irradiating laser light to an amorphous silicon film, the amorphous silicon film is heated at 500° C. for one hour under a nitrogen atmosphere to release hydrogen contained in the amorphous silicon film such that the concentration of hydrogen becomes $1\times10^{20}$ atoms/cm$^3$ or less. This is because the amorphous silicon film containing a large amount of hydrogen is destroyed by irradiating laser light.

A technique for introducing a metal element into an amorphous semiconductor layer is not particularly limited as long as it is a technique capable of providing the metal element on a surface or inside of the amorphous semiconductor layer. For example, a sputtering method, a CVD method, a plasma processing method (including a plasma CVD method), an absorption method, or a method for coating a solution of metal salt, can be used. In the above mentioned processes, the method using a solution is convenient and has an advantage of easily adjusting the concentration of a metal element. In addition, in order to improve the wettability of the surface of the amorphous semiconductor layer to spread an aqueous solution to an entire surface of the amorphous semiconductor layer, an oxide film is preferably formed by irradiation of UV light under an oxygen, atmosphere, a thermal oxidation method, treatment using ozone water containing hydroxy radical or hydrogen peroxide, or the like.

The amorphous semiconductor layer may be crystallized by using a combination of a heat treatment and a laser light irradiation treatment. The heat treatment or the laser light irradiation treatment may be carried out several times, separately.

Also, a crystalline semiconductor layer may be formed over a substrate directly by a plasma method. Alternatively, the crystalline semiconductor layer may be selectively formed over a substrate by using a plasma method.

A semiconductor may be formed using an organic semiconductor material by a printing method, a spraying method, a spin coating method, a droplet discharging method or the like. In this case, since the above mentioned etching process is not required, the number of processes can be reduced. As the organic semiconductor, a low molecular weight material, a high molecular weight material, an organic pigment, a conductive high molecular weight material and the like can be used. Preferably, a π-electron conjugated system high molecular weight material with skeleton including conjugated double bonds is used as an organic semiconductor material used in the present invention. Typically, a soluble high molecular weight material such as polythiophene, polyfluorene, poly (3-alkyl thiophene), a polythiophene derivative or pentacene can be used.

As another organic semiconductor material that can be used in the present invention, there is a material that can form a first semiconductor region by forming soluble precursor and processing the soluble precursor. For example, polythienylene vinylene, poly (2,5-thienylene vinylene), polyacetylene, a polyacetylene derivative, polyarylene vinylene or the like can be cited as such an organic semiconductor material.

When converting the precursor into an organic semiconductor, a reactive catalyst such as hydrochloric gas is added to the precursor, in addition to the heat treatment. As a typical solvent for dissolving such a soluble organic semiconductor material, toluene, xylene, chlorobenzene, dichlorobenzene, anisole, chloroform, dichloromethane, γ butyl lactone, butyl cellsolve, cyclohexane, NMP (N-methyl-2-pyrrolidone), cyclohexanone, 2-butanone, dioxane, dimethylformamide (DMF), THF (tetrahydrofuran), or the like can be applied.

In this embodiment mode, the semiconductor layer 104 and the semiconductor layer 105 are formed on the gate electrode layer 101 by a droplet discharging method using pentacene.

Another mask made from an insulating material such as resist and polyimide is formed by a droplet discharging method. By using this mask, an opening portion 125 is formed in a part of the gate insulating layer 101 by etching to expose a part of the gate electrode layer 103 underlying the gate insulating layer (see FIG. 2). Either plasma etching (dry etching) or wet etching may be employed for the etching. In the case where a large-size substrate is processed by etching, the plasma etching is appropriate. As an etching gas, a gas including fluorine such as $CF_4$, $NF_3$, or chlorine such as $Cl_2$ and $BCl_3$ and an inert gas such as He and Ar may further be added thereto, appropriately. When the etching is performed by an atmospheric pressure discharge, electric discharge process can be performed locally, and therefore, a mask layer is not necessary to be formed over an entire surface of a substrate.

As a pretreatment for forming a source electrode layer or a drain electrode layer with good controllability, the periphery of a pattern forming region is compared with a region therearound and modified. In this embodiment mode, the photoactive substance in which the wettability with respect to the composition containing the conductive material increases by light irradiation is formed. Therefore, it can be said that the photoactive substance before light irradiation is a photoactive substance having low-wettability. Then, by the light irradiation process, the photoactive substance in the irradiation region is selectively modified to increase the wettability, thereby forming a high-wettability region. Since the photoactive substance in the region not irradiated with light remains to have low-wettability, such a region becomes a low-wettable region with respect to the high-wettable region. Thus, the high-wettable region and the low-wettable region are formed. The difference in wettability can be confirmed by the contact angle, and the difference in the contact angle is 30° or more, preferably, 40° or more.

A display device in this embodiment mode is an active matrix type, in which the gate wiring layer formed in the same process as the gate electrode layer partially intersects with the source wiring layer and the power source line formed in the same process as the source electrode layer or the drain electrode layer through the gate insulating layer. In this embodiment mode, since the source electrode layer and the drain electrode layer are formed selectively in a self-aligning manner, the wettability of the subject region is controlled. Since light irradiation for controlling the wettability is conducted from the substrate back side by using the gate electrode layer as a mask, the gate electrode layer and the low-wettable photoactive substance formed over the gate wiring layer formed in the same process as the gate electrode layer are not irradiated with light and not modified, thereby becoming the low-wettable region as compared with the irradiation region. Accordingly, the conductive layer cannot be formed stably over the low-wettability region.

In this embodiment mode, the mask layer is formed so that the low-wettability photoactive substance is not formed in a region where such gate electrode layer and source electrode layer intersects (hereinafter, the conductive layers such as the gate electrode layer and the gate wiring layer formed in the same process as the gate electrode layer are also referred as "gate electrode layers" and the source electrode layer, the drain electrode layer, the source wiring layer formed in the same process as the source electrode layer and the drain electrode layer, and the power source line are also referred to as "source electrode layers or drain electrode layers").

After that, a mask layer 106a, a mask layer 106b, and a mask layer 106c are formed over the gate insulating layer 101 in a region where the gate electrode layer and the source electrode layer are superposed. The mask layer 106c is formed so as to cover the opening portion 125 formed in the gate insulating layer.

The mask layer 106a, the mask layer 106b, and the mask layer 106c may be formed with either an inorganic material or an organic material, and only needs to function as a mask so as not to attach the low-wettable substance physically to the gate insulating layer; therefore, either an insulating material or a conductive material may be used. Since the mask layer 106a, the mask layer 106b, and the mask layer 106c are removed in a later process, the mask layers are preferably substance that can be removed by a treatment such as etching at the removal without damaging the subject region.

Silicon oxide, silicon nitride, silicon oxynitride, aluminum oxide, aluminum nitride, aluminum oxynitride, or another inorganic insulating material; acrylic acid, methacrylic acid and a derivative thereof; a heat-resistant polymer such as polyimide, aromatic polyamide or polybenzimidazole; or a siloxane resin material may be used as the insulating materials. In addition, a resin material such as a vinyl resin such as polyvinyl alcohol, polyvinyl butyral and the like, an epoxy resin, a phenol resin, a novolac resin, an acrylic resin, a melamine resin, and a urethane resin are used. In addition, an organic material such as benzocyclobutene, parylene, flare, or polyimide; a compound material made by the polymerization of such as a siloxane-based polymer; a composite material containing a water-soluble homopolymer and a water-soluble copolymer; or the like may be used. Alternatively, a commercial resist material containing a photosensitizer may be used. For example, a typical positive type resist such as a novolac resin and a naphthoquinone diazide compound that is a photosensitizer, or a negative type resist such as a base resin and diphenylsilanediol and an acid generator may be used. As the conductive, material, metal such as Ag, Au, Cu, Ni, Pt, Pd, Ir, Rh, W and Al, metallic sulfide such as Cd and Zn, oxide such as Fe, Ti, Si, Ge, Zr and Ba, or the mixture of the conductive material may also be used.

The mask layer 106a, the mask layer 106b, and the mask layer 106c can be formed by using a CVD method, a plasma CVD method, a sputtering method, a printing method, a spraying method, a spin coating method, a droplet discharging method or the like. In this embodiment mode, the mask layers 106a, 106b, and 106c are formed by a droplet discharging method using polyvinyl alcohol (hereinafter, also referred to as PVA).

Figure 3A:
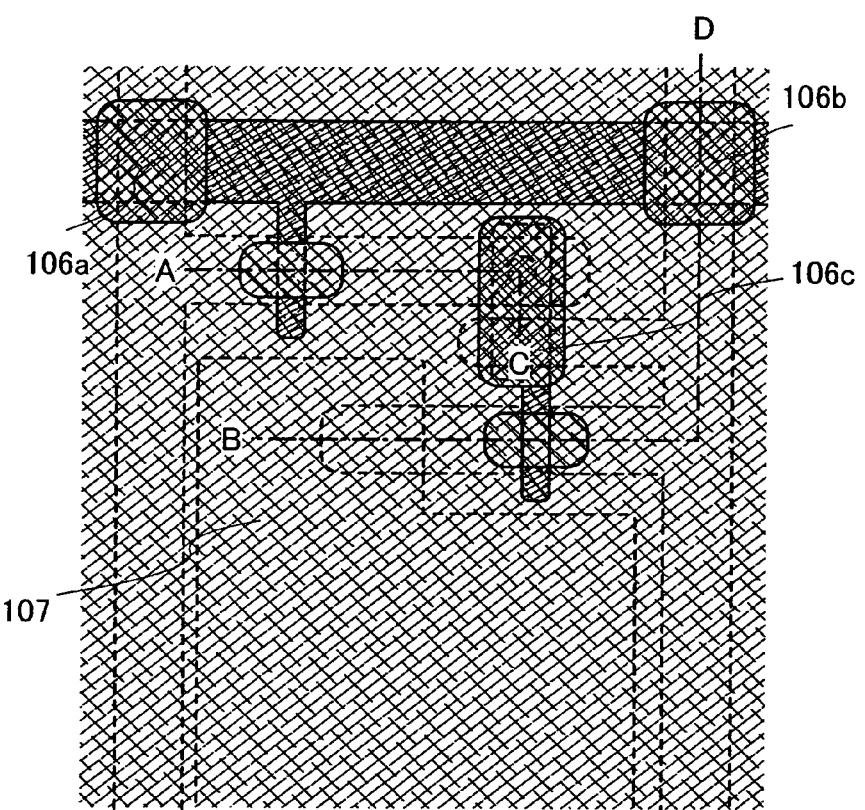
FIGS. 3(A) to 3(C) illustrate a method for manufacturing a display device according to the present invention.
Figure 3B:
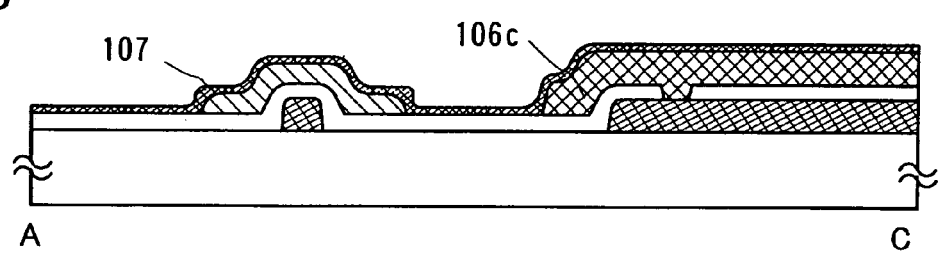
Figure 3C:
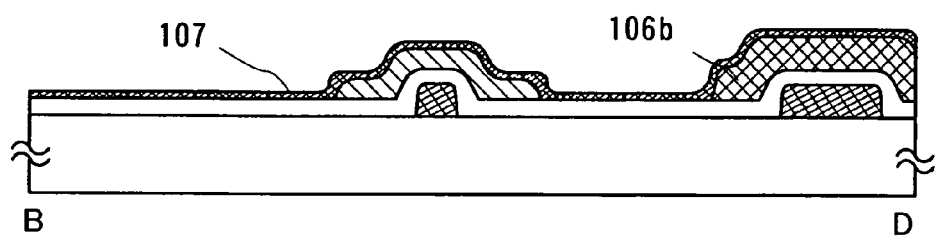

A photoactive substance 107 is formed on the gate insulating layer 101, the semiconductor layers 104 and 105, and the mask layers 106a, 106b, and 106c (see FIGS. 3(A) to 3(C)).

The photoactive substance can be formed with an organic material, and inorganic material, or even a mixture of these as long as such materials are substances whose wettability on the surface changes by light irradiation. For example, triphenylmethane, azobenzene, spiropyran, and a triphenylmethane derivative, an azobenzene derivative, and a spiropyran derivative that are derivatives of the above mentioned materials, or the like can be used. This embodiment mode uses polystyrene that has triphenylmethaneleucohydroxydo in a part of side chain, wherein the wettability thereof is changed to a high state from a low state by irradiating the polystylene with light having a wavelength of 300 nm to 400 nm. Further, the photoactive substance may be a thin film with a thickness of about several nanometer and may not have continuity as a film depending on its forming method. The light having a wavelength from 300 nm to 400 nm can pass through a glass substrate used as the substrate 100 in this embodiment mode and does not pass through the gate electrode layer 102 and the gate electrode layer 103. Therefore, the photoactive substance can be selectively irradiated with light. The photoactive substance may be selected appropriately in accordance with light transmittance of the substrate, the semiconductor layer, the gate insulating layer, and the gate electrode to a wavelength of reacting light, or the wettability to the material of the source electrode layer or the drain electrode layer, which is the subject substance region.

Next, the photoactive substance 107 is irradiated with light 109a and light 109b by a light source 108a and a light source 108b from the light-transmitting substance 100 side through the substrate 100. The light 109a and the light 109b change the wettability of the photoactive substance 107 by its energy, so that the wettability increases. Since the gate electrode layer 102 and the gate electrode layer 103 become masks, the surface of the photoactive substance in the region superposing with the gate electrode layer 102 and the gate electrode layer 103 is not modified. Since the mask layers used in this embodiment mode transmit the light 109a and the light 109b, even the photoactive substance on the mask layers 106a, the mask layer 106b, and the mask layer 106c are irradiated with light, and the surface thereof is modified. However, the mask layer 106a, the mask layer 106b, and the mask layer 106c do not need to have a light-transmitting property. In such a case, the light is blocked by the mask layers and the photoactive substance over the mask layers is not modified.

Figure 4A:
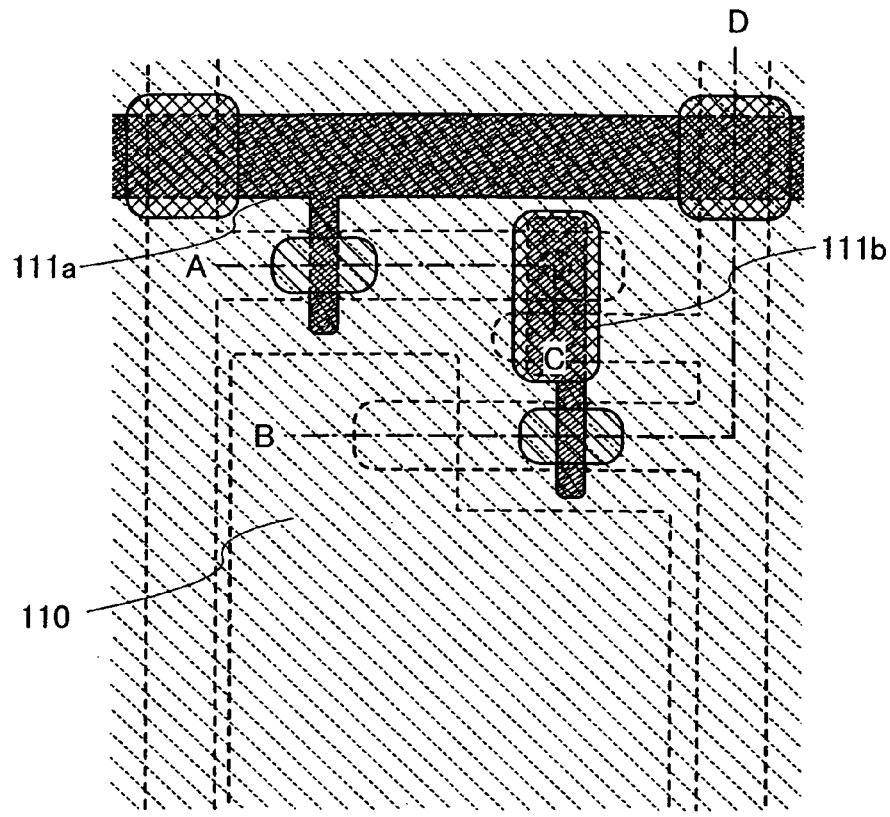
FIGS. 4(A) to 4(C) illustrate a method for manufacturing a display device according to the present invention.
Figure 4B:
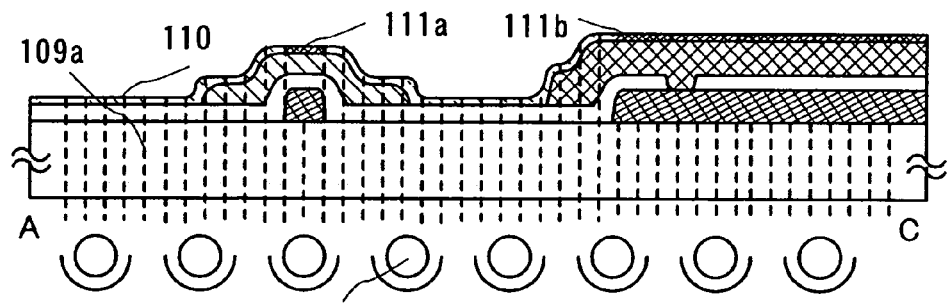
Figure 4C:
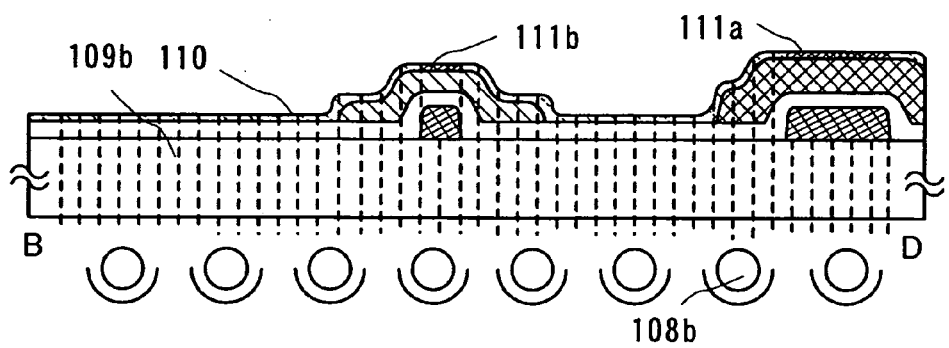
Figure 5A:
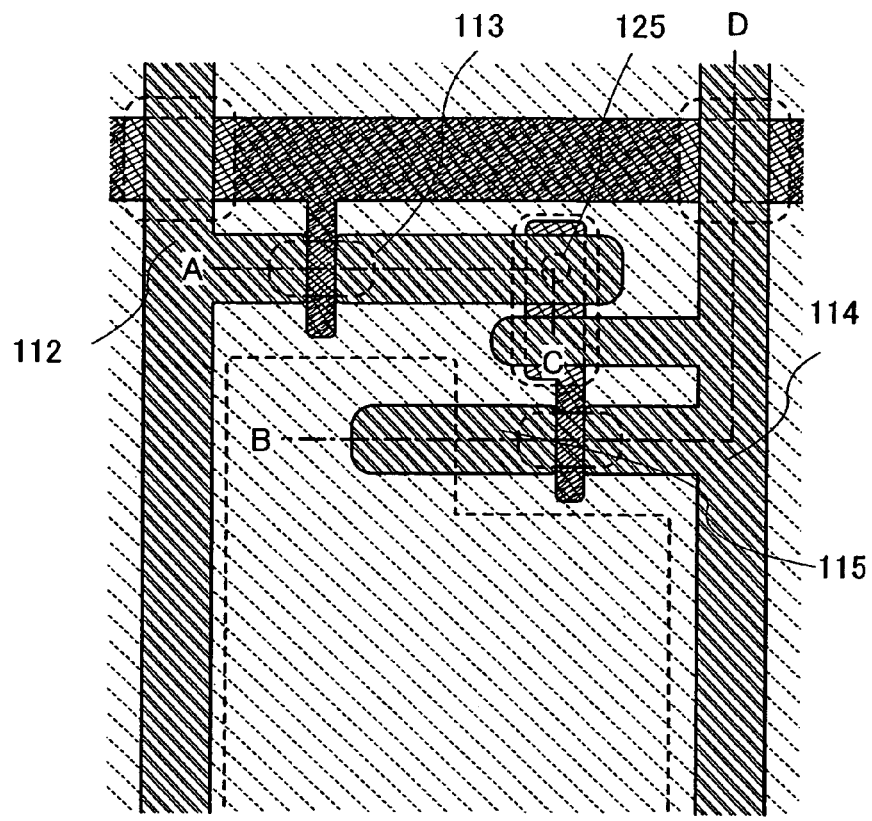
FIGS. 5(A) to 5(C) illustrate a method for manufacturing a display device according to the present invention.
Figure 5B:
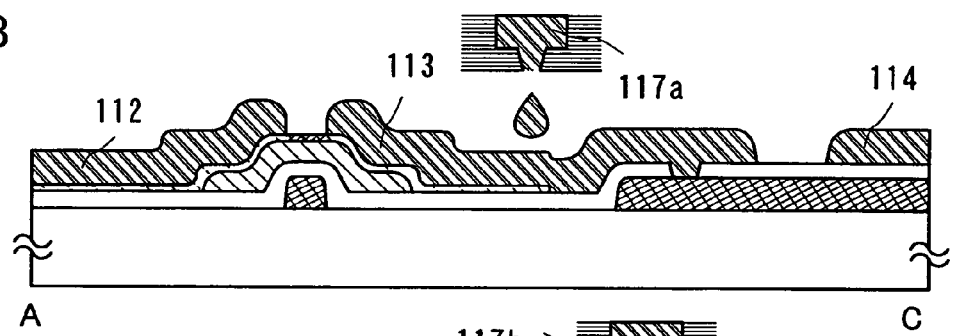
Figure 5C:
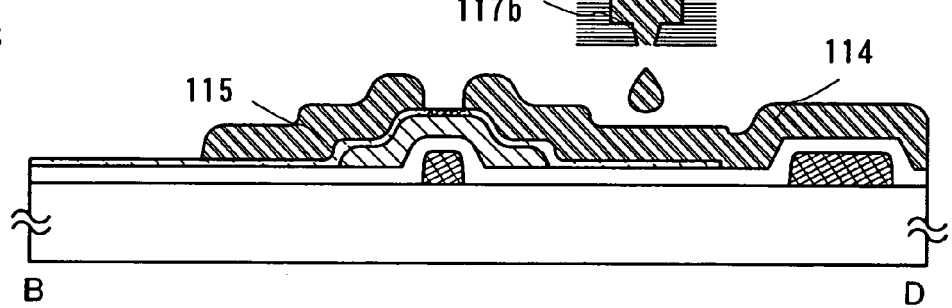

A high-wettability region 110, which is relatively more wettable, and a low-wettability region 111a and a low-wettability region 111b that are relatively less wettable are formed on the surface of the photoactive substance 107 by light irradiation of the light 109a and 109b (see FIGS. 4(A) to 4(C)). In the present invention, since light irradiation (so-called back side light-exposure) for surface modification treatment with good controllability can be carried out, the apparatuses and processes are simplified; thus, costs and time are reduced, and the production efficiency can be improved.

The mask layer 106a, the mask layer 106b, and the mask layer 106c and the photoactive substance which is formed on the mask layers are removed after controlling the wettability by light irradiation. In this embodiment mode, the mask layers 106a, 106b, and 106c are removed by washing with water. Since the photoactive substance in which the wettability has been controlled to be low is not formed in the regions where the mask layer 106a, the mask layer 106b, and the mask layer 106c were provided, the wettability is higher than the low-wettability region where the photoactive substance is formed, similarly to the region where the wettability is increased to be high by light irradiation.

A composition containing a conductive material is discharged from the droplet discharging device 117a and the droplet discharging device 117b to high-wettability region 110. Thus, a source electrode layer or drain electrode layer 112, a source electrode layer or drain electrode layer 113, a source electrode layer or drain electrode layer 114, and a source electrode layer or drain electrode layer 115 are formed (see FIGS. 5(A) to 5(C)). Even when the pattern forming material can not be discharged precisely depending on the size of the discharge port of the nozzle from which the droplet is discharged or the moving ability of the discharge port, the droplet is attached only to the region to form a desired pattern by performing treatment for enhancing wettability on the pattern formation region. This is because the pattern formation region and the periphery thereof have different wettability; therefore, the droplet is repelled in the low-wettability region and remains on the pattern formation region laving higher wettability. In other words, a droplet is repelled by the low-wettability region; therefore, there is a partition wall (a bank) at a boundary between the high-wettability region and the low-wettability region. Accordingly, even the composition containing a conductive material having fluidity can remain on the high-wettability region; thus, each source electrode layer or drain electrode layer can be formed to have a desired shape.

The composition containing the conductive material can be formed stably without being repelled since the region where the low-wettability substance is not formed by the mask layers 106a, 106b, and 106c is high-wettability region.

The source electrode layer or drain electrode layer 112 also serves as a source wiring layer, and the source electrode layer or drain electrode layer 114 also serves as a power supply line.

The source electrode layer or drain electrode layer 112, the source electrode layer or drain electrode layer 113, the source electrode layer or drain electrode layer 114 and the source electrode layer or drain electrode layer 115 can be formed in a similar manner as the above described gate electrode layer 102 and the gate electrode layer 103.

As a conductive material for forming the source electrode or drain electrode layer 112, the source electrode or drain electrode layer 113, the source electrode or drain electrode layer 114, and the source electrode or drain electrode layer 115, a compound which mainly contains metal particles of Ag (silver), Au (gold), Cu (copper), W (tungsten), Al (aluminum), or the like can be used. Alternatively, indium tin oxide (ITO), ITSO including indium tin oxide and silicon oxide, organic indium, organic tin, zinc oxide, titanium nitride, or the like having light-transmitting properties may be combined.

The source electrode layer or drain electrode layer 113 and the gate electrode layer 103 are electrically connected to each other through the opening portion 125 formed in the gate insulating layer 101. A part of the source electrode or drain electrode layer forms a capacitor element. A part of the source electrode or drain electrode layer 114 is provided with good stability with the gate insulating layer interposed therebetween, and the capacitor element can be formed since a part of the gate electrode layer 103 is selectively covered with the mask layer 106c.

According to the present invention, in the case of forming a fine pattern, for example an electrode layer, a conductive layer can be formed on only the pattern formation region without a droplet extending over the region even though a droplet discharge port is somewhat large. Therefore, defects such as short that is caused when the droplet is accidentally formed in the region other than the pattern formation region can be prevented. Further, the thickness of the wiring can also be controlled. When the surface modification is carried out by light irradiation from the substrate side as in this embodiment mode, a large area can be treated in addition to that the pattern can be formed with good controllability; thus, the production efficiency is improved. By combining a droplet discharging method, the material loss can be avoided compared with entire surface application formation by a spin coating method or the like; therefore, the cost can be reduced. According to the present invention, a pattern can be formed with good controllability even in the case where a wiring or the like is provided integrally and intricately due to miniaturization and thinner film formation.

As a pretreatment, an organic material which functions as an adhesive agent may be formed to enhance adhesion to a conductive layer and an insulating layer formed by a droplet discharging method. In this case, regions having different wettabilities may be formed on the organic material. An organic material (an organic resin material) (polyimide, acrylic) and a siloxane resin may also be used. The siloxane resin corresponds to a resin including Si—O—Si bonding. Siloxane is a material in which a skeleton is formed by the bond of silicon (Si) and oxygen (O). An organic group containing at least hydrogen (for example, an alkyl group and an aromatic hydrocarbon) is used as a substituent. A fluoro group may also be used as the substituent. Alternatively, an organic group containing at least hydrogen and a fluoro group may also be used as the substituent.

After the source electrode or drain electrode layer 112, the source electrode or drain electrode layer 113, the source electrode or drain electrode layer 114, and the source electrode or drain electrode layer 115 are formed with good controllability, in this time, the photoactive substance remaining in a low-wettability region 111a and a low-wettability region 111b are changed and modified by irradiation with light from the element side rather than the back side of the substrate. The low-wettability region 111a and the low-wettability region 111b are modified to be high-wettability regions by light irradiation. The photoactive substance may remain, or an unnecessary portion may be removed after forming the electrode layer. The electrode layer can be used as a mask for the removal. The photoactive substance may be removed by ashing, wet etching, dry etching, plasma processing or the like which using oxygen and the like.

A treatment for enhancing wettability is carried out to make the force for holding a droplet discharged over a region (also referred to as adhesion force or fixing force) stronger than that of a peripheral region, which is equivalent to a treatment for enhancing the adhesion with the droplet by modifying the region by light irradiation. Only a surface of a film which is in contact with and holds a droplet may have the wettability, and the whole film does not necessarily have the same property.

Subsequently, a first electrode layer 119 is formed by selectively discharging a composition containing a conductive material over the gate insulating layer 101 (see FIGS. 6(A) to 6(C)). When the first electrode layer 119 is formed, of course, a pretreatment for forming a low-wettability region and a high-wettability region may be performed. The first electrode layer 119 can be formed with better controllability and more selectively by discharging a composition containing a conductive material over the high-wettability region. When light is emitted from the light-transmitting substrate 100 side, or when a transmitting display panel is manufactured, the first electrode layer 119 may be formed by forming a predetermined pattern using a composition including indium tin oxide (ITO), indium tin oxide containing silicon oxide (ITSO), indium zinc oxide (IZO) containing zinc oxide (ZnO), zinc oxide (ZnO), a material in which gallium (Ga) is doped in ZnO, tin oxide ($SnO_2$) or the like, and by baking the pattern.

Preferably, the first electrode layer 119 is formed of indium tin oxide (ITO), indium tin oxide containing silicon oxide (ITO), zinc oxide (ZnO), or the like by the sputtering method. It is more preferable to use indium tin oxide containing silicon oxide formed by the sputtering method using a target of ITO containing silicon oxide of 2 to 10% by weight. In addition, a conductive material in which ZnO is doped with gallium (Ga), or an indium zinc oxide (IZO) which is an oxide conductive material containing silicon oxide and in which indium oxide is mixed with zinc oxide (ZnO) of 2 to 20% by weight may be used. After the first electrode layer 119 is formed by the sputtering method, a mask layer may be formed by a droplet discharging method, and a desired pattern may be formed by etching. In this embodiment mode, the first electrode layer 119 is formed of a conductive material having a light-transmitting property by a droplet discharging method. Specifically, it is formed using indium tin oxide or ITSO formed using ITO and silicon oxide.

In this embodiment mode, the gate insulating film uses three-layered films of a silicon nitride film formed using silicon nitride, a silicon oxynitride film, and a silicon nitride film from a side of the gate electrode layer. As a preferable structure, the first electrode layer 119, which is formed using indium tin oxide containing silicon oxide, is formed to be closely in contact with the insulating layer comprising silicon nitride included in the gate insulating layer 101. Accordingly, an effect of increasing a rate at which light generated in an electroluminescent layer is emitted outside can be exerted. The gate insulating layer may be interposed between the gate electrode layer or the gate electrode layer the source or drain electrode layer and the first electrode layer and may function as a capacitor element.

The first electrode layer 119 can be selectively formed over the gate insulating layer 101 before forming the source electrode layer or drain electrode layer 115. In this case, this embodiment mode has a connection structure in which the source electrode layer or drain electrode layer 115 is laminated over the first electrode layer 119. When the first electrode layer 119 is formed before forming the source electrode layer or drain electrode layer 115, it can be formed over a flat region. Therefore, the first electrode layer 119 can be formed to have preferable planarity since preferable coverage can be obtained and a polishing treatment such as CMP can be carried out sufficiently.

A structure in which an insulating layer that will be an interlayer insulating layer is formed over the source electrode layer or drain electrode layer 115 to be electrically connected to the first electrode layer 119 through a wiring layer may be also used. In this case, instead of forming an opening portion (contact hole) by removing the insulating layer, a substance having low-wettability with respect to the insulating layer is formed over the source electrode layer or drain electrode layer 115. The insulating layer is formed on a region except for a region where the substance having low-wettability is formed when a composition containing an insulating layer is applied by a coating method or the like.

After forming the insulating layer by solidifying it by heating, drying, or the like, the substance having low-wettability is removed to form the opening portion. The wiring layer is formed so as to fill the opening portion, and the first electrode layer 119 is formed so as to be in contact with the wiring layer. With this method, etching is not necessarily performed to form the opening portion, and therefore, the process can be simplified.

When a reflective EL display panel is manufactured or in the case of a structure in which generated light is emitted to the side opposite to the light-transmitting substrate 100 side, a compound which mainly contains metal particles of Ag (silver), Au (gold), Cu (copper), W (tungsten), Al (aluminum), or the like can be used. Alternatively, the first electrode layer 119 may be formed by forming a transparent conductive film or a conductive film having light reflectivity by the sputtering method, forming a mask pattern by a droplet discharging method, and then combining etching.

The first conductive layer 119 may be polished by the CMP method or by cleaning with polyvinyl alcohol-based porous body so that the surface of the first conductive layer 119 is made flat. In addition, after polishing by the CMP method, ultraviolet irradiation or oxygen plasma treatment or the like may be performed on the surface of the first electrode layer 119.

According to the above mentioned processes, the TFT substrate for a display panel in which a TFT of a bottom gate type and a pixel electrode are connected over the light-transmitting substrate 100 is completed. The TFT in this embodiment mode is an inversely staggered type. The TFT shown in this embodiment mode can be manufactured in a self-aligned manner according to the present invention.

Subsequently, an insulating layer (also referred to as a partition wall or a bank) 121 is selectively formed. The insulating layer 121 is formed over the first insulating layer 119 to have an opening portion. In this embodiment mode, the insulating layer 121 is formed over the entire surface, and etched and patterned by using a mask of a resist or the like. When the insulating layer 121 is formed by a droplet discharging method or a printing method which can form the insulating layer 121 directly and selectively, patterning by etching is not necessarily required. The insulating layer 121 can also be formed to have a desired shape by the pretreatment of the present invention.

The insulating layer 121 can be formed of silicon oxide, silicon nitride, silicon oxynitride, aluminum oxide, aluminum nitride, aluminum oxynitride or another inorganic insulating material; acrylic acid, methacrylic acid, or a derivative thereof; a heat-resistant polymer such as polyimide, aromatic polyamide and polybenzimidazole; or an insulating material of a material having siloxane (inorganic siloxane and organic siloxane). The insulating layer 121 may also be formed by using a photosensitive material such as acrylic and polyimide, or a non-photosensitive material. The insulating layer 121 preferably has a shape in which a radius curvature changes continuously. Accordingly, the coverage of an electroluminescent layer 122 and a second electrode layer 123 which are formed over the insulating layer 121 is enhanced.

After forming the insulating layer 121 by discharging a compound by a droplet discharging method, the surface of the insulating layer may be pressed with pressure to planarize in order to enhance its planarity. As a pressing method, unevenness may be smoothed by making a roller-shaped object moved over the surface, or the surface may be vertically pressed with a flat plate-shaped object. Alternatively, unevenness on the surface may be eliminated with an air knife by softening or melting the surface with a solvent or the like. A CMP method may also be used for polishing the surface. This process can be applied for planarizing a surface when unevenness is caused by the droplet discharging method. When the planarity is enhanced through the process, display variations or the like of the display panel can be prevented, and therefore, a high-definition image can be displayed.

A light emitting element is formed over the substrate 100 that is the TFT substrate for a display panel (see FIGS. 1(A) and 1(B)).

Before forming the electroluminescent layer 122, moisture absorbed in the first electrode layer 119 and the insulating layer 121 or adhered to each surface is removed by performing a heat treatment at a temperature of 200° C. under atmospheric pressure. It is preferable to perform the heat treatment at temperatures of from 200° C. to 400° C., preferably from 250° C. to 350° C. under low pressure, and to form the electroluminescent layer 122 without being exposed to atmospheric air by a vacuum evaporation method or a droplet discharging method which is performed under low pressure.

As the electroluminescent layer 122, materials each produces the luminescence of red (R), green (G), and blue (B) are selectively formed by an evaporation method using an evaporation mask or the like, respectively. The materials (low molecular weight materials, high molecular weight materials, or the like) each produces luminescence of red (R), green (G) and blue (B) can be formed by a droplet discharging method in the same manner as a color filter. This case is preferable since separate forming of RGB can be carried out even without using a mask. Then, the second electrode layer 123 is formed over the electroluminescent layer 122 to complete a display device having a display function using a light emitting element.

Although it is not shown, it is effective to provide a passivation film so as to cover the second electrode layer 123. A protective film which is provided at the time of forming a display device may have a single layer structure or a multilayer structure. As the passivation film, a single layer of an insulating film containing silicon nitride (SiN), silicon oxide (SiO$_2$), silicon oxynitride (SiON), silicon nitride oxide (SiNO), aluminum nitride (AlN), aluminum oxynitride (AlON), aluminum nitride oxide (AlNO) which has more nitrogen content than oxygen content, aluminum oxide, diamond like carbon (DLC) or a nitrogen-containing carbon film (CN$_x$), or a laminated layer in which the insulating films are combined can be used. For example, a laminated layer such as a nitrogen-containing carbon film (CN$_x$) and silicon nitride (SiN) or an organic material can be used, or a laminate of a polymer such as a styrene polymer may be used. In addition, a material which includes siloxane may also be used.

At this time, it is preferable to use a film having good coverage as the passivation film. A carbon film, in particular, a DLC film are effectively used. The DLC film can be formed within the temperatures ranging from room temperature to 100° C. or lower; therefore, the DLC film can be easily formed over an electroluminescent layer having low heat resistance. The DLC film can be formed by a plasma CVD method (typically, an RF plasma CVD method, a microwave CVD method, an electron cyclotron resonance (ECR) CVD method, a thermal filament CVD method, or the like), a combustion flame method, a sputtering method, an ion beam evaporation method, a laser evaporation method, or the like. A hydrogen gas and a hydrocarbon-based gas (for example CH$_4$, C$_2$H$_2$, C$_6$H$_6$, or the like) are used as a reactive gas which is used for forming the film. The reaction gas is ionized by glow discharge. The ions are accelerated to collide with a cathode applied with negative self bias. A CN film may be formed by using a C$_2$H$_4$ gas and an N$_2$ gas as the reactive gases. The DLC film has a high blocking effect on oxygen and can suppress the oxidation of the electroluminescent layer. Accordingly, the electroluminescent layer can be prevented from oxidizing during the subsequent sealing process.

As shown in FIG. 7(B), a sealant 136 is formed and sealing is performed with a sealing substrate 140. Then, a flexible wiring substrate may be connected to a gate wiring layer which is formed being electrically connected to the gate electrode layer 102 to electrically connect to the exterior. This is the same for a source wiring layer which is formed being electrically connected to the source electrode layer or drain electrode layer 112.

The substrate 100 having an element is sealed with a sealing substrate 140 while filling a filler 135 therebetween. The filler may be filled therebetween by using dripping in the same manner as a liquid crystal material. An inert gas such as nitrogen may be filled between the substrates as substitute for the filler 135. Further, providing a drying agent inside of the display device makes it possible to prevent deterioration of the light emitting element due to moisture. The drying agent may be provided over the sealing substrate 140 side or the substrate 100 side having an element. Furthermore, a depression portion may be provided over any one of the substrates to accommodate the drying agent therein. When the drying agent is placed in a portion where corresponds to a region that does not contribute to display performance such as a driver circuit region and a wiring region of the sealing substrate 140, the aperture ratio is not deteriorated even if the drying agent is an opaque substance. The filler 135 may be mixed with a material having a moisture absorbing property to also serve as a drying agent. As mentioned above, the display device using the light emitting element and having the display function can be completed (see FIGS. 7(A) and 7(B)).

Moreover, a terminal electrode layer 137 for electrically connecting the internal portion of the display device and an external portion is attached with an FPC 139 by an anisotropic conductive film 138 so that the terminal electrode layer 137 is electrically connected to the FPC 139.

FIG. 7(A) shows a top view of the display device. As shown in FIG. 7(A), a pixel region 150, a scanning line driver circuit region 151$a$, a scanning line driver circuit region 151$b$ and a connection region 153 are sealed between the substrate 100 and the sealing substrate 140 using a sealing material 136. A signal line driver circuit 152 that is formed using an IC driver is formed over the substrate 100. In a drive circuit region, a thin film transistor 133 and a thin film transistor 134 are formed and in a pixel region, a thin film transistor 131, a thin film transistor 130 and a capacitor element 132 are formed, respectively.

An example in which a light emitting element is sealed with a glass substrate is shown in this embodiment mode. This sealing treatment is carried out to protect the light emitting element from moisture. Any one of the following methods can be used: a method in which a light emitting element is mechanically sealed with a cover material; a method in which a light emitting element is sealed with a heat curable resin or an ultraviolet light curable resin; and a method in which a light emitting element is sealed with a thin film having an excellent barrier property such as metal oxide and nitride. As for the cover a material, a glass, a ceramic, a plastic or a metal can be used. When light is emitted through the cover material, the cover material is required to be formed of a material with a light-transmitting property. The cover material is attached to the substrate over which the above mentioned light emitting element is formed with a sealing material such as a heat curable resin or an ultraviolet light curable resin and then the resin is cured by a heat treatment or an ultraviolet irradiation treatment to form an enclosed space. It is also effective to form a hydroscopic material typified by barium oxide in the enclosed space. This hydroscopic material may be formed on the sealing material or over a partition wall or a peripheral part so as not to block light emitted from a light emitting element. Furthermore, it is also possible to fill a gap between the cover material and the substrate over which the light emitting element is formed with a heat curable resin or an ultraviolet light curable resin. In this case, it is effective to add a hydroscopic material typified by barium oxide in the heat curable resin or the ultraviolet light curable resin.

Although a switching TFT having a single gate structure is shown in this embodiment mode, a multi-gate structure such as a double gate structure may be also employed. When a semiconductor is formed by using an SAS or a crystalline semiconductor, an impurity region can be formed by adding an impurity imparting one conductivity type. In this case, the semiconductor layer may have impurity regions having different concentrations. For example, a region laminated with a gate electrode layer in the vicinity of a channel region of a semiconductor layer may be a low concentration impurity region while a region outside of the low concentration impurity region may be a high concentration impurity region.

As set forth above, the process can be simplified by using no light exposure process using a photomask in this embodiment mode. Also, by forming various kinds of patterns directly over a substrate using the droplet discharging method, a display panel can be manufactured easily using a glass substrate of the fifth generation or later having 1,000 mm or more on a side.

According to the present invention, a desired pattern can be formed with good controllability. Moreover, loss of materials can be suppressed, thereby reducing the cost. As a consequence, a high performance and highly reliable display device can be manufactured with good yield.

Embodiment Mode 2

Figure 8:
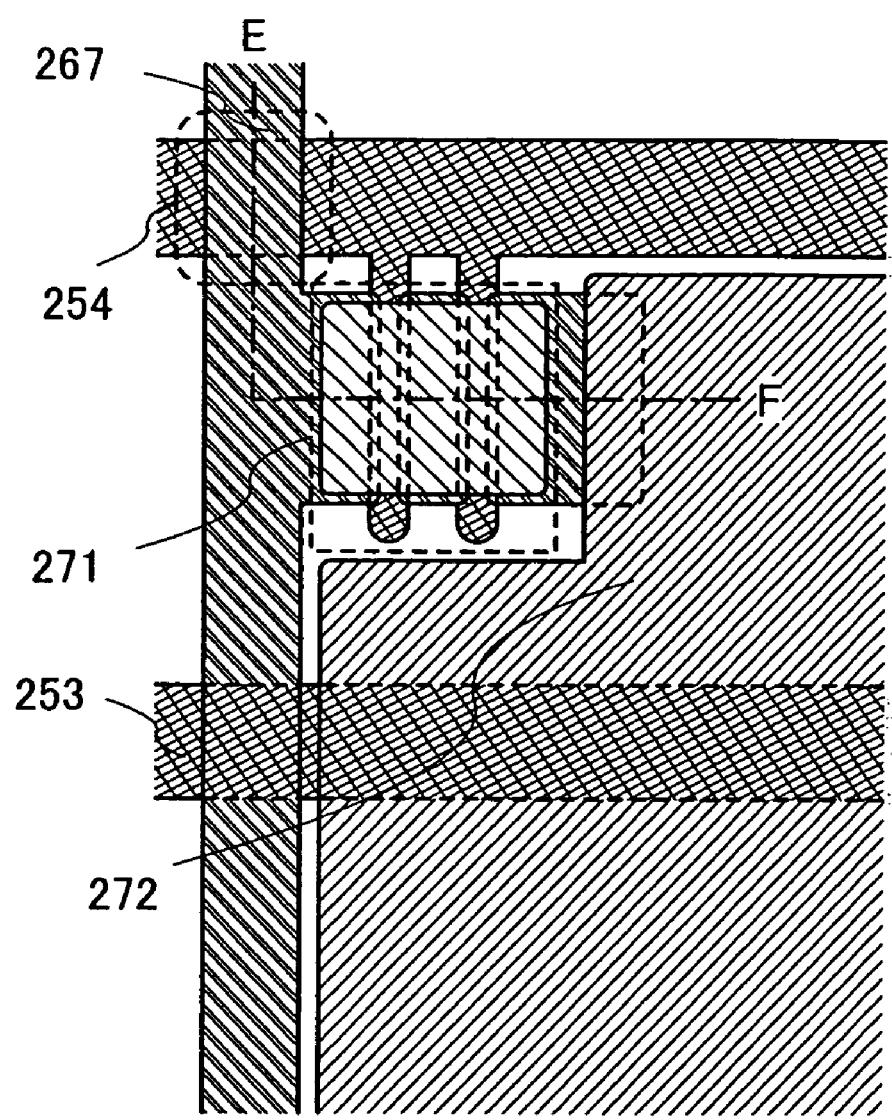
FIG. 8 illustrate a method for manufacturing a display device according to the present invention.
Figure 10A:
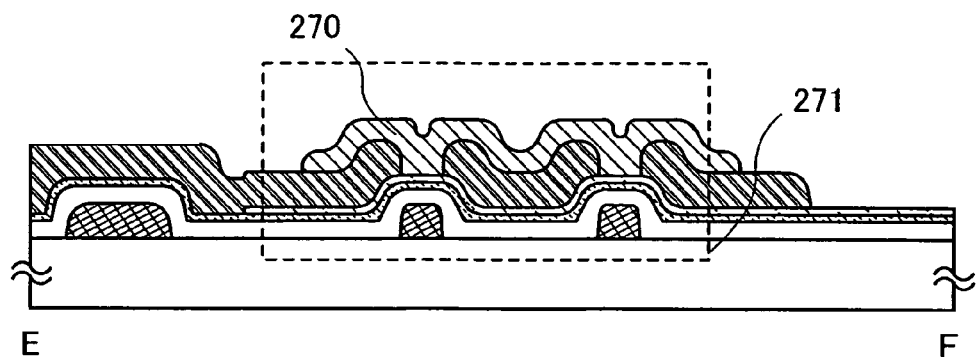
FIGS. 10(A) to 10(C) illustrate a method for manufacturing a display device according to the present invention.
Figure 10B:
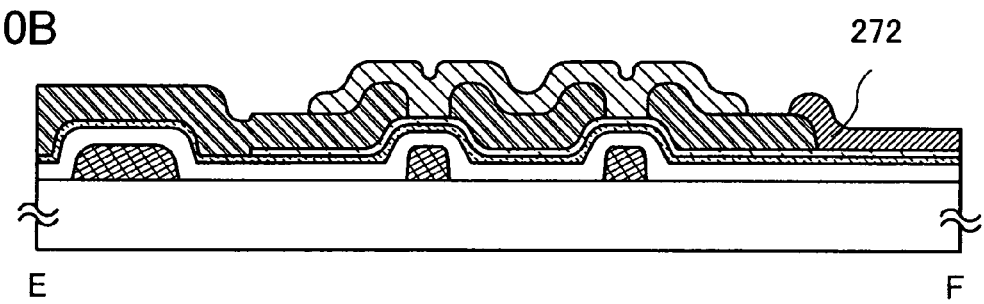
Figure 10C:
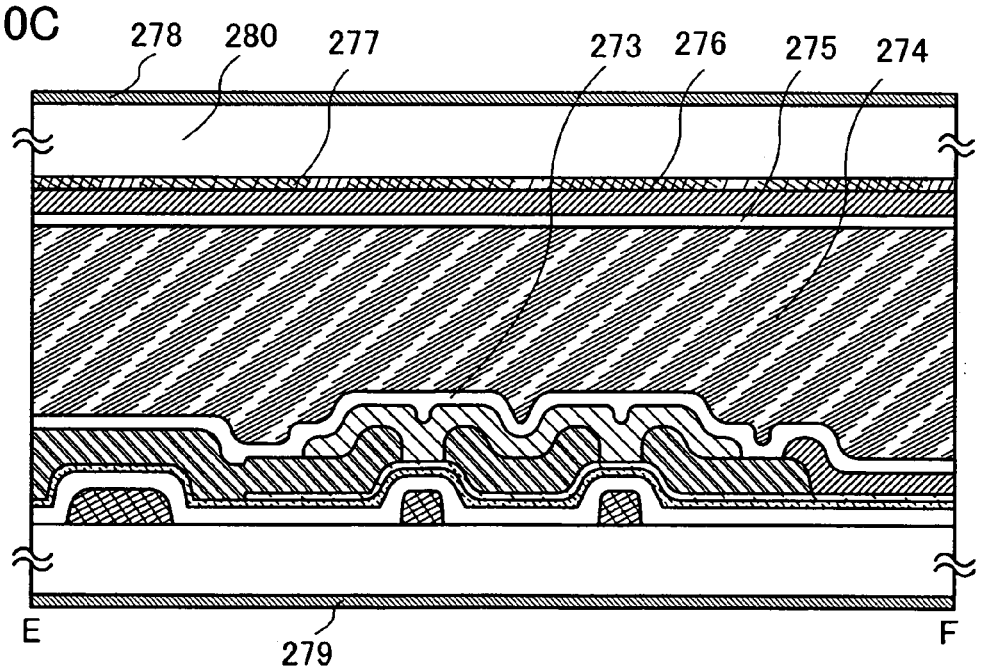
Figure 11A:
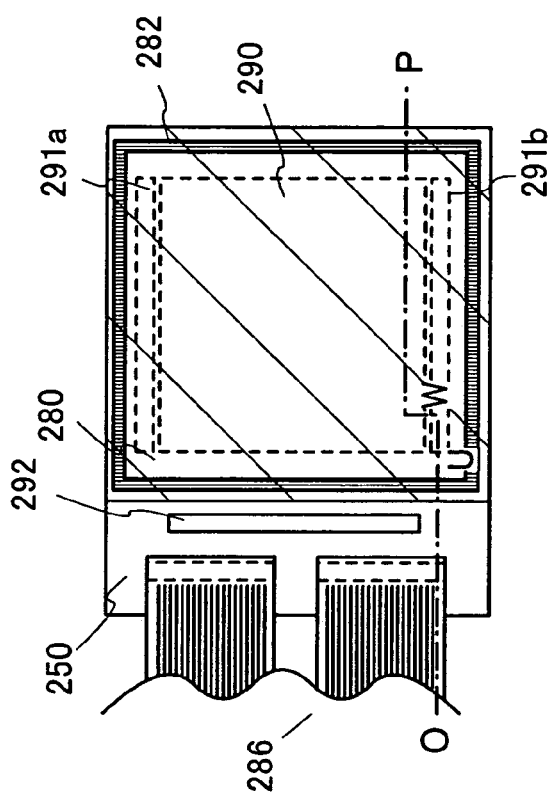
FIGS. 11(A) and 11(B) illustrate a method for manufacturing a display device according to the present invention.
Figure 11B:
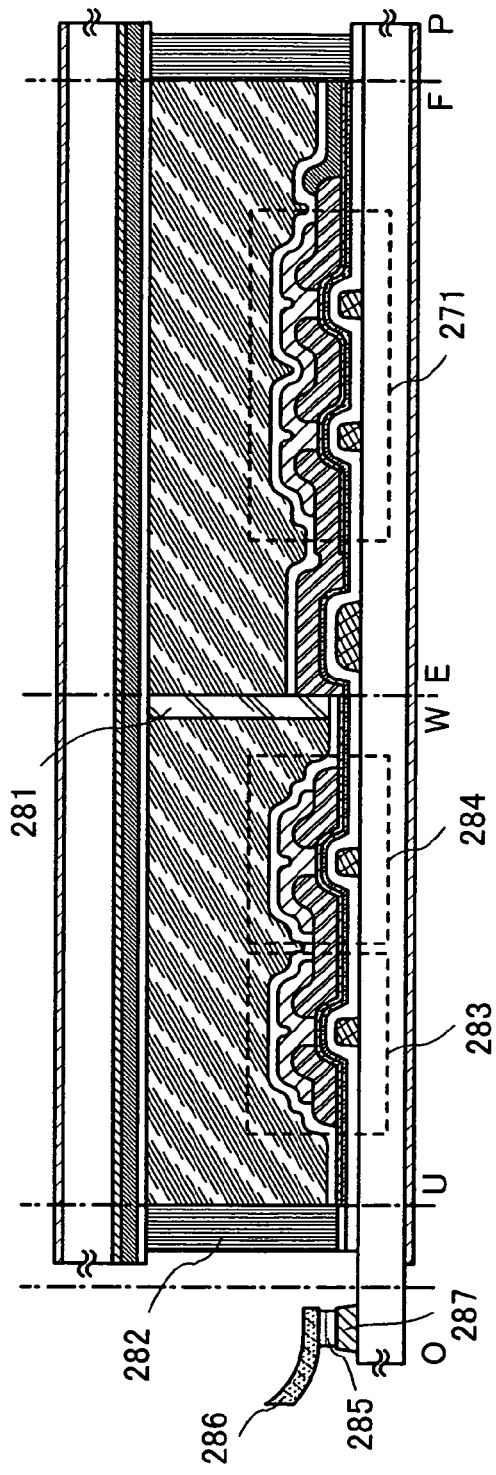
Figure 12A:
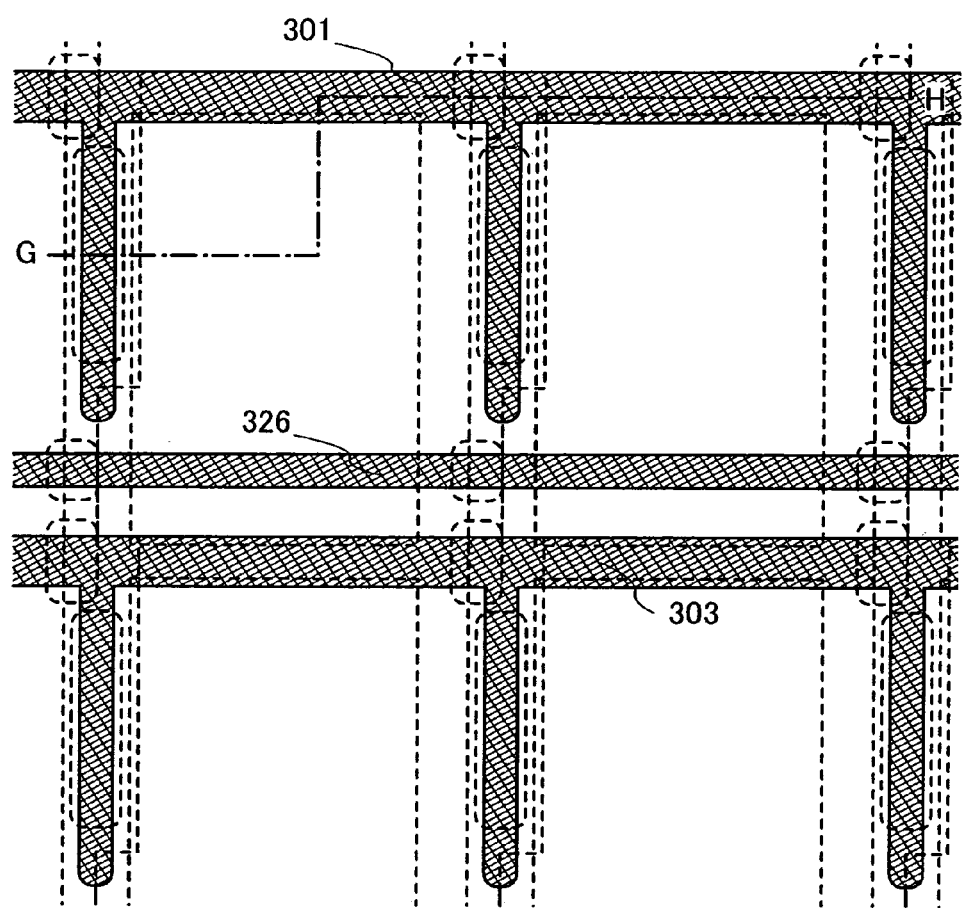
FIGS. 12(A) and 12(B) illustrate a method for manufacturing a display device according to the present invention.
Figure 12B:
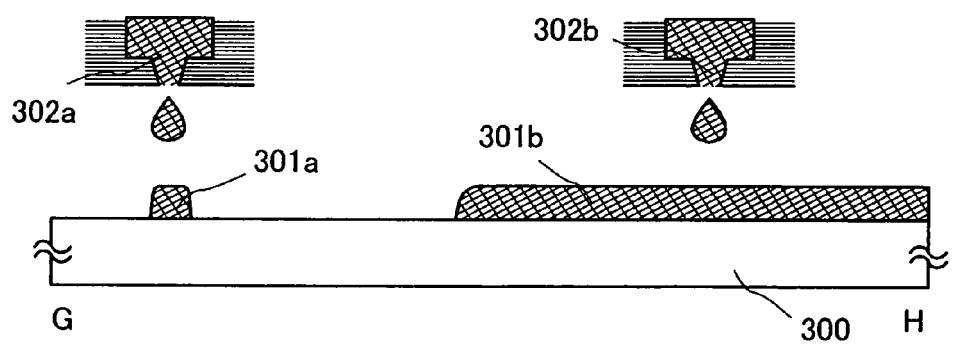

An embodiment mode of the present invention will be described using FIG. 8 to FIG. 11(B). Specifically, a method for manufacturing a display device having a coplanar type thin film transistor to which the present invention is applied will be described. FIG. 8 is a top view of a pixel portion of a display device. FIG. 9(A) to FIG. 10(C) are cross sectional views along a line E-F of FIG. 8 showing respective process of manufacturing the display device. FIG. 11(A) is also a top view of the display device. FIG. 11(B) is a cross sectional view along a line O-P (including a line U-W) of FIG. 11(A). Further, an example of a liquid crystal display device that uses a liquid crystal material as a display element is shown. Therefore, the same portions or portions having the same functions will not be repeatedly explained.

A gate electrode layer 254a, a gate electrode layer 254b, and a gate electrode layer 254c are formed over a substrate 250 having a light-transmitting property. The gate electrode layer 254a, the gate electrode layer 254b and the gate electrode layer 254c can be formed by using a CVD method, a sputtering method, a droplet discharging method or the like. In this embodiment mode, the gate electrode layer 254a, the gate electrode layer 254b and the gate electrode layer 254c are formed by selectively discharging a composition containing Ag as a conductive material from a droplet discharging device 255a, a droplet discharging device 255b and a droplet discharging device 255c (see FIG. 9(A)). As shown in FIG. 8, the gate electrode layer 254a, the gate electrode layer 254b and the gate electrode layer 254c are combined to one another and they are depicted as a gate electrode layer 254 in FIG. 8. A capacitor wiring layer 253 is also formed in the same manner as the gate electrode layer (see FIG. 8).

As the other method for changing and controlling wettability of a surface, a method by which a substance on a surface is decomposed by energy of light irradiation and the surface of a region is modified to change the wettability is used in this embodiment mode. In this case, it is preferable that a substance that enhances a processing efficiency by light be formed in a light irradiation region and to form and a substance having low-wettability be formed in a region provided with the substance. As the substance for enhancing the processing efficiency, a photocatalytic substance can be used. The photocatalytic substance improves a processing efficiency with light by an effect of light absorption or energy radiation. By photoactive energy of the photocatalytic substance, the substance having the low-wettability with respect to a material to be formed, which is laminated thereon, is decomposed and modified so that the wettability of a surface of the substance is changed. As the substance having the low-wettability, a substance containing fluorocarbon chain or a substance containing a silane coupling agent can be used. Further, the silane coupling agent may comprise an alkyl group.

Next, a gate insulating layer 256 is formed over the gate electrode layers 254a, 254b and 254c. The gate insulating layer 256 is required to have a light-transmitting property such that light is transmitted therethrough when the substance having low-wettability formed thereon is decomposed by light irradiation. The gate insulating layer 256 may be formed using a known material such as a silicon oxide material and a silicon nitride material, and have either a laminated layer or a single layer. In this embodiment mode, a laminated layer of three layers of a silicon nitride film, a silicon oxide film and another silicon nitride film is used.

In this embodiment mode, in order to form regions having different wettability precisely with good controllability, light irradiation is performed to a subject material through a substance (substrate) over which the subject material is formed. In this embodiment mode, an electrode layer, which also serves as a mask, or a mask layer is formed in advance over a substrate having a light-transmitting property with respect to light used in processing, and a substance having low-wettability is formed thereon. The side of the substrate having the light-transmitting property is irradiated with light to decompose a material for reducing wettability, which is contained in the substance having low-wettability except in a region to be formed with an electrode layer. Since the substance having the low-wettability formed on the electrode layers is not irradiated with light, the regions having different wettability can be formed with good controllability. Further, since the substance having the low-wettability formed on the mask layer is also removed when removing the mask layer, a region having high-wettability can be formed selectively. A wavelength of light is necessary to be a wavelength by which a substance having low-wettability to be used is decomposed and removed. However, light having high energy of 200 nm or less such as ultraviolet light is required depending on a substrate, and the range of choices is narrowed. Also, in the case of a wavelength that is absorbed by a substance having a light-transmitting property, which becomes a substrate, light is absorbed in the substrate having the light-transmitting property, a subject material is not irradiated with light, and therefore, it is sometimes difficult to modify a surface.

Accordingly, in this embodiment mode, in order to improve a processing efficiency by light irradiation, a photocatalytic substance is formed in contact with a substance to be processed. The photocatalytic substance absorbs light so that the light is activated. The activated energy affects a peripheral substance. As a result, a property of the substance is, changed and modified. Since a modifying ability is improved by a photocatalytic substance by using the present invention, the range of choices of light wavelength is widened. Therefore, a wavelength with a region which is not absorbed by a substance for forming a processing material can be selected, and light irradiation for performing a modifying treatment for a surface with good controllability can be carried out. Moreover, since light irradiation efficiency can also be improved, the treatment can be carried out sufficiently even when light has low energy. Therefore, since a device and processes are simplified cost and time are reduced, making it possible to improve productivity.

In addition, besides the photocatalytic substance in order to increase the processing efficiency by the light irradiation treatment, it is effective to add a light-absorbing material that has an absorption region in the wavelength range of the laser light to a substance to be processed. The light-absorbing material having an absorption region in the wavelength region of the laser light absorbs irradiated light and then emits (radiates) light around it. The radiant energy affects a peripheral substance, thereby changing and modifying the peripheral substance. Since the light-absorbing material may be selected in accordance with the type of light, the range of choices for light is widened.

As a light-absorbing material, an organic material, an inorganic material, a substance containing both an organic material and an inorganic material and the like can be used. A material having an absorption band corresponding to a wavelength of laser light to be used may be selected. Also, a conductive material such as metal or an insulating material such as an organic resin may be used. As for the inorganic material, iron, gold, copper, silicon, germanium and the like can be used. As for the organic material, plastic such as polyimide and acrylic, a pigment and the like can be used. For example, as a pigment corresponding to a 532 nm laser wavelength, rhodamine B, eosin Y, methyl orange, rose bengal and the like can be used. As a pigment corresponding to a 405 nm laser wavelength, coumarin series (such as coumarin 6H, coumarin 102, coumarin, 152 and coumarin 153) can be used. In addition, carbon black, a black resin of a colorant and the like can be employed as a pigment.

A photocatalytic substance 258 is formed on the gate insulating layer 256. Titanium oxide ($TiO_x$), strontium titanate ($SrTiO_3$), cadmium selenide (CdSe), potassium tantalate ($KTaO_3'$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), and the like are preferably used as the photocatalytic substance. The photocatalytic substance may be irradiated with light of ultraviolet region (having the wavelength of 400 nm or less, preferably, 380 nm or less), which allows to generate photocatalytic activity.

The photocatalytic substance can be formed by the dip coating method of the sol-gel method, the spin coating method, the droplet discharging method, the ion plating method, the ion beam method, the CVD method, the sputtering method, the RF magnetron sputtering method, the plasma spray coating method, the plasma spraying method, or the anodization method. A photocatalytic substance may not have continuity like a film. For instance, a photocatalytic substance including an oxide semiconductor that contains a plurality of metals can be formed by mixing and dissolving salt that is a constituent element. In the case where a photocatalytic substance is formed by coating such as the dip coating method and the spin coating method, a photocatalytic substance may be baked or dried to eliminate a solvent. Concretely, the photocatalytic substance may be heated at a certain temperature (e.g., 300° C. or more). Preferably, this heating treatment is performed under an atmosphere including oxygen.

Through the heat treatment, the photocatalytic substance can acquire a predetermined crystal structure. For example, it has an anatase structure or a rutile-anatase mixed structure. The anatase structure is preferentially formed in the low temperature phase. Thus, the photocatalytic substance may also be heated when it does not have a predetermined crystal structure. In addition, in the case of forming the photocatalytic substance by a coating method, it can be formed plural times to obtain a predetermined film thickness.

Further, a transition metal (such as Pd, Pt, Cr, Ni, V, Mn, Fe, Ce, Mo, or W) can be doped into the photocatalytic substance, so that the photocatalytic activity is enhanced or the photocatalytic substance can be activated by light in the visible range (wavelength of 400 nm to 800 nm). This is because a transition metal can form a new level within a forbidden band of an active photocatalytic substance having a wide band gap and can expand the light absorption range to the visible range. For example, an acceptor type such as Cr or Ni, a donor type such as V or Mn, an amphoteric impurity such as Fe, or other types such as Ce, Mo, W can be doped. Thus, the wavelength of light can be determined depending on the photocatalytic substance. Therefore, light irradiation in the present invention denotes irradiation with light having such a wavelength that activates the photocatalytic substance.

When the photocatalytic substance is heated and reduced in vacuum or under hydrogen flow, an oxygen deficiency is caused in the crystal. Even when the transition element is not doped, an oxygen deficiency plays a similar role to an electron donor in this manner. In particular, in the case of forming the photocatalytic substance by sol-gel method, the photocatalytic substance may not be reduced since an oxygen deficiency exists from the beginning. In addition, an oxygen deficiency can be caused by doping a gas of $N_2$ or the like.

In this embodiment mode, a titanium oxide layer is formed as a photocatalytic substance. The titanium oxide layer is formed by the spin coating method with $TiCl_3$ solution, and bonding with the substrate and baking in an oxygen atmosphere. In addition, titania sol may be applied and dried. Titania sol can use binder, and it is preferred to use inorganic binders such as a silicate series, inorganic colloid series, and metallic alkoxide series as binders. Alternatively, a titanium oxide ($TiO_x$ (typified by $TiO_2$)) crystal including a predetermined crystalline structure may be formed by the sputtering method. In this case, sputtering is carried out with argon gas and oxygen using a metallic titanium tube as the target. He gas may be used additionally. A titanium oxide layer having high photocatalytic activity is formed under an atmosphere containing much oxygen and higher formation pressure. Further, it is preferable to form the titanium oxide layer while heating the film formation chamber or the substrate provided with the object. The thus formed titanium oxide layer has photocatalytic properties even though it is thin.

The mask layer 257 is formed selectively on the photocatalytic substance 258. The mask layer 257 is formed selectively in the region where the gate electrode layer intersects with the source electrode layer or drain electrode layer through the gate insulating layer 256. In this embodiment mode, the mask layer 257 is formed by the droplet discharging method using the PVA.

Figure 9A:
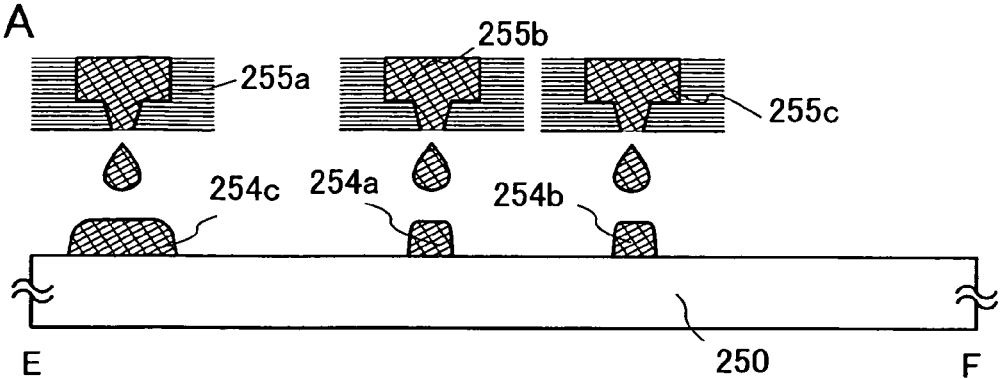
FIGS. 9(A) to 9(D) illustrate a method for manufacturing a display device according to the present invention.
Figure 9B:
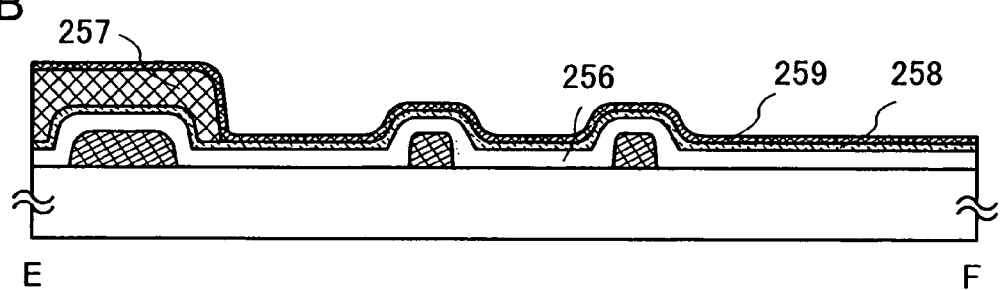
Figure 9C:
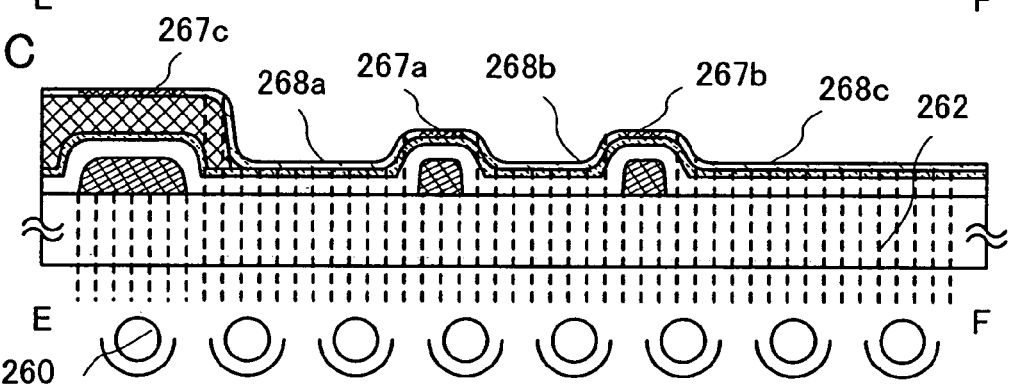
Figure 9D:
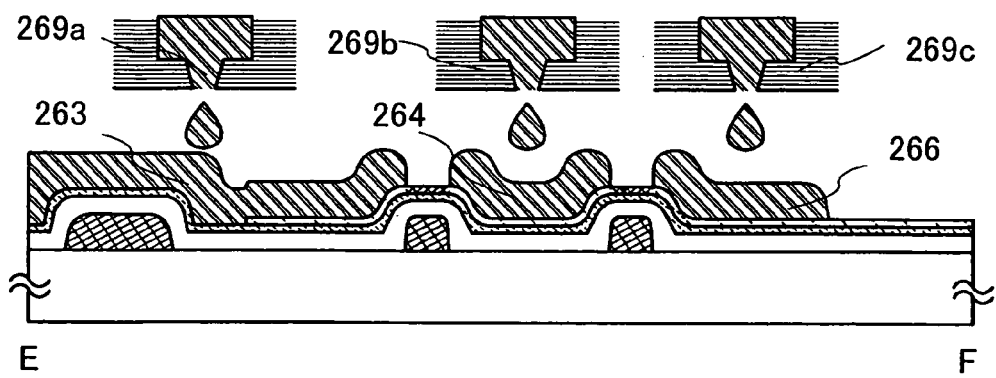

The low-wettability substance 259 is formed on the mask layer 257 and the photocatalytic substance 258 (see FIG. 9(B)).

As the low-wettability substance, a substance including a fluorocarbon chain or a substance including a silane coupling agent can be used. The silane coupling agent is represented as a chemical formula: $R_n$—Si—$X_{(4-n)}$ (n=1, 2, 3). In this chemical formula, R represents a substance containing a relatively inactive group such as alkyl group. X represents a hydrolysate group such as halogen, a methoxy group, an ethoxy group and an acetoxy group that is bondable with a hydroxyl group or an adsorbed water of a substrate surface due to condensation.

By using a fluorine-based silane coupling agent (fluoroalkyl silane (FAS)) having a fluoroalkyl group for R as a representative example of the silane coupling agent, the wettability can be further lowered. R of FAS has a structure which expressed by $(CF_3)(CF_2)_x(CH_2)_y$. (x: an integer of 0 or more and 10 or less, y: an integer of 0 or more and 4 or less). In the case where a plurality of R or X are bonded to Si, R or X may all be the same or different. Fluoroalkylsilane (hereinafter referred to as FAS) such as heptadecafluorotetrahydrodecyltriethoxysilane, heptadecafluorotetrahydrodecyltrichlorosilane, tridecafluorotetrahydrooctyltrichlorosilane, trifluoropropyltrimethoxysilane can be given as representative FAS.

A substance having no fluorocarbon chain in R of the silane coupling agent but having the alkyl group may also be used as the low-wettability substance. For example, octadecyltrimethoxysilane and the like can be used as an organic silane.

As the solvent of a solution for forming the low-wettability region, a solvent which forms a low-wettability surface such as a hydrocarbon-based solvent, tetrahydrofuran, or the like, namely, n-pentane, n-hexane, n-heptane, n-octane, n-decane, dicyclopentane, benzene, toluene, xylene, durene, indene, tetrahydronaphthalene, decahydronaphthalene, squalene, or the like is used.

As an example of the compound of the solvent for forming the low-wettability region, a material having a fluorocarbon chain (a fluorine resin) can be used. As the fluorine resin, polytetrafluoroethylene (PTFE; a polytetrafluoroethylene resin), perfluoroalkoxyalkane (PFA; a tetrafluoroethylene perfluoroalkylvinylether copolymer resin), perfluoroethylene propylene copolymer (PFEP; a tetrafluoroethylene hexafluoropropylene copolymer resin), ethylene-tetrafluoroethylene copolymer (ETFE; a tetrafluoroethylene-ethylene copolymer resin), polyvinylidene fluoride (PVDF; a polyvinylidene fluoride resin), polychlorotrifluoroethylene (PCTFE; a polytrifluorochloroethylene resin), ethylene-chlorotrifluoroethylene, copolymer (ECTFE; a polytrifluorochloroethylene-ethylene copolymer resin), polytetrafluoroethylene-perfluorodioxol copolymer (TFE/PDD), polyvinylfluoride (PVF; a vinyl fluoride resin), or the like can be used.

In addition, an organic material which does not form a low-wettability region (in other words, which forms a high-wettability region) may be used to form a low-wettability region by performing a treatment with the use of $CF_4$ plasma or the like later. For example, a material in which a soluble resin such as polyvinyl alcohol (PVA) is mixed into a solvent such as $H_2O$ can be used. In addition, PVA mixed with another soluble resin may be used. An organic material (an organic resin material) (polyimide, acrylic) and a siloxane resin may be used. Even when a material having a low-wettability surface is used, the wettability can be further reduced by performing a plasma treatment or the like.

In this embodiment mode, FAS is used as a low-wettability substance 259, and formed in a large region (the entire coating, or the like) by a spin coating method. The substance is wettable with respect to the compound including a conductive material which later constitutes a source electrode layer or drain electrode layer. FAS used in this embodiment mode is decomposed with light having a wavelength of 200 nm or less; however, a glass substrate absorbs and does not transmit light with a wavelength of 300 nm or less. Therefore, it is difficult to irradiate FAS with light if a glass substrate is used as the substrate. Accordingly, in this embodiment mode, a titanium oxide layer which shows an effect of a light-catalytic material by light irradiation of 380 nm or less is formed. A metal halide lamp, which is an ultraviolet lamp that emits light with a wavelength of 200 nm to 450 nm, is used as a light source. The light-catalytic material can be appropriately selected depending on the wavelength of the light to be used.

As a pretreatment for forming the source electrode layer or drain electrode layer with good controllability, a vicinity of a pattern formation region of the source electrode layer and the drain electrode layer is modified to have different wettability by comparison with a region adjacent thereto. The wettability is selectively changed by using photoactivation of the photocatalytic substance by the light irradiation treatment to form a high-wettability region and a low-wettability region. The difference in wettability can be confirmed by contact angles and the difference in contact angles is 30 degree or more, and preferably, 40 degree or more. In the present invention, the photocatalytic substance which is activated by the wavelength of the light irradiated, is formed close against an object to improve irradiation treatment efficiency of light.

Next, the photocatalytic substance 258 is irradiated with light 262 from the light-transmitting substrate 250 side by a light source 260 through the substrate 250. The low-wettability substance 259 is decomposed by the energy generated when the photocatalytic substance 258 is activated by the light 262; thus, the wettability is improved. Consequently, the concentration of the low-wettability substance contained in the low-wettability region (For example, the concentration or the amount of the fluorocarbon chain which has an effect of reducing wettability) becomes lower than that in the high-wettability region. The treatment efficiency can be enhanced since the photocatalytic effect of the photocatalytic substance is used. The gate electrode layer 254a, the gate electrode layer 254b and the gate electrode layer 254c are used as masks; therefore, the surfaces of the low-wettability substance over the regions which are overlapped with the gate electrode layer 254a, the gate electrode layer 254b and the gate electrode layer 254c are not modified. A high-wettability region 268a, a high-wettability region 268b and a high-wettability region 268c, which are relatively more wettable, and a low-wettability region 267a, a low-wettability region 267b and a low-wettability region 267c are relatively less wettable are formed on the surface of the low-wettability substance 259 by irradiation treatment with light 262 (see FIG. 9(C)). By using the present invention, the range of choices for light is widened since a photocatalytic substance can be selected in accordance with light. Consequently, the wavelength that is hardly absorbed by the substance to be provided with the object can be selected, and light irradiation (so-called back exposure) for performing a surface modification treatment can be carried out. Further, the efficiency of light irradiation can be improved, so that the treatment can be performed even though the light itself has low energy. As a result, the apparatuses and processes are simplified, thus, costs and time are reduced, and the productivity can be improved.

The mask layer 257 is removed with the low-wettability substance, which is formed on the mask layer 257, after the controlling of the wettability is performed by light irradiation. In this embodiment mode, the mask layer 257 is removed by washing with water. Since the low-wettability substance is not formed in the region on which the mask layer 257 is provided, the region provided on which the mask layer has relatively higher wettability than the region on which the low-wettability substance is formed, as well as the region of which the wettability is increased by light irradiation.

A composition containing a conductive material is discharged from a droplet discharge device 269a, a droplet discharge device 269b, and a droplet discharge device 269c to the high-wettability region 268a, the high-wettability region 268b, and the high-wettability region 268c. Thus, a source electrode layer or drain electrode layer 263, a source electrode layer or drain electrode layer 264, and a source electrode layer or drain electrode layer 266 are formed (see FIG. 9(D)). In this embodiment mode, Ag is used as the conductive material. Even when a method for discharging a pattern material can not be controlled precisely because of the size of a discharge port of the nozzle from which the droplet is discharged, the moving ability of the discharge port, and the like the droplet is attached only to the region to form a desired pattern by performing a treatment for enhancing wettability on the pattern formation region. This is because the pattern formation region and the periphery thereof have different wettability; therefore, the droplet is repelled only in the low-wettability region and remains on the pattern formation region having higher wettability. In other words, a droplet is repelled by the low-wettability region; therefore, a boundary between the high-wettability region and the low-wettability region functions as a partition wall (a bank). Accordingly, even the composition containing a conductive material having fluidity can remain on the high-wettability region; thus, each source electrode layer or drain electrode layer can be formed to have a desired shape. The source electrode layer or drain layer 263 may also be performed as the source wiring layer.

According to the present invention, when a minute pattern of, for example, an electrode layer, or the like is formed, a droplet does not spread over a formation region even when a discharge port of the droplet is somewhat large, therefore, a conductive layer can be formed only in the formation region, and defects such as a short-circuit caused by the formation in a region other than the formation region can be prevented. Additionally, film thickness of the wiring can be controlled. When the surface of the substance is modified by light irradiation from the side of a substrate in the same manner as this embodiment mode, a large region can be treated in addition to forming a pattern with good controllability; thus, production efficiency is improved. By combining a droplet discharging method, the material loss can be avoided compared with entire surface application formation by a spin coating method or the like; therefore, the cost can be reduced. According to the present invention, a pattern can be formed with preferable controllability even in the case where a wiring or the like is provided integrally and intricately due to miniaturization and thinner film formation.

In this embodiment mode, the low-wettability region 267s and the low-wettability region 267b are irradiated with light, and decomposed to improve the wettability. In addition, an unnecessary portion of the photocatalytic substance and the low-wettability substance may also be removed. The electrode layer may be used as the mask for the removal and may be removed by ashing, wet etching, dry etching, and plasma processing which are using oxygen and the like. After that, the semiconductor layer 270 is formed by the droplet discharging method using pentacene, and the coplanar type thin film transistor 271 is formed (see FIG. 10(A)).

The treatment for enhancing wettability is carried out to make the force of holding a droplet discharged over a region (also referred to as adhesion force or fixing force) stronger than that of the periphery thereof, which is equivalent to enhancing the adhesion with the droplet, by modifying the region. Only a surface which is in contact with and holds a droplet may have the wettability, and the whole film does not necessarily have the similar properties.

Subsequently, a composition containing a conductive material is selectively discharged to be in contact with the source electrode layer or drain electrode layer 266 to form a pixel electrode layer 272 (see FIG. 10(B)). When forming this pixel electrode layer 272, a pretreatment of forming the low-wettability region and the high-wettability region may be carried out. By discharging the composition containing the conductive material in the high-wettability region, the pixel electrode layer 272 can be selectively formed with good controllability. The pixel electrode 272 can be used the same material as the first electrode 119, which is mentioned above. In the case of manufacturing a transmissive liquid crystal display panel, the pixel electrode layer may be formed by using a composition containing indium tin oxide (ITO), indium tin oxide including silicon oxide (ITSO), zinc oxide (ZnO), tin oxide ($SnO_2$) or the like to have a predetermined pattern, and then baking the composition. Naturally, the material may also be formed by an evaporation method (a PVD method and a CVD method), and a sputtering method and the like. In this embodiment mode, indium tin oxide (ITO) is used as the pixel electrode layer 272.

Next, an insulating layer 273 which is referred to as an orientation film, is formed by the printing method and the spin coating method so as to cover the pixel electrode layer 272 and the thin film transistor 271. This insulating layer 273 can be selectively formed by mimeograph method or offset printing method. Thereafter, a rubbing treatment is carried out. Subsequently, a sealing material 282 is formed in a peripheral region of a pixel by the droplet discharging method.

Thereafter, a counter substrate 280 over which an insulating layer 275 functioning as an orientation film, a colored layer 277 functioning as a color filter, a conductive layer 276 functioning as a counter electrode and a polarizing plate 278 are provided is attached to the substrate 250, which is the TFT substrate, while sandwiching a spacer 281 therebetween. A liquid crystal layer 274 is provided in a gap between the counter substrate 280 and the substrate 250 so as to achieve a liquid crystal display panel (see FIGS. 10(C) and 11(B)). A polarizing plate 279 is also formed on another surface of the substrate 250 opposite to the surface of the substrate 250 having the element. The sealing material may contain a filler. In addition, a light shielding film (black matrix) and the like may be formed on the counter substrate 280. Further, the liquid crystal layer can be formed by using a dispenser (a dropping method), a dipping method in which a liquid crystal is injected between the attached substrate 250 having the element and the counter substrate 280 by using capillary phenomenon, and the like.

Figure 29:
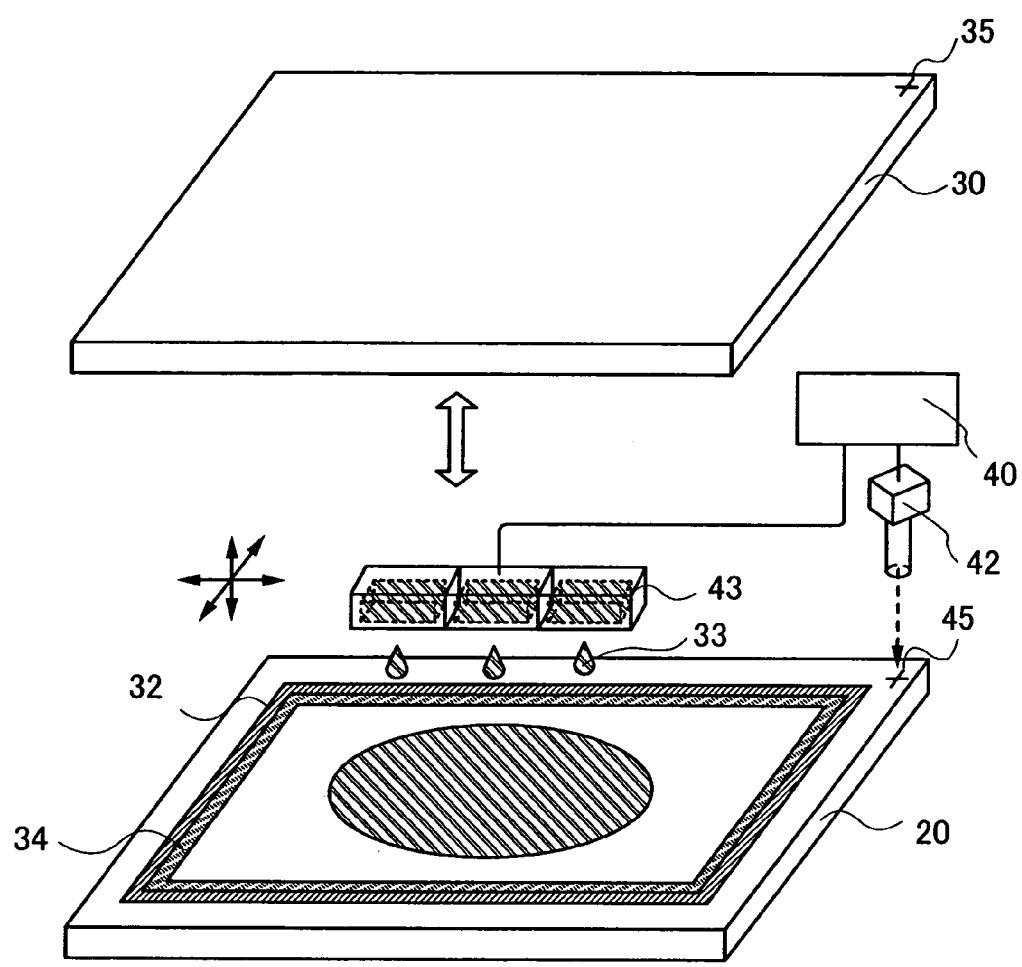
FIG. 29 is a diagram explaining a method for implanting a liquid crystal that can be applied to the present invention.

A liquid crystal dropping method employing a dispenser will be described with reference to FIG. 29. In FIG. 29, the liquid crystal dropping method includes a controlling device 40, image pickup means 42, a head 43, a liquid crystal 33, a marker 35, a marker 45, a barrier layer 34, a sealing material 32, a TFT substrate 30, and a counter substrate 20. A closed loop is formed on the counter substrate 20 by using a sealing material 32, and the liquid crystal 33 is dropped therein at one or more times from the head 43. When the viscosity of the liquid crystal material is high, the liquid crystal is discharged continuously to be attached to a subject region. On the other hand, when the viscosity of the liquid crystal material is low, the liquid crystal is discharged intermittently as shown in FIG. 29. At this moment, the barrier layer 34 is formed to prevent the sealing material 32 from reacting with the liquid crystal 33. Subsequently, the substrates are attached to each other in vacuum. The sealing material is cured by being irradiated with ultraviolet light so that the liquid crystal is enclosed between the substrates. Alternatively, a sealing material may be formed on the TFT substrate side and liquid crystal may be dropped therein.

In order to connect inside of the display device manufactured in the above process to an external wiring substrate, a connection portion is formed. An insulating layer in the connection portion is removed by ashing using oxygen gas under atmospheric pressure or almost atmospheric pressure. The ashing treatment uses oxygen gas together with one or more of hydrogen, $CF_4$, $NF_3$, $H_2O$ and $CHF_3$. In this process, the ashing treatment is performed after sealing the liquid crystal with the counter substrate so as to prevent damage or breakage due to electrostatic. In the case of having a less possibility of adverse effect due to electrostatic, however, the ashing treatment can be carried out at any time.

Subsequently, a terminal electrode layer 287 which is electrically connected to the pixel portion and a FPC (Flexible Printed Circuit) 286 which is a connection wiring substrate are provided through an anisotropic conductive layer 285. The FPC 286 serves to transmit a signal or an electric potential from the outside. According to the above mentioned process, a liquid crystal display device having a display function can be formed.

FIG. 11(A) shows a top view of the liquid crystalline display device. As shown in FIG. 11(A), a pixel region 290, a scanning line driver circuit region 291a, and a scanning line driver circuit region 291b are sealed between the substrate 250 and the opposed substrate 280 using a sealing material 282. A signal line driver circuit 292 that is formed using an IC driver is formed over the substrate 250. In a drive region, a drive circuit having a thin film transistor 283 and, a thin film transistor 284 is formed.

Although a switching TFT having a double gate structure is shown in this embodiment mode, a single gate structure having more plural TFTs may also be used. Alternatively, more plurality of multi-gate structure may also be used. When a semiconductor is formed by using an SAS or a crystalline semiconductor, an impurity region can be formed by adding an impurity that imparts one conductivity type. In this case, the semiconductor layer may have impurity regions having different concentrations. For example, a region laminated with a gate electrode layer in the vicinity of a channel region of a semiconductor layer may be a low concentration impurity region while a region outside of the low concentration impurity region may be a high concentration impurity region.

As set forth above, the process can be simplified according to the present embodiment mode. Also, by directly forming various kinds of formations (parts) over a substrate using the droplet discharging method, a display panel can be manufactured easily using a glass substrate of the fifth generation or later having 1,000 mm or more on a side.

According to the present invention, formations of a display device having desired patterns can be easily formed with good controllability. Moreover, loss of materials can be suppressed, thereby reducing the cost. As a consequence, a high performance display device having a high reliability can be manufactured with good yield.

Embodiment Mode 3

An embodiment mode according to the present invention will be described with reference to FIG. 12(A) to FIG. 17(B). In this embodiment mode, a display device is formed using a thin film transistor of inverted coplanar type as a thin film transistor. An example of a liquid crystal display device using a liquid crystal material as a display element is shown. Accordingly, the same part or a part having similar function will not be repeatedly explained. Each of FIG. 12(A) to FIG. 17(A) shows a top view of a display device, each of FIG. 12(B) to FIG. 17(B) shows a cross-sectional view taken along line G-H in FIG. 12(A) to FIG. 17(A).

Also in this embodiment mode, a light irradiation treatment is carried out through a substrate to modify the irradiated region to change the wettability thereof by using the photo activity of a photocatalytic substance.

A gate electrode layer 301 and a gate electrode layer 303, and a capacitor wiring layer 326 are formed on the substrate 300 having the light-transmitting property. In cross-sectional view of FIG. 12(B), the gate electrode layer 301 is depicted as separated two gate electrode layers like a gate electrode layer 301a of a region for a gate electrode and a gate electrode layer 301b for a region for a gate wiring. The gate electrode layer 301, the gate electrode layer 303, and the capacitor wiring layer 326 can be formed using the CVD method, the sputtering method, the droplet discharging method, and the like. In this embodiment mode, a composition containing Ag as a conductive material is discharged selectively by the droplet discharging device 302a and the droplet discharging device 302b to form the gate electrode layer 301a and the gate electrode layer 301b (see FIG. 12(B)).

Next, a gate insulating layer 304 is formed over the gate electrode layers 301, 303 and the capacitor wiring layer 326. When a material having low-wettability formed on the gate insulating layer 304 is decomposed by light irradiation, the gate insulating layer 304 needs to have light-transmitting property so as to transmit light therethrough. The gate insulating layer 304 may be formed by using a known material such as a silicon oxide material and a silicon nitride material. The gate insulating layer may have a single layer or a lamination layer. In this embodiment mode, the gate insulating layer 304 is formed by laminating a silicon nitride film, a silicon oxide film and another silicon nitride film.

In this embodiment mode, a photocatalytic substance is formed selectively in contact with the object, in order to improve the processing efficiency of light irradiation. The photocatalytic substance absorbs light and is activated. The activated energy acts on the substance around and consequently modifies the substance by changing the properties thereof. The photocatalytic substance improves the modifying efficiency according to the present invention; thus, the range of choices for the light wavelength is increased. Consequently, the wavelength that is hardly absorbed by the substance to be provided with the object can be selected, and light irradiation for controllable surface modification treatment can be carried out. Further, the efficiency of light irradiation can be improved, so that the treatment can be done sufficiently even though the light itself has low energy. As a result, the apparatuses and processes are simplified, thus, costs and time are reduced, and the productivity can be improved.

Figure 13A:
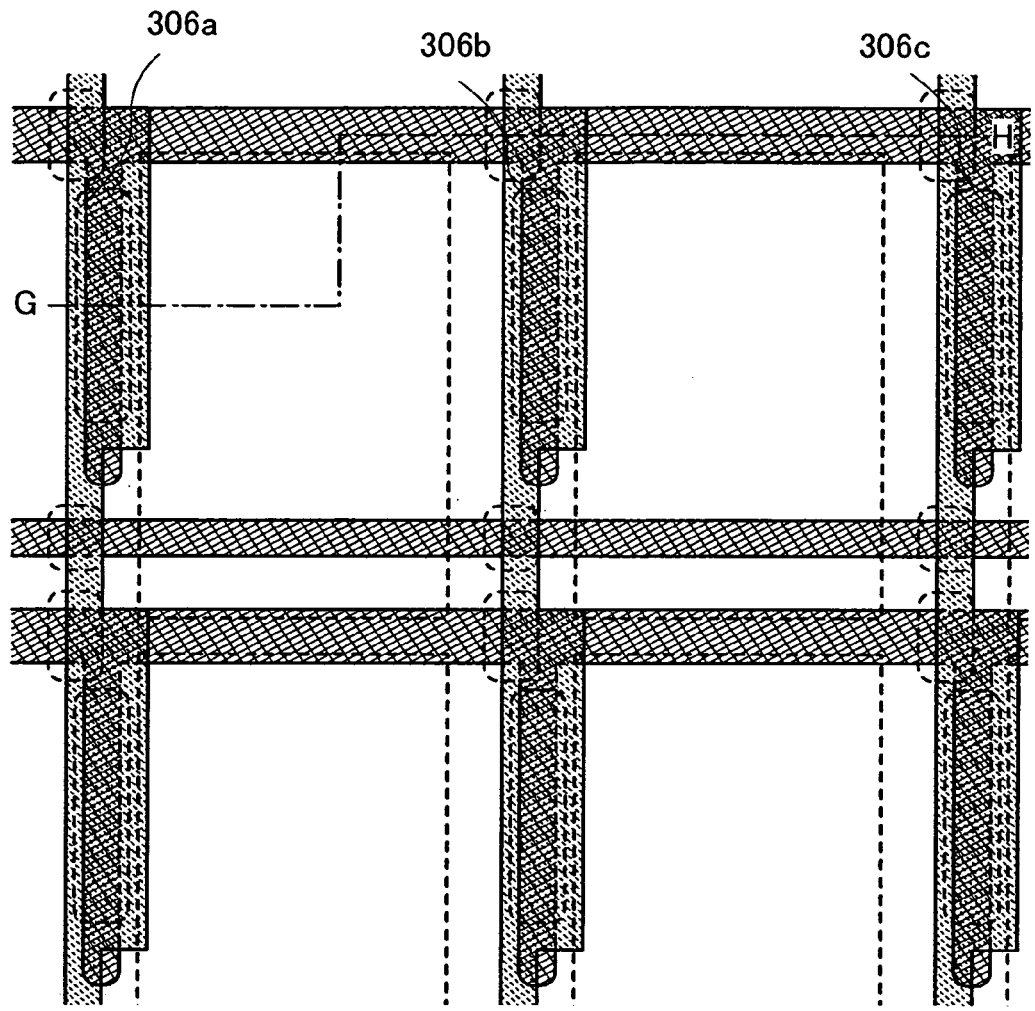
FIGS. 13(A) and 13(B) illustrate a method for manufacturing a display device according to the present invention.
Figure 13B:
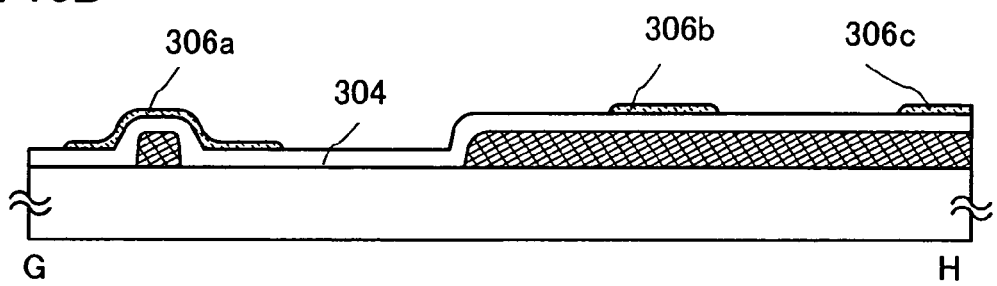

A photocatalytic substance 306a, a photocatalytic substance 306b, and a photocatalytic substance 306c are formed selectively on the gate insulating layer 304 (see FIGS. 13(A) and 13(B)). In this embodiment mode, titanium oxide ($TiO_x$) is used as the photocatalytic substances. The photocatalytic substances may also be formed selectively by the droplet discharging method, the printing method or the like, or patterned into a desired shape using a mask or the like after they are formed.

Figure 14A:
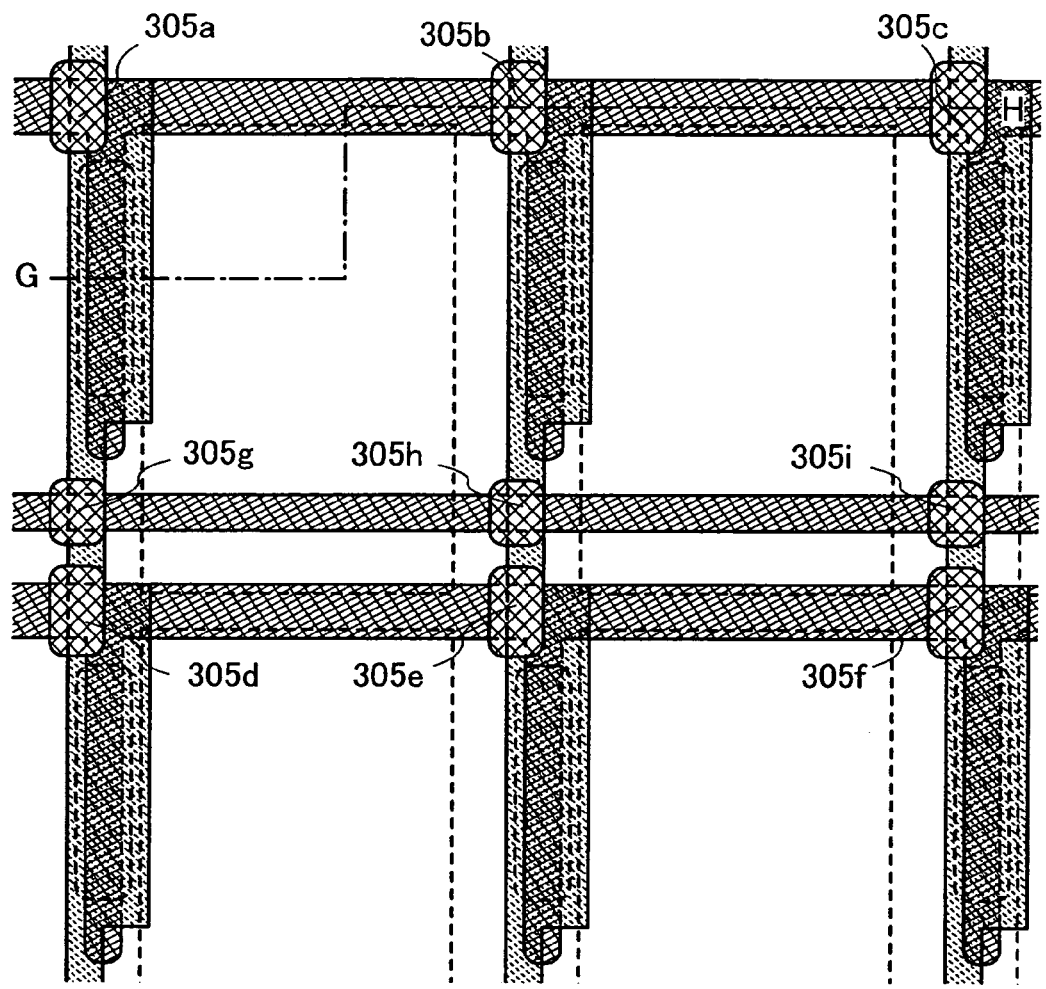
FIGS. 14(A) and 14(B) illustrate a method for manufacturing a display device according to the present invention.
Figure 14B:
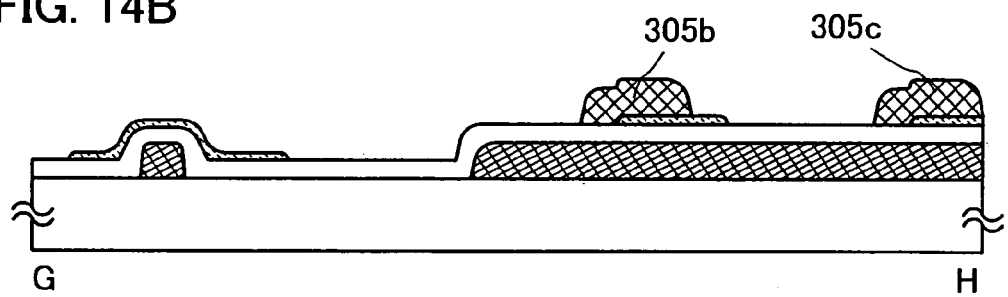
Figure 15A:
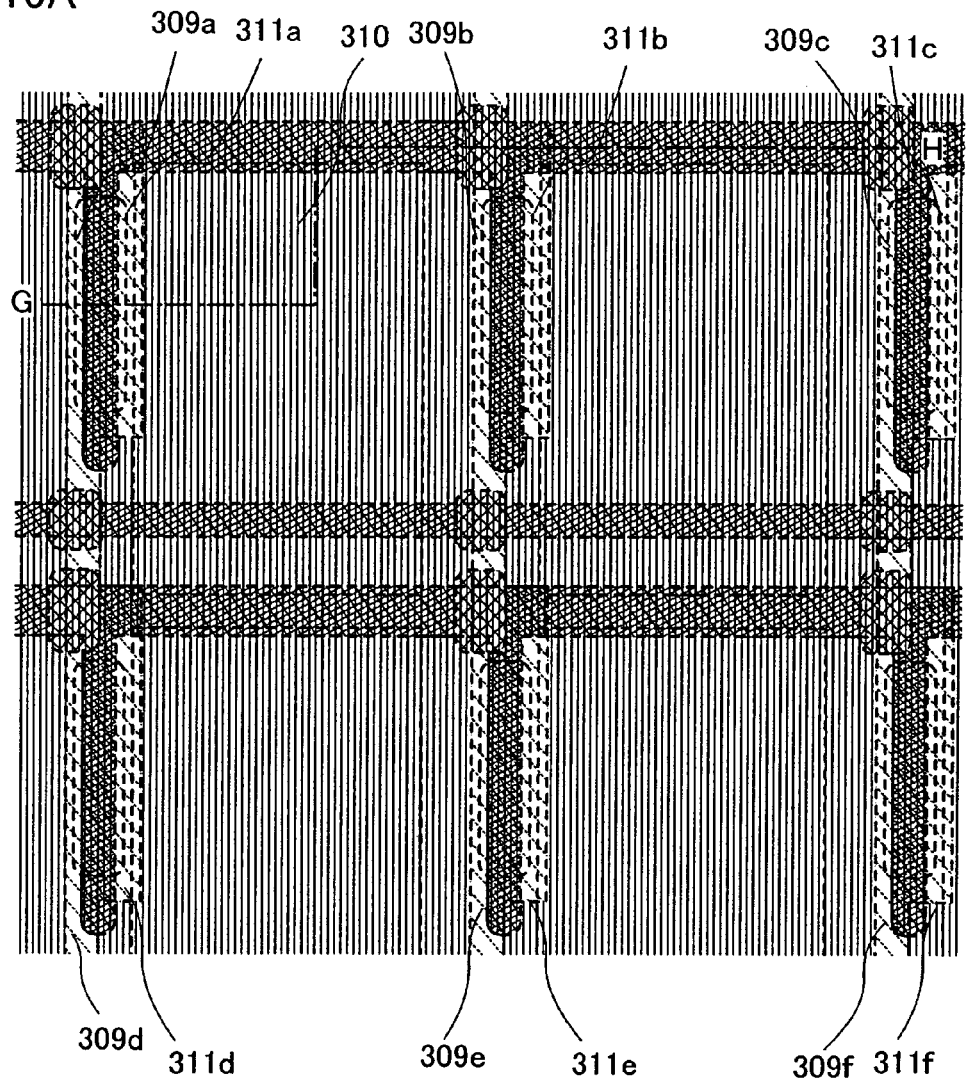
FIGS. 15(A) and 15(B) illustrate a method for manufacturing a display device according to the present invention.
Figure 15B:
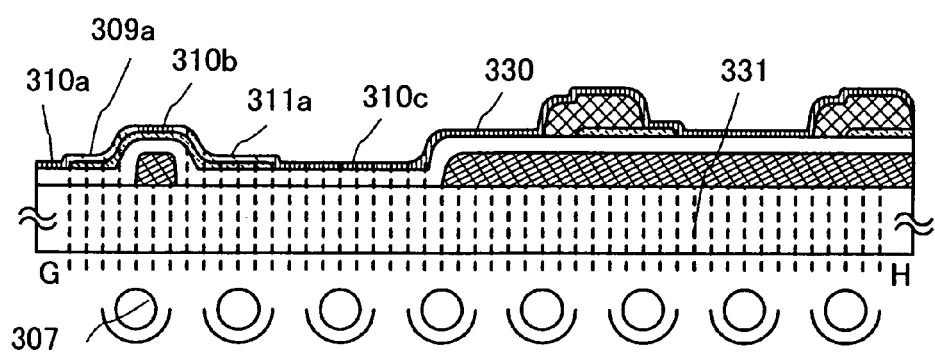
Figure 16A:
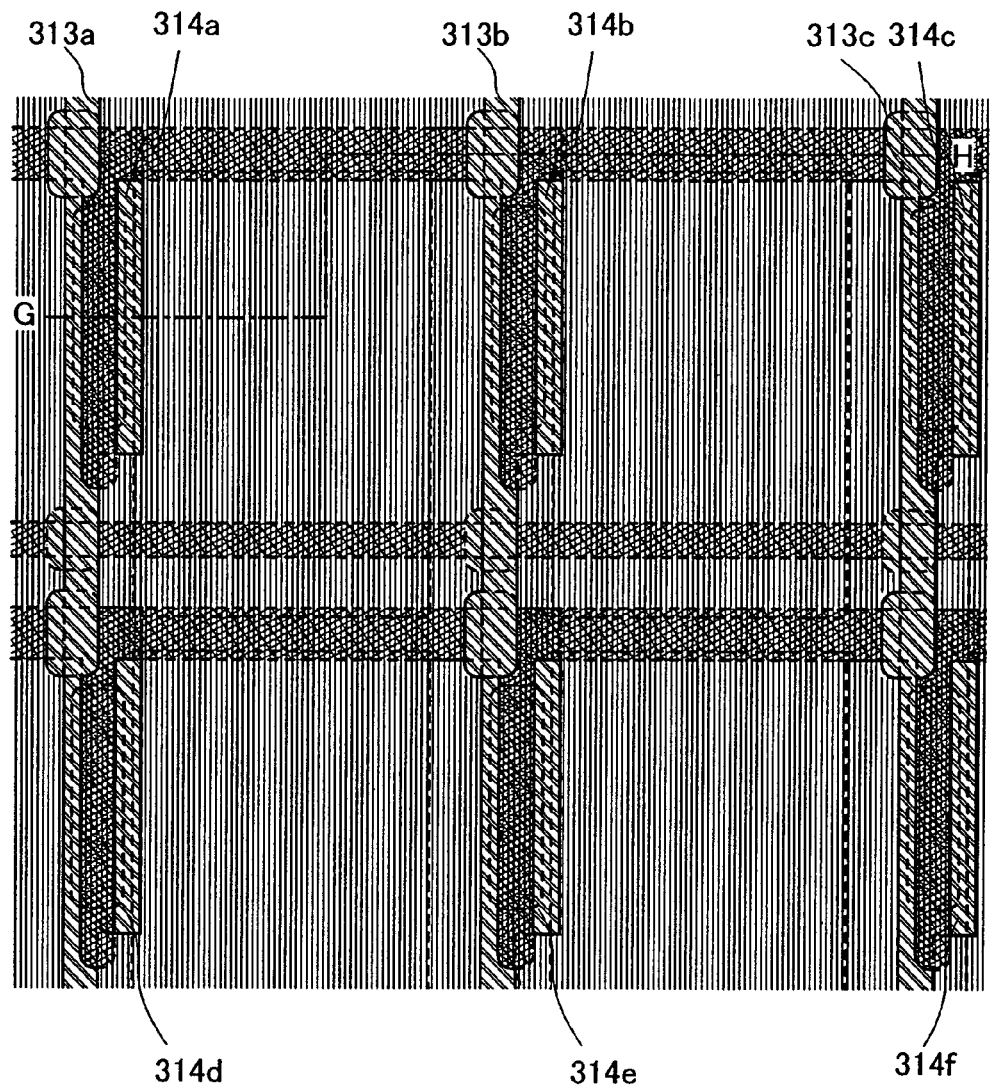
FIGS. 16(A) and 16(B) illustrate a method for manufacturing a display device according to the present invention.
Figure 16B:
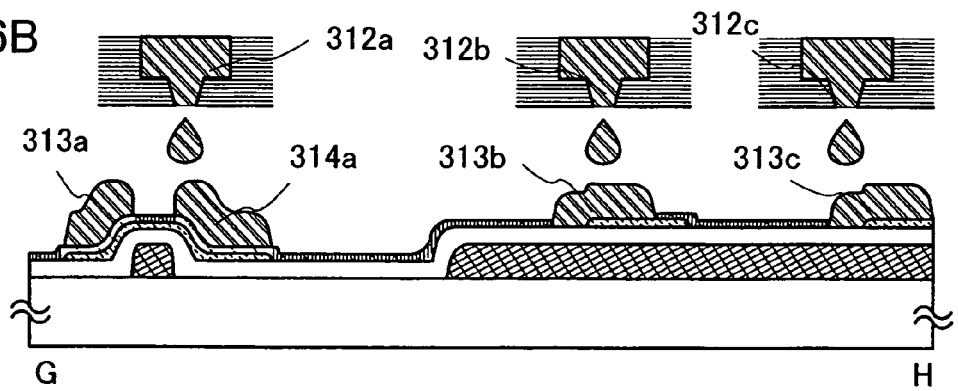

A mask layer 305a, a mask layer 305b, a mask layer 305c, a mask layer 305d, a mask layer 305e, a mask layer 305f, a mask layer 305g, a mask layer 305h, and a mask layer 305i are formed selectively on the photocatalytic substance 306a, the photocatalytic substance 306b, and the photocatalytic substance 306c, and the gate electrode layer 301 and the gate electrode layer 303, and the capacitor wiring layer 326 (see FIGS. 14(A) and 14(B)). The mask layer 305a, the mask layer 305b, the mask layer 305c, the mask layer 305d, the mask layer 305e, the mask layer 305f, the mask layer 305g, the mask layer 305h, and the mask layer 305i are formed selectively in regions where the gate electrode layers or capacitor wiring layer intersect with the source electrode layers or the drain electrode layers through the gate insulating layer 304. Since the display device of this embodiment mode has an active matrix structure, wherein gate lines and source lines intersect with each other through an insulating layer, the mask layers are arranged in such a manner. In this embodiment mode, the mask layer 305a, the mask layer 305b, the mask layer 305c, the mask layer 305d, the mask layer 305e, the mask layer 305f, the mask layer 305g, the mask layer 305h, and the mask layer 305i are formed by the droplet discharging method using the PVA. Polyimide or the like may also be used as the mask layers.

A low-wettability substance 330 is formed on the mask layers and the photocatalytic substances. In this embodiment mode, FAS is used as the low-wettability substance 330 and formed in a large region (the entire coating, or the like) by a spin coating method. The substance is wettable with respect to the composition containing a conductive material which later constitutes a source electrode layer or drain electrode layer. FAS used in this embodiment mode is decomposed with light having a wavelength of 200 nm or less; however, a glass substrate absorbs and does not transmit light with a wavelength of 300 nm or less. Therefore, it is difficult to irradiate FAS with light if a glass substrate is used as the substrate. In this embodiment mode, a titanium oxide layer exerting a photocatalytic effect when it is exposed to light of 380 nm or less, is formed. A metal halide lamp which is an ultraviolet lamp which emits light with a wavelength of 200 nm to 450 nm is used as a light source. The photocatalytic substance can be appropriately selected depending on the wavelength of the light to be used.

As a pretreatment for forming a source electrode layer or drain electrode layer with good controllability, the periphery of the source electrode layer or drain electrode layer forming region is modified to have different wettability from the region therearound. The wettability is selectively changed by irradiation treatment using a photoactivation ability of a photocatalytic substance to form a high-wettability region and a low-wettability region. The difference in wettability can be confirmed by the contact angle that is 30° or more, and preferably, 40° or more. In the present invention, a photocatalytic substance which is activated according to a wavelength of light to be applied is formed in contact with the object in order to enhance the efficiency of the light irradiation treatment.

The photocatalytic substance 306a, the photocatalytic substance 306b and the photocatalytic substance 306c are irradiated with light 331 through the light-transmitting substrate 300 by the light source 307. The low-wettability substance 330 is decomposed by the energy generated when the photocatalytic substance 306a, the photocatalytic substance 306b, and the photocatalytic substance 306c are activated by the light 331; thus, the wettability is improved. The low-wettability substance and the gate electrode layer 301 and the gate electrode layer 303, and the capacitor wiring layer 326 on the regions which the photocatalytic substances are not formed serve as masks. If the photocatalytic substance subsists, the surface of the low-wettability substance on the region which the photocatalytic substance is not irradiated with light is not modified. High-wettability region 309a, high-wettability region 309b, high-wettability region 309c, high-wettability region 309d, high-wettability region 309e, high-wettability region 309f, high-wettability region 311a, high-wettability region 311b, high-wettability region 311c, high-wettability region 311d, high-wettability region 311e, and high-wettability region 311f which are relatively more wettable, and a low-wettability region 310 that is relatively less wettable are formed on the surface of the low-wettability substance 330 by light irradiation and the utilizing the photoactivation ability (since the low-wettability region 310 is shown in the cross-sectional view in FIG. 15(B), the low-wettability region 310 is described to be separated as the low-wettability region 310a, the low-wettability region 310b, and the low-wettability region 310c) (see FIGS. 15(A) and 15(B)). The range of choices for light is increased since a photocatalytic substance can be selected in accordance with light. In addition, the modified region can be selected more precisely and freely by selectively forming the photocatalytic substance and by irradiating the region with light having a wavelength by which the photocatalytic substance is activated. As a result, the apparatuses and processes are simplified, and thus, costs and time are reduced, and the productivity can be improved.

The low-wettability substances which is formed on the mask layer 305a, the mask layer 305b, the mask layer 305c, the mask layer 305d, the mask layer 305e, the mask layer 305f, the mask layer 305g, the mask layer 305h, and the mask layer 305i are removed after the control of the wettability is performed by light irradiation. In this embodiment mode, the mask layer 305a, the mask layer 305b, the mask layer 305c, the mask layer 305d, the mask layer 305e, the mask layer 305f, the mask layer 305g, the mask layer 305h, and the mask layer 305i are removed by washing with water. Since the low-wettability substance is not formed in the regions which are provided with the mask layer 305a, the mask layer 305b, the mask layer 305c, the mask layer 305d, the mask layer 305e, the mask layer 305f, the mask layer 305g, the mask layer 305h, and the mask layer 305i, the regions with these mask layers have relatively higher wettability than the region having low-wettability on which the substance having the low-wettability is formed, as well as a region of which wettability is improved by light irradiation.

A composition containing a conductive material is discharged from droplet discharge device 312a, a droplet discharge device 312b and a droplet discharge device 312c to a high-wettability region 309a, a high-wettability region 309b, a high-wettability region 309c, a high-wettability region 309d, a high-wettability region 309e, a high-wettability region 309f, a high-wettability region 311a, a high-wettability region 311b, a high-wettability region 311c, a high-wettability region 311d, a high-wettability region 311e, and a high-wettability region 311f. Thus, a source electrode layer or drain electrode layer 313a, a source electrode layer or drain electrode layer 313b, a source electrode layer or drain electrode layer 313c, a source electrode layer or drain electrode layer 314a, a source electrode layer or drain electrode layer 314b, a source electrode layer or drain electrode layer 314c, a source electrode layer or drain electrode layer 314d, a source electrode layer or drain electrode layer 314e, and a source electrode layer or drain electrode layer 314f are formed (see FIGS. 16(A) and 16(B)). In this embodiment mode, Ag is used as a conductive material. Even when the pattern forming material cannot be discharged precisely depending on the size of the discharge port of the nozzle from which the droplet is discharged or the moving ability of the discharge port, the droplet is attached only to a region to form a desired pattern by performing treatment for enhancing wettability on the pattern formation region. This is because the pattern formation region and the periphery thereof have different wettability;

therefore, the droplet is repelled only in the low-wettability region and remains on the pattern formation region having higher wettability. In other words, a droplet is repelled by the low-wettability region; therefore, the boundary between the high-wettability region and the low-wettability region functions as a partition wall (a bank). Accordingly, even the composition containing a conductive material having fluidity can remain on the high-wettability region; thus, each source electrode layer or drain electrode layer can be formed to have a desired shape. The source electrode layer or drain electrode layer 313a, the source electrode layer or drain electrode layer 313b, and the source electrode layer or drain electrode layer 313c also function as source wiring layers.

According to the present invention, when a microscopic pattern of, for example, an electrode layer, or the like is formed, a droplet does not spread over a formation region even when a discharge port of the droplet is somewhat large, therefore, a conductive layer can be formed only in the formation region, and defects such as a short-circuit caused by the formation in a region other than the formation region can be prevented. Additionally, film thickness of the wiring can be controlled. As in this embodiment mode, when the surface of the substance is modified by light irradiation from the side of a substrate, a large region can be treated in addition to forming a pattern with good controllability; thus, production efficiency is improved. By combining a droplet discharging method, the material loss can be avoided compared with entire surface application formation by a spin coating method or the like; therefore, the cost can be reduced. According to the present invention, a pattern can be formed with good controllability even in the case where a wiring or the like is provided integrally and intricately due to miniaturization and thinner film formation.

In this embodiment mode, the low-wettability region is irradiated with light to decompose the low-wettability substance, and the treatment for improving the wettability is carried out. After that, the semiconductor layer 315a, the semiconductor layer 315b, the semiconductor layer 315c, the semiconductor layer 315d, the semiconductor layer 315e, and the semiconductor layer 315f are formed by a droplet discharging method using pentacene and an inverted coplanar type thin film transistor is formed.

Figure 17A:
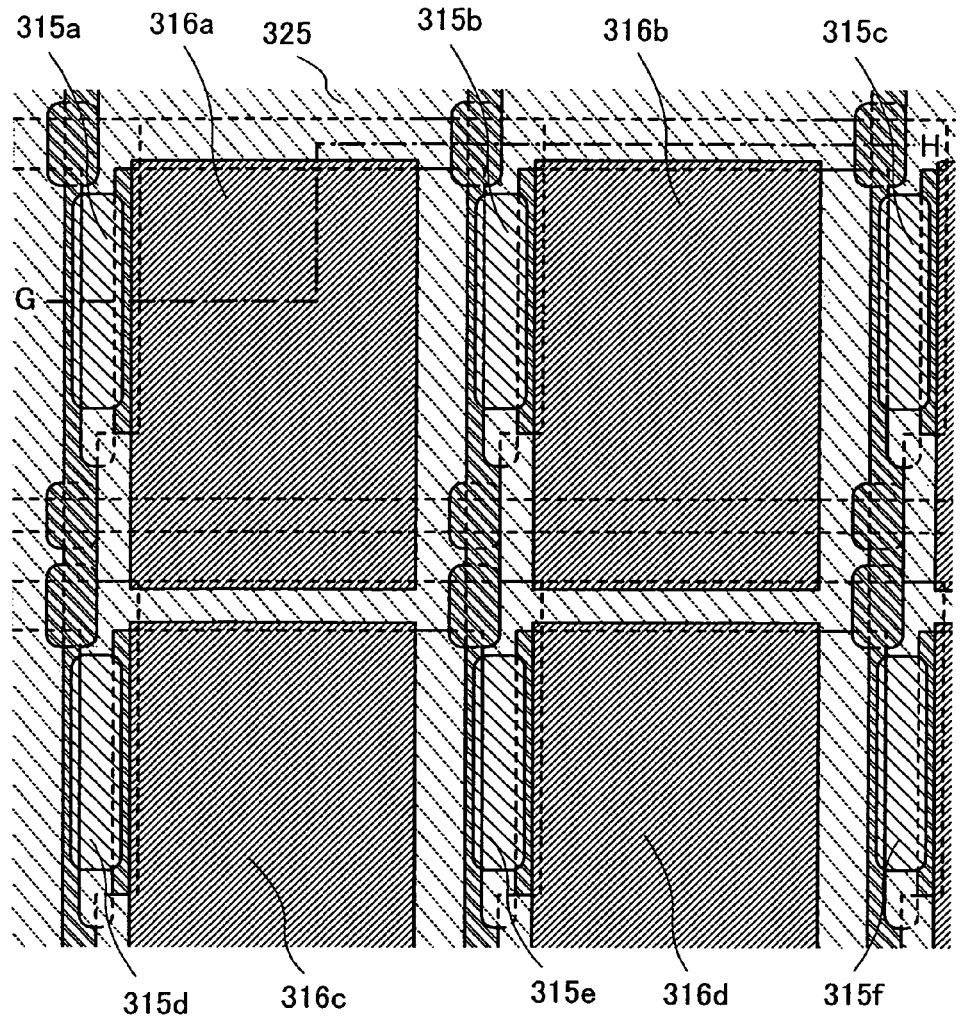
FIGS. 17(A) and 17(B) illustrate a method for manufacturing a display device according to the present invention.
Figure 17B:
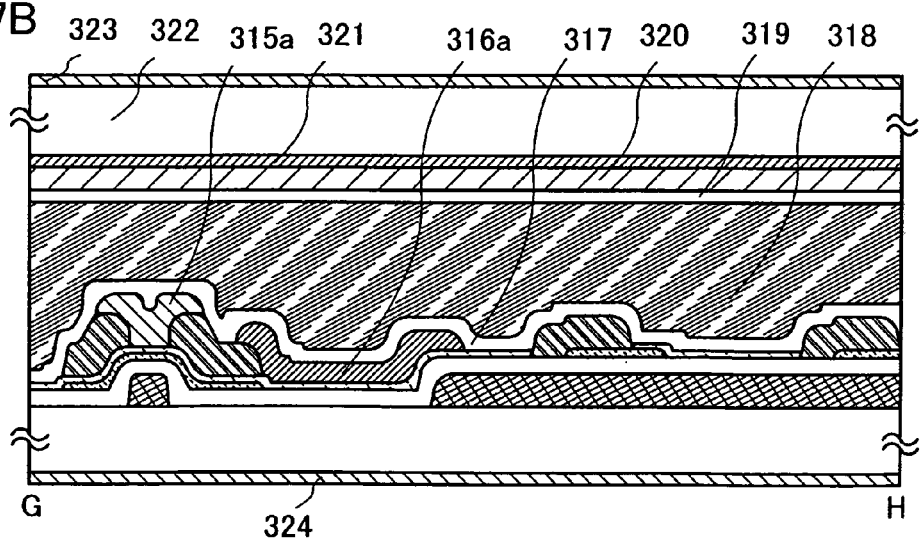

Subsequently, a composition containing a conductive material is selectively discharged in contact with the source electrode layer or drain electrode layer 314a, the source electrode layer or drain electrode layer 314b, the source electrode layer or drain electrode layer 314c, the source electrode layer or drain electrode layer 314d, the source electrode layer or drain electrode layer 314e, and the source electrode layer or drain electrode layer 314f to form a pixel electrode layer 316a, a pixel electrode layer 316b, a pixel electrode layer 316c, and a pixel electrode layer 316d (see FIGS. 17(A) and 17(B)). When forming this pixel electrode layer 316a, pixel electrode layer 316b, pixel electrode layer, 316c, and pixel electrode layer 316d, a pretreatment of forming the low-wettability region and the high-wettability region may be carried out. By discharging the composition containing the conductive material in the high-wettability region, the pixel electrode layer 316a, the pixel electrode layer 316b, the pixel electrode layer 316c, and the pixel electrode layer 316d can also be selectively formed with good controllability. The pixel electrode 316a, the pixel electrode 316b, the pixel electrode 316c, and the pixel electrode 316d can use the same material as the first electrode 119 which is mentioned above. In the case of manufacturing a transmissive liquid crystal display panel, the pixel electrode layers may be formed by using a composition containing indium tin oxide (ITO), indium tin oxide including silicon oxide (ITSO), zinc oxide (ZnO), tin oxide (SnO$_2$) or the like to have a predetermined pattern, and then baking the composition. Naturally, the material may also be formed by an evaporation method (a PVD method and a CVD method), and a sputtering method and the like. In this embodiment mode, indium tin oxide (ITO) is used as the pixel electrode layer 316a, the pixel electrode layer 316b, the pixel electrode layer 316c, and the pixel electrode layer 316d.

Next, an insulating layer 317, which is referred to as an orientation film, is formed by the printing method or the spin coating method so as to cover the pixel electrode layer 316a, the pixel electrode layer 316b, the pixel electrode layer 316c, and the pixel electrode layer 316d and the thin film transistor. This insulating layer 317 can be selectively formed by the mimeograph method or the offset printing method. Thereafter, a rubbing treatment is carried out. Subsequently, a sealing material is formed in a peripheral region of a pixel by the droplet discharging method.

Thereafter, a counter substrate 322 over, which an insulating layer 319 functioning as an orientation film, a colored layer 321 functioning as a color filter, a conductive layer 320 functioning as a counter electrode and a polarizing plate 323 are provided is attached to the substrate 300 while sandwiching a spacer therebetween. A liquid crystal layer 318 is provided in a gap between the counter substrate 322 and the substrate 300 so as to achieve a liquid crystal display panel (see FIG. 17(B)). A polarizing plate may also be provided on the other side of the substrate 300 on which the TFT is not provided. The sealing material may contain a filler. In addition, a light shielding film (black matrix) and the like may be formed on the counter substrate 324. Further, the liquid crystal layer can be formed by using a dispenser (a dropping method), or a dipping method in which a liquid crystal is injected between the attached substrate 300 having an element and the counter substrate 322 by utilizing capillary phenomenon, and the like.

In order to connect the inside display device manufactured in the above process to an external wiring substrate, a connection portion is formed. An insulating layer in the connection portion is removed by ashing using oxygen gas under atmospheric pressure or almost atmospheric pressure. The ashing treatment uses oxygen gas together with one or more of hydrogen, $CF_4$, $NF_3$, $H_2O$ and $CHF_3$. In this process, the ashing treatment is performed after sealing the liquid crystal with the counter substrate so as to prevent damage or breakage due to electrostatic. In the case of having a less possibility of adverse effect due to electrostatic, however, the ashing treatment can be carried out at any time.

Subsequently, a terminal electrode layer which is electrically connected to the pixel portion and an FPC, which is a connection wiring substrate, is provided through an anisotropic conductive layer. The FPC serves to transmit a signal or an electric potential from the outside. According to the above mentioned process, a liquid crystal display panel having a display function can be formed.

Although a switching TFT having a single gate structure is shown in this embodiment mode, a double gate structure may also be used and more plurality of multi-gate structures may also be used. When a semiconductor is formed by using an SAS or a crystalline semiconductor, an impurity region can be formed by adding an impurity that imparts one conductivity type. In this case, the semiconductor layer may have impurity regions having different concentrations. For example, a region laminated with a gate electrode layer in the vicinity of a channel region of a semiconductor layer may be a low concentration impurity region while a region outside of the low concentration impurity region may be a high concentration impurity region.

As set forth above, the process can be simplified according to this embodiment mode. Also, by forming various kinds of formations (parts) over a substrate using the droplet discharging method, a display panel can be manufactured easily using a glass substrate of the fifth generation or later having 1,000 mm or more on a side.

According to the present invention, components having desired patterns of a display device can be easily formed with good controllability. Moreover, loss of materials can be suppressed, thereby reducing the cost. As a consequence, a high performance display device having a high reliability can be manufactured with good yield.

Embodiment Mode 4

A thin film transistor can be formed according to the present invention, and a display device can be fabricated using the thin film transistor. When a light emitting element and an N-type transistor for driving the light emitting element are used, light generated from the light emitting element emits downward, upward, or both downward and upward. In the present embodiment mode, laminated structures of a light emitting element will be described according to each type of light emission with reference to FIGS. 21(A) to 21(C).

Further, in this embodiment mode, channel protective thin film transistors 461, 471, and 481 according to the present invention are used. The thin film transistor 481 is provided over a substrate 480 having a light-transmitting property and includes a gate electrode layer 493, a gate insulating layer 497a, a gate insulating layer 497b, and a gate insulating layer 497c, a semiconductor layer 494, a semiconductor layer 495 having an N-type, a source electrode layer or drain electrode layer 487, and a channel protective layer 496. In this embodiment mode, a crystalline semiconductor layer is used as the semiconductor layer, and an N-type semiconductor layer is used as a semiconductor layer of one conductivity type. Instead of forming a semiconductor layer having an N-type, a semiconductor may be given with conductivity by plasma treatment using $PH_3$ gas. The semiconductor layer is not limited to this embodiment mode, and an amorphous semiconductor layer may be used as shown in Embodiment Mode 1. As this embodiment mode, in the case of using a crystalline semiconductor layer of, polysilicon or the like, an impurity region having one conductivity type may be formed by introducing (adding) impurities into the crystalline semiconductor layer without forming the one conductivity type semiconductor layer. Further, an organic semiconductor such as pentacene can be used. For example, when an organic semiconductor is selectively formed by a droplet discharging method, the patterning process can be simplified.

In this embodiment mode, the amorphous semiconductor layer is crystallized as the semiconductor layer 494 and the crystalline semiconductor layer is formed. In a crystallization process, the amorphous semiconductor layer is crystallized by being added with an element which promotes crystallization (also referred to as a catalytic element or a metallic element), a the crystallization is performed by the heat treatment (550° C. to 650° C. for 5 minutes to 24 hours). As the element for promoting crystallization, metal elements for promoting crystallization of silicon can be employed, such as one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au), in this embodiment mode, nickel is used.

Since the element that promotes crystallization is removed or reduced from the crystalline semiconductor layer, a semiconductor layer containing an impurity element is formed in contact with the crystalline semiconductor layer and performed as a gettering sink. The impurity elements may be N-type impurity elements, P-type impurity elements or rare gas elements such as one or more of phosphorus (P), nitrogen (N), arsenic (As), antimony (Sb), bismuth (Bi), boron (B), helium (He), neon (Ne), argon (Ar), Kr (Krypton), and Xe (Xenon). In this embodiment mode, as the semiconductor layer containing the impurity element that functions as the gettering sink, a semiconductor layer having the N-type, which contains phosphorus (P) that is an impurity element for imparting the N-type, is formed. The semiconductor layer having the N-type is formed on the crystalline semiconductor layer containing the element that promotes crystallization, and the heat treatment is performed (550° C. to 650° C. for 5 minutes to 24 hours). The element that promotes crystallization which is contained in the crystalline semiconductor layer moves in the semiconductor layer having the N-type. And the element that promotes crystallization in the crystalline semiconductor layer is removed or decreased, as a result, the semiconductor layer 494 is formed. Meanwhile, the semiconductor layer having the N-type is the semiconductor layer 495 having the N-type and containing the metallic element which is the element that promotes crystallization. As above mentioned, the semiconductor layer 495 having the N-type also functions as the gettering sink of the semiconductor layer 494 and as the source region or drain region.

In this embodiment mode, the crystallization process and the gettering process of the semiconductor layer are performed by multiple heat treatments. However, the crystallization process and the gettering process of the semiconductor layer can also be performed by the heat treatment at one time. In this case, the heat treatment may be performed after forming the amorphous semiconductor layer, and adding the element that promotes crystallization, and forming the semiconductor layer which becomes the gettering sink.

In this embodiment mode, after the gate insulating layer is formed by laminating plural layers and laminating a silicon nitride oxide film as the gate insulating film 497a and a silicon oxynitride film as a gate insulating film 497b together, a silicon nitride film or a silicon nitride oxide film with a thickness of 0.3 to 5 nm is formed as the gate insulating film 497c on the silicon oxynitride film to form the insulating layer having three-layer structure. According to this structure, an effect of gettering the metal element included in the semiconductor layer can be improved, reducing the adverse effect of the silicon nitride film with respect to the semiconductor layer. The insulating layer is preferably formed by successively laminating the layers at a same temperature in a same chamber by changing reaction gases while maintaining a vacuum state. When the films are successively laminated while maintaining the vacuum state, interfaces between the laminated films can be prevented from being contaminated.

A photocatalytic substance 499 and a low-wettability substance 490 are formed over the channel protective layer 496 and the semiconductor layer 495 having an N-type. In this embodiment mode, the photocatalytic substance 499 is irradiated with light from the substrate side having light-transmitting properties to activate the photocatalytic substance 499 and to modify the surface of the low-wettability substance 490 including a light-absorbing material which is not shielded by the gate electrode layer 493. The light having a wavelength by which the photocatalytic substance is activated is irradiated as the light. The modification capacity by light irradiation is enhanced by the energy due to the activation of the photocatalytic substance. The light having a wavelength except for the one which is absorbed by the substrate having the light-transmitting property can be selected since the range of choices for a wavelength of irradiation light is widened by selecting a photocatalytic substance.

In this embodiment mode, a surface of the low-wettability substance 490 that is less wettable with a composition containing a conductive material, except where the gate electrode layer 493 is overlapped with the channel protective film 496 to be a mask, is modified to be more wettable, by light irradiation. Consequently, high-wettability regions 492a and 492b that are relatively more wettable, and a low-wettability region 491 that is relatively less wettable is formed over a surface of the low-wettability substance 490. The composition containing a conductive material does not fix to the low-wettability region 491 on the surface of the channel protective layer since it is less wettable than the high-wettability region 492a and the high-wettability region 492b on the surface of the N-type semiconductor on the periphery of the low-wettability region 491. Consequently, the source electrode layer or drain electrode layer 487' is formed over the high-wettability region 492a and the high-wettability region 492b, which are more wettable, with good controllability. Since the low-wettability substance used in this embodiment mode is FAS that is extremely thin as a molecular level, the N-type semiconductor layer and the electrode layers are not insulated. The low-wettability substance can be made conductive or insulative by selecting the material and/or the thickness in according with the structure to be used.

Figure 21A:
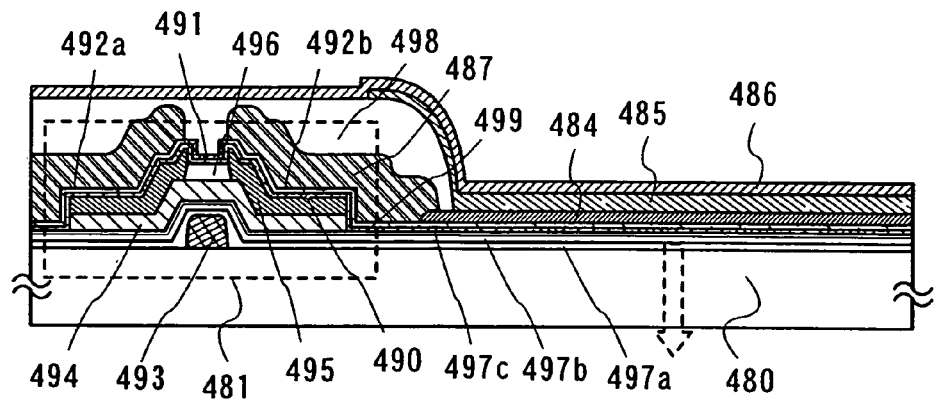
FIGS. 21(A) to 21(C) are cross-sectional views of a display device according to the present invention.

As to the thin film transistor 481, a substance that is less wettable with the composition containing a conductive material is formed over the channel protective layer. When the substance has low-wettability also with an insulating layer 498 formed to cover the thin film transistor 481, formation defects such as that the adhesion of the insulating layer 498 is reduced would be caused. Therefore, it is preferable to remove the low-wettability substance or to modify the substance to improve the wettability by light irradiation. Such a treatment is not necessarily carried out in the case where the insulating layer is formed by the evaporation method, the CVD method, the sputtering method, or the like. The insulating layer 498 covering the thin film transistor 481 shown in FIG. 21(A) is formed by the evaporation method, which is an example where the low-wettability substance over the channel protective layer is not modified. FIG. 21(C) shows an example in which the low-wettability region 491 is irradiated with light to improve the wettability before forming the insulating layer 498 since the insulating layer 478 covering the thin film transistor 471 is formed by the droplet discharging method.

The channel protective layer 496 may be formed by a droplet discharging method using polyimide, polyvinyl alcohol or the like. As a result, a light exposure process can be omitted. The channel protective layer may be formed of one or more of an inorganic material (silicon oxide, silicon nitride, silicon oxynitride, silicon nitride oxide or the like), a photosensitive or non-photosensitive organic material (an organic resin material) (polyimide, acrylic, polyamide, polyimide amide, benzocyclobutene or the like), a film including one or plural kinds of low dielectric constants and the like or a laminated layer of such films or the like. In addition, a material having siloxane may also be used. As a manufacturing method, a vapor phase growth method such as a plasma CVD method or a thermal CVD method, or a sputtering method can be used. A droplet discharging method or a printing method (a method for forming a pattern, such as mimeograph or offset printing) can also be used. A film obtained by a coating method can also be used.

First, the case where light is emitted toward the substrate 480 side, in other words, bottom emission is performed, will be described with reference to FIG. 21(A). In this case, a first electrode 484, an electroluminescent layer 485, and a second electrode 486 are sequentially laminated, in contact with a source electrode layer or drain electrode layer 487 so as to be electrically connected to the thin film transistor 481. The substrate 480 through which light passes needs to have a light-transmitting property at least with respect to light of a visible region. Next, the case where light is emitted to the side opposite to a substrate 460, in other words, top emission is performed, will be described with reference to FIG. 21(B). The thin film transistor 461 can be formed in a similar manner to the above mentioned thin film transistor.

A source electrode layer or drain electrode layer 462 that is electrically connected to the thin film transistor 461 is in contact with a first electrode layer 463 to be electrically connected to each other. The first electrode layer 463, an electroluminescent layer 464 and a second electrode layer 465 are sequentially laminated. The source electrode layer or drain electrode layer 462 is a metal layer having reflexivity, and reflects light, which is emitted from the light emitting element, upward as denoted by an arrow. The source electrode layer or drain electrode layer 462 has a structure in which the first electrode layer 463 is laminated thereover, and therefore, when the first electrode layer 463 is formed using a material with a light-transmitting property and transmits light therethrough, the light is reflected by the source electrode layer or drain electrode layer 462 and then is emitted in the direction opposite to the substrate 460 side. Needless to say, the first electrode layer 463 may be formed using a metal film having reflexivity. Since light generated in the light emitting element is emitted through the second electrode layer 465, the second electrode layer 465 is formed using a material having a light-transmitting property at least in a visible region. Lastly, a case where light is emitted through both the substrate 470 and an opposite side, i.e., emitted both upward and downward (dual emission), is described with reference to FIG. 21(C). A thin film transistor 471 is also a channel protective type thin film transistor. A source or drain electrode layer 477 that is electrically connected to a semiconductor layer of the thin film transistor 471 is electrically connected to a first electrode layer 472. The first electrode layer 472, an electroluminescent layer 473 and a second electrode layer 474 are sequentially laminated. When the first electrode layer 472 and the second electrode layer 474 are both formed using a material having a light-transmitting property at least in a visible region or are both formed to have thicknesses that can transmit light, the dual emission is realized. In this case, an insulating layer which transmits light and the substrate 470 are also formed to have light-transmitting properties to light in the visible region.

Modes of a light emitting element which is applicable to this embodiment mode are shown in FIGS. 22(A) to 22(D). The light emitting element has a structure in which an electroluminescent layer 860 is interposed between a first electrode layer 870 and a second electrode layer 850. The materials of the first electrode layer and the second electrode layer are required to be selected considering the work functions. The first electrode layer and the second electrode layer can be either an anode or a cathode depending on the pixel structure. In this embodiment mode, a driving TFT has N-channel polarity, so that it is preferable that the first electrode layer serves as a cathode and the second electrode layer serves as an anode. In the case where the driving TFT has P-channel polarity, the first electrode layer may be used as an anode and the second electrode layer may serve as a cathode.

Figure 22A:
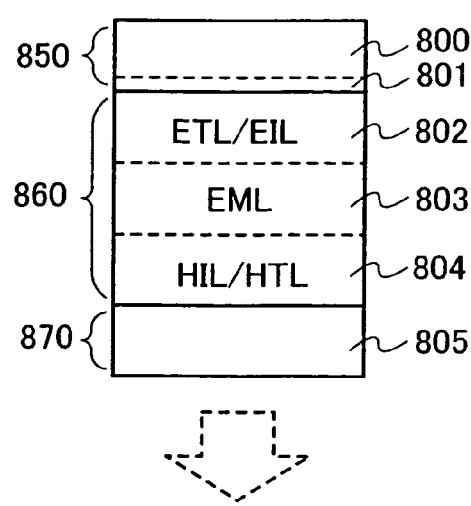
FIGS. 22(A) to 22(D) are views describing a structure of a light emitting element which can be applied to the present invention.
Figure 22B:
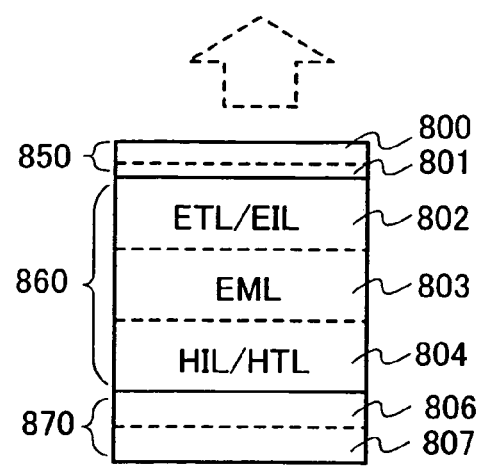

FIGS. 22(A) and 22(B) show the case where the first electrode layer 870 is an anode and the second electrode layer 850 is a cathode. The electroluminescent layer 860 preferably has a structure in which an HIL (hole, injection layer) and HTL (hole transport layer) 804, EML (light emitting layer) 803, ETL (electron transport layer) and EIL (electron injection layer) 802, and a second electrode layer 850 are laminated in order from the side of the first electrode layer 870. FIG. 22(A) shows a structure in which light is emitted from the first electrode layer 870 which includes an electrode layer 805 having a light-transmitting conductive oxide material, and the second electrode layer has a structure including an electrode layer 801 containing an alkali metal or an alkaline earth metal such as LiF or MgAg, and an electrode layer 800 formed of a metal material such as aluminum are formed from the side of the electroluminescent layer 860. FIG. 22(B) shows a structure in which light is emitted from the second electrode layer 850, and the first electrode layer includes an electrode layer 807 formed of a metal such as aluminum or titanium, or a metal material containing such the metal and nitrogen of concentration in stoichiometric proportion or less, and a second electrode layer 806 formed of a conductive oxide material containing silicon oxide in a concentration of 1 to 15 atomic %. The second electrode layer includes the electrode layer 801 containing an alkali metal or an alkaline earth metal such as LiF or MgAg and the electrode layer 800 formed of a metal material such as aluminum from the side of the electroluminescent layer 860; each layer is formed to a thickness of 100 nm or less to transmit light; thus, the light can be emitted from the second electrode layer 850.

Figure 22C:
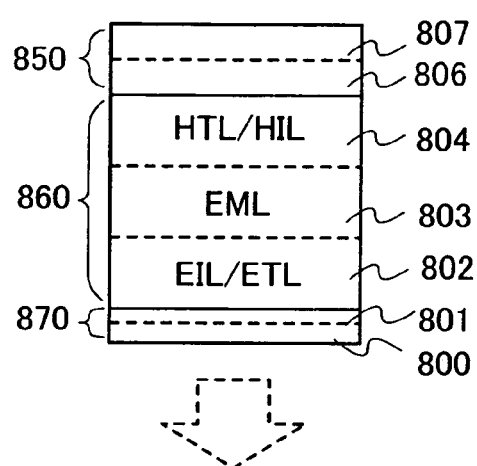
Figure 22D:
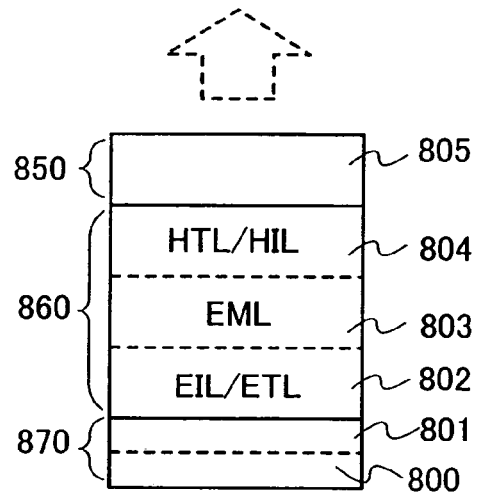

FIGS. 22(C) and 22(D) show the case where the first electrode layer 870 is a cathode and the second electrode layer 850 is an anode. The electroluminescent layer 860 preferably has a structure in which an EIL (electron injection layer), an ETL (electron transport layer) 802, an, EML (light emitting layer) 803, an HTL (hole transport layer) and HIL (hole injection layer) 804, and the second electrode layer 850 which is an anode are laminated in order from the cathode side. FIG. 22(C) shows a structure in which light is emitted from the first electrode layer 870. The first electrode layer 870 includes an electrode layer 801 containing an alkali metal or an alkaline earth metal such as LiF or MgAg and an electrode layer 800 formed of a metal material such as aluminum from the side of the electroluminescent layer 860; each layer is formed to have a thickness of 100 nm or less to transmit light; thus, the light can be emitted through the first electrode layer 870. The second electrode layer includes the second electrode layer 806 formed of a conductive oxide material containing silicon oxide in a concentration of 1 to 15 atomic % and an electrode layer 807 formed of a metal such as aluminum or titanium, or a metal material containing such a metal and nitrogen at a concentration in stoichiometric proportion or less, from the side of the electroluminescent layer 860. FIG. 22(D) shows a structure in which light is emitted from the second electrode layer 850. The first electrode layer 870 includes an electrode layer 801 containing an alkali metal or an alkaline earth metal such as LiF or MgAg and an electrode layer 800 formed of a metal material such as aluminum from the side of the electroluminescent layer 860; the thickness is enough thick to reflect light emitted from the electroluminescent layer 860. The second electrode layer 850 includes an electrode layer 805 made of a light-transmitting conductive oxide material having a property of transmitting at least light in a visible region. The electroluminescent layer may have a single layer structure or a mixed structure other than a laminated structure.

As the electroluminescent layer, materials which each indicates luminescence of red (R), green (G), and blue (B) are selectively formed by an evaporation method using an evaporation mask, or the like. The materials (low molecular weight materials, high molecular weight materials or the like) which each indicates luminescence of red (R), green (G), and blue (B) can be formed by a droplet discharging method in the same manner as a color filter. This case is preferable since RGB can be separately formed without using a mask.

In the case of the top emission type, when ITO or ITSO having light-transmitting properties are used for the second electrode layer, BzOs—Li in which Li is added to benzoxazole derivatives (BzOs), or the like can be used. For example, $Alq_3$ doped with a dopant corresponding to respective luminescent colors of R, G, and B (DCM or the like in the case of R, and DMQD or the like in the case of G) may be used as the EML.

Note that the electroluminescent layer is not limited to the above mentioned material. For example, hole injectability can be enhanced by co-evaporating an oxide such as molybdenum oxide ($MoO_x$: x=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer. A material for forming a light emitting element is described in detail hereinafter.

As a substance having high electron transportability among charge injection-transport substances, for example, a metal complex having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq), can be given. As a substance having high hole transportability, for example, an aromatic amine based compound (in other words, a compound having a bond of benzene ring-nitrogen) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), or 4,4',4"-tris[N-(3-methylphenyl)-N-phenyl-amino]-triphenylamine (abbreviation: MTDATA) can be given.

As a substance having high electron injectability among charge injection-transport substances, a compound of an alkali metal or an alkaline earth metal such as lithium fluoride (LiF), cesium fluoride (CsF), or calcium fluoride ($CaF_2$) can be given. In addition to this, it may be a mixture of a substance having high electron transportability such as $Alq_3$ and an alkaline earth metal such as magnesium (Mg).

As a substance having high hole injectability among charge injection transport substances, for example, a metal oxide such as molybdenum oxide ($MoO_x$), vanadium oxide ($VO_x$), ruthenium oxide ($RuO_x$), tungsten oxide ($WO_x$), manganese oxide ($MnO_x$) are given. In addition to this, a phthalocyanine compound such as phthalocyanine (abbreviation: $H_2Pc$) or copper phthalocyanine (CuPc) can be given.

The light emitting layer may have a structure to perform color display by providing each pixel with a light emitting layer having a different emission wavelength region. Typically, a light emitting layer corresponding to each color of R (red), G (green), and B (blue) is formed. In this case, color purity can be improved and a pixel portion can be prevented from having a mirror surface (reflection), by providing the light emitting side of the pixel with a filter which transmits light of the emission wavelength region. By providing a filter, a circular polarizing light plate or the like that is conventionally required can be omitted, and further, the loss of light emitted from the light emitting layer can be eliminated. Further, change in hue, which occurs when a pixel portion (display screen) is obliquely seen, can be reduced.

Various materials can be used for a light emitting material. As a low molecular weight organic light emitting material, 4-dicyanomethylene-2-methyl-6-[2-(1,1,7,7-tetramethyl-9-julolidyl)ethenyl]-4H-pyran, (abbreviation: DCJT); 4-dicyanomethylene-2-t-butyl-6-[2-(1,1,7,7-tetramethyljulolidine-9-yl)-ethenyl]-4H-pyran, (abbreviation: DCJTB); periflanthene; 2,5-dicyano-1,4-bis[2-(10-methoxy-1,1,7,7-tetramethyljulolidine-9-yl)ethenyl]benzene; N,N'-dimethylquinacridon (abbreviation: DMQd); coumarin $^6$; coumarin 545T; tris(8-quinolinolato)aluminum (abbreviation: $Alq_3$); 9,9'-bianthryl; 9,10-diphenylanthracene (abbreviation: DPA); 9,10-bis(2-naphthyl)anthracene (abbreviation: DNA); and the like can be used. Another substance can also be used.

On the other hand, a high molecular weight organic light emitting material is physically stronger than a low molecular weight material and is superior in durability of the element. In addition, a high molecular weight organic light emitting material can be formed by coating, and therefore, the element can be relatively easily manufactured. The structure of a light emitting element using a high molecular weight organic light emitting material has basically the same structure as in the case of that using a low molecular weight organic light emitting material, that is, a cathode, an organic light emitting layer, and an anode are laminated in order. However, a two-layer structure is employed in many cases, when a light emitting layer using a high molecular weight organic light emitting material is formed. This is because it is difficult to form such a laminated structure as in the case of using a low molecular weight organic light emitting material. Specifically, it is, a structure of a cathode, a light emitting layer, a hole transport layer, and an anode in order.

An emission color is determined depending on a material forming a light emitting layer; therefore, a light emitting element which indicates desired luminescence can be formed by selecting these materials. As a high molecular weight electroluminescent material which can be used for forming a light emitting layer, a polyparaphenylene-vinylene-based material, a polyparaphenylene-based material, a polythiophene-based material, a polyfluorene-based material can be given.

As the polyparaphenylene vinylene-based material, a derivative of poly(paraphenylenevinylene) [PPV]; poly(2,5-dialkoxy-1,4-phenylenevinylene) [RO-PPV]; poly(2-(2'-ethyl-hexoxy)-5-methoxy-1,4-phenylenevinylene) [MEH-PPV]; poly(2-(dialkoxyphenyl)-1,4-phenylenevinylene) [ROPh-PPV]; and the like can be given. As the polyparaphenylene-based material, a derivative of polyparaphenylene [PPP], for example, poly(2,5-dialkoxy-1,4-phenylene) [RO-PPP]; poly(2,5-dihexoxy-1,4-phenylene); and the like can be given. As the polythiophene-based material, a derivative of a derivative of polythiophene [PT], for example, poly(3-alkylthiophene) [PAT]; poly(3-hexylthiophen)-[PHT]; poly(3-cyclohexylthiophen) [PCHT]; poly(3-cyclohexyl-4-methylthiophene) [PCHMT]; poly(3,4-dicyclohexylthiophene) [PDCHT]; poly[3-(4-octylphenyl)-thiophene] [POPT]; poly [3-(4-octylphenyl)-2,2-bithiophene] [PTOPT]; and the like can be given. As the polyfluorene-based material, a derivative of polyfluorene [PF]; poly(9,9-dialkylfluorene) [PDAF]; poly (9,9-dioctylfluorene) [PDOF]; and the like can be given.

When a high molecular weight organic light emitting material having hole transportability is interposed between an anode and a high molecular weight organic light emitting material having a light emitting property, hole injectability from the anode can be enhanced. Generally, a material which is dissolved in water along with an acceptor material is applied by a spin coating method or the like. In addition, it is insoluble in an organic solvent; therefore, it can be laminated with the above mentioned high molecular weight organic light emitting material having a light emitting property. As the high molecular weight organic light emitting material having hole transportability, a mixture of PEDOT and camphor sulfonic acid (CSA) that serves as an acceptor material, a mixture of polyaniline [PANI] and polystyrene sulfonic acid [PSS] that serves as an acceptor material, and the like can be given.

The light emitting layer can be made to emit monochrome color or white light. When a white light emitting material is used, color display can be made possible by applying a structure in which a filter (a coloring layer) which transmits light having a specific wavelength on the light emitting side of a pixel is formed.

In order to form a light emitting layer that emits white light, for example, $Alq_3$, $Alq_3$ partly doped with Nile red that is a red light emitting pigment, $Alq_3$, p-EtTAZ, TPD (aromatic diamine) are laminated sequentially by an evaporation method to obtain white light. In the case that the light emitting layer is formed by a coating method using spin coating, it is preferably baked by vacuum heating after coating. For example, an aqueous solution of poly(ethylene dioxythiophene)/poly(styrene sulfonic acid) solution (PEDOT/ PSS) may be entirely applied and baked, as a hole injection layer. Thereafter, a polyvinyl carbazole (PVK) solution doped with a luminescent center pigment (1,1,4,4-tetraphenyl-1,3-butadiene (TPB); 4-dicyanomethylene-2-methyl-6-(p-dimethylamino-styryl)-4H-pyran (DCM1); Nile red; coumarin 6 or the like) may be entirely applied and baked so that it function as a light emitting layer.

The light emitting layer may be formed as a single layer. For example, a 1,3,4-oxadiazole derivative (PBD) having electron transportability may be dispersed in polyvinyl carbazole (PVK) having hole transportability. Further, white light emission can be obtained by dispersing PBD of 30 wt % as an electron transporting agent and dispersing an appropriate amount of four kinds of pigments (TPB, coumarin 6, DCM1, and Nile red). In addition to the light emitting element from which white light emission can be obtained as shown here, a light emitting element which can provide red light emission, green light emission, or blue light emission can be manufactured by appropriately selecting materials of the light emitting layer.

Further, a triplet excitation material containing a metal complex or the like as well as a singlet excitation light emitting material may be used for the light emitting layer. For example, among pixels emitting red, green, and blue light, a pixel emitting red light whose luminance is reduced by half in a relatively short time is formed of a triplet excitation light emitting material and the rest are formed of a singlet excitation light emitting material. A triplet excitation light emitting material has a characteristic that the material has a good luminous efficiency and consumes less power to obtain the same luminance. When it is used for a red pixel, only small amount of current needs to be applied to a light emitting element. Thus, reliability can be improved. A pixel emitting red light and a pixel emitting green light may be formed of a triplet excitation light emitting material and a pixel emitting blue light may be formed of a singlet excitation light emitting material to form low power consumption. Low power consumption can be further formed by forming a light emitting element which emits green light to which the human eye has high visibility with a triplet excitation light emitting material.

A metal complex used as a dopant is an example of a triplet excitation light emitting material, and a metal complex having platinum that is a third transition series element as a central metal, a metal complex having iridium as a central metal, and the like are known. A triplet excitation light emitting material is not limited to these compounds. A compound having the above mentioned structure and an element belonging to any of the Groups 8 to 10 of the periodic table as a central metal can also be used.

The above mentioned materials for forming the light emitting layer are just examples. A light emitting element can be formed by appropriately laminating functional layers such as a hole injection-transport layer, a hole transport layer, an electron injection-transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or light emitting region, modification such as providing an electrode layer for the purpose or providing a dispersed light emitting material is acceptable as long as it does not deviate from the spirit of the present invention.

A light emitting element formed with the above mentioned materials emits light by being biased in a forward direction. A pixel of a display device formed with a light emitting element can be driven by a simple matrix mode or an active matrix mode as shown in Embodiment Mode 2. In any event, each pixel emits light by applying a forward bias thereto at a specific timing; however, the pixel is in a non-light-emitting state for a certain period. The reliability of a light emitting element can be improved by applying a reverse bias at this non-light-emitting time. In a light emitting element, there is a deterioration mode in which emission intensity is decreased under specific driving conditions or a deterioration mode in which a non-light-emitting region is enlarged in the pixel and luminance is apparently decreased. However, progression of the deterioration can be slowed down by alternating current driving in which bias is applied in forward and reverse directions. Thus, reliability of a light emitting device can be improved. Additionally, both of digital driving and analog driving can be applied.

Figure 21B:
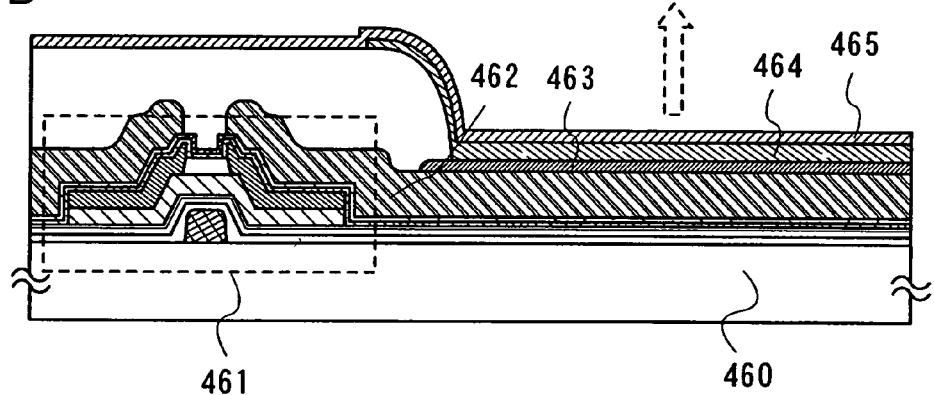
Figure 21C:
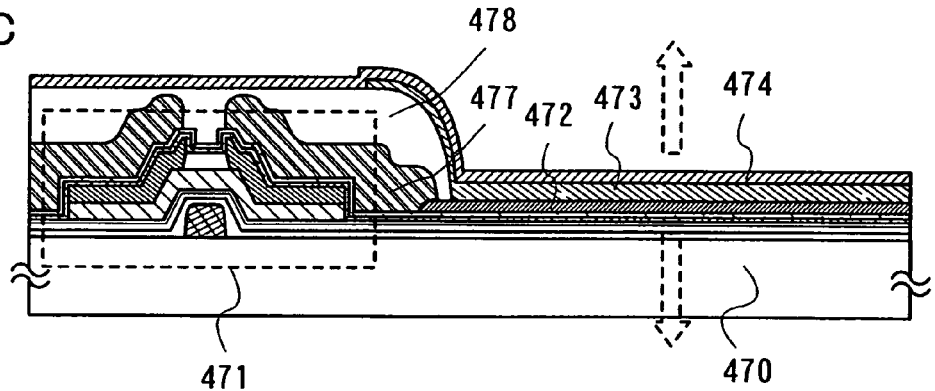

A color filter (coloring layer) may be formed over a sealing substrate which is opposed to the substrate having the elements although it is not shown in FIGS. 21(A) to 21(C). The color filter (coloring layer) can be selectively formed by a droplet discharging method. With the use of a color filter (coloring layer), high-definition display can also be performed. This is because a broad peak can be modified to be sharp in light emitting spectrum of each RGB with a color filter (coloring layer).

As above mentioned, the case where a material indicating luminescence of RGB is shown, however, full color display can be performed by forming a material indicating a monochrome color and combining a color filter or a color conversion layer. The color filter (coloring layer) or the color conversion layer is formed over, for example, a sealing substrate and may be attached to a substrate. As above mentioned, any of the material indicating a monochrome color, the color filter (coloring layer), and the color conversion layer can be formed by a droplet discharging method.

Naturally, a monochrome color emission may be displayed. For example, a display device having an area color type may be manufactured by using monochrome color emission. A passive matrix type display portion is suitable for the area color type, and characters or symbols can be mainly displayed.

In the above mentioned structure, it is possible to use a material having a low work function as a cathode, and for example, Ca, Al, CaF, MgAg, AlLi, or the like is preferable. Any of a single layer type, a laminated layer type, a mixed type having no interface of layers can be used for the electroluminescent layer. The electroluminescent layer may be formed by a singlet material, a triplet material, or a material in which the materials are mixed; or a charge injection-transport substance and a light emitting material including an organic compound or an inorganic compound, which includes one layer or plural layers of a low molecular weight organic compound material, a middle molecular weight organic compound (which means an organic compound having no sublimation properties, and the number of molecules is 20 or less or the length of linked molecules is 10 µm or less), and a high molecular weight organic compound, and may be combined with an electron injection-transport inorganic compound or a hole injection-transport inorganic compound. The first electrode 484, the second electrode 465, and the first electrode 472, and the second electrode 474 are formed by using a transparent conductive film which transmits light, and for example, a transparent conductive film in which zinc oxide (ZnO) of 2 to 20% is mixed in indium oxide is used, in addition to ITO or ITSO. Plasma treatment in an oxygen atmosphere or heat treatment in vacuum atmosphere may be preferably performed before forming the first electrode layer 484, the first electrode layer 463 and the first electrode layer 472. The partition wall (also referred to as a bank) is formed by using a material containing silicon, an organic material or a compound material. Additionally, a porous film may be used. However, when a photosensitive material or a non-photosensitive material such as acrylic or polyimide is used to form it, the side face thereof has a shape in which a radius curvature changes continuously and a disconnection due to a process is not generated in an upper layer thin film; therefore, it is preferable. This embodiment mode can be freely combined with the above mentioned embodiment modes.

Embodiment Mode 5

A method for mounting a driver circuit over the display panel manufactured according to Embodiment Modes 4 to 7 will be described.

A display device employing COG technique will first be described with reference to FIG. 30(A). A pixel portion 2701 for displaying information such as characters or images is provided over a substrate 2700. A substrate over which plurality of driver circuits are provided is divided into rectangular ones. The divided driver circuits driver ICs 2751 are mounted over the substrate 2700. FIG. 30(A) shows a case in which the plural driver ICs 2751 are mounted and FPCs 2750 are mounted on the ends of the plural driver ICs 2751. Alternatively, one side of the divided driver IC may be set to be almost the same as the length of one side of the pixel portion along the signal line side, and a tape may be mounted to one driver IC, or the end of the driver IC.

Meanwhile, TAB technique may be employed. In this case, a plurality of tapes may be attached to the substrate and the driver ICs may be mounted to the tapes as shown in FIG. 30(B). In the same manner as COG technique, one driver IC may be attached to one tape. In this case, a metal piece or the like for fixing the driver IC may also be attached from a viewpoint of strength.

In order to improve the productivity, a plurality of driver ICs, which will be mounted over display panels, are preferably formed on a rectangular substrate having 300 to 1000 mm.

That is, a plurality of circuit patterns each including a driver circuit portion and an input/output terminal as a unit may be formed over a substrate and then, be divided from one another. In consideration of the length of one side of the pixel portion or a pixel pitch, rectangular driver ICs each having a long side of 15 to 80 mm and a short side of 1 to 6 mm may be formed. Alternatively, driver ICs each having the sum of one side of a pixel region, or one side of a pixel portion and one side of each driver circuit may be formed.

The advantage of an outside dimension of the driver ICs over IC chips is a length of a long side. When using driver ICs each having a long side of 15 to 80 mm, the number of the driver ICs required to be mounted corresponding to a pixel portion can be lower as compared with the case of using IC chips, thereby increasing the manufacturing yield. When the driver ICs are formed over a glass substrate, the shape of a mother substrate is not limited, and hence, the productivity is not impaired. This is very advantageous point as compared with the case of forming IC chips using a circular silicon wafer.

When a scanning line side driver circuit 3702 is formed to be integrated over a substrate as shown in FIG. 25(B), signal line side driver circuits and driver ICs on which are formed the driver circuits are mounted on a region outside of a pixel portion 3701. These driver ICs are signal line side driver circuits. In order to form a pixel region corresponding to RGB full color, 3072 signal lines are required in a XGA class whereas 4800 signal lines are required in an UXGA class. Such signal lines are separated into several blocks at the end of the pixel portion 3701 to form leading lines. The leading lines are gathered in accordance with a pitch of an output terminal of each driver IC.

The driver ICs are preferably formed by using a crystalline semiconductor formed over a substrate. The crystalline semiconductor is preferably formed by being irradiated with continuous wave laser light. Therefore, as an oscillator for generating laser light, a continuous wave solid state laser or gas laser is used. By using a continuous wave laser, a transistor can be formed with fewer crystal defects by using a polycrystalline semiconductor layer having a large grain size. Since the mobility and the response speed are favorable, it can be driven at higher speed so that the operating frequency of an element can be increased as compared with a conventional one. In addition, this transistor has less characteristic variation, thereby providing a high reliability. Further, in order to further increase the operating frequency, a channel length direction of this transistor may be a same as a scanning direction of laser light. In a laser crystallization process using a continuous wave laser, the highest mobility can be obtained in the case where the channel length direction of the transistor is approximately parallel (preferably, −30° or more and 30° or less) to the scanning direction of laser light with respect to a substrate. Furthermore, the channel length direction corresponds to a direction in which current flows, that is to say, a direction in which charges move in a channel formation region. The thus-manufactured transistor has an active layer formed of a polycrystalline semiconductor layer in which crystal grains extend in a channel direction. This indicates that crystal grain boundaries are approximately formed along the channel direction.

To perform the laser crystallization, laser light is preferably condensed to a large extent. The width of the laser light (beam spot) is preferably set to be about 1 mm or more and 3 mm or less, which is equal to a width of a short side for the driver IC. In order to secure the sufficient and the efficient energy density to an object, a region to be irradiated by laser light has preferably a linear shape. Further, the term "linear shape" here indicates a rectangular shape or a elongated elliptical shape having high aspect ratio, rather than a line in the truest sense. For example, the linear shape indicates a shape having, an aspect ratio of 2 or more (preferably, 10 or more and 10000 or less). By matching the width of the shape (beam spot) of laser light and laser light with the length of the short side for a driver IC, a method for manufacturing a display device with improved productivity can be provided.

As shown in FIGS. 30(A) and 30(B), driver ICs may be mounted both as scanning line driver circuits and signal line driver circuits. In this case, the specification of the scanning line side driver circuits may be differed from the specification of the signal line side driver circuits.

In a pixel region, signal lines and scanning lines intersect with one another to form a matrix and a transistor is placed in each intersection. A feature of the present invention is that TFTs each including an amorphous semiconductor or a semiamorphous semiconductor as a channel portion are used as the transistors arranged in the pixel region. The amorphous semiconductor is formed by a plasma CVD method, a sputtering method or the like. The semiamorphous semiconductor can be formed at a temperature of 300° C. or less by the plasma CVD method. For example, the semiamorphous semiconductor with a necessary thickness for forming a transistor can be formed even over a non-alkali glass substrate having a dimension of 550 mm×650 mm at short times. This feature, of manufacturing technique is effective in manufacturing a display device with a large screen. By forming a channel formation region using an SAS, a semiamorphous TFT can obtain the electric field-effect mobility of 2 to 10 $cm^2/V \cdot sec$. In addition, since a pattern having a desired shape can be formed with good controllability according to the present invention, a minute wiring with an extremely narrow channel width can be formed stably without a short-circuit or the like. A TFT having an electric property that is necessary to operate a pixel sufficiently can be formed. Therefore, this TFT can be used as a switching element of a pixel or an element constituting a scanning line side driver circuit. Consequently, a display panel in which a system-on-panel is realized can be manufactured.

A scanning line side driver circuit can also be formed over the substrate to be integrated by using a TFT having a semiconductor layer formed with an SAS. When a TFT having a semiconductor layer formed with an AS is used, the drive ICs may be mounted as both a scanning line side driver circuit and a signal line side driver circuit.

In this case, the specification of the driver IC used on the scanning line side is preferably differed from that of the driver IC used on the signal line side. For example, although the withstand pressure of approximately 30V is required for a transistor constituting a scanning line side driver IC, a driving frequency of 100 kHz or less and therefore, relatively high-speed operation is not required. Accordingly, it is preferable that the channel length (L) of the transistor constituting the scanning line side driver IC be set to be sufficiently long. On the other hand, although the transistor of the signal line side driver IC requires the withstand pressure of only about 12V, it requires a driving frequency of about 65 MHz at 3V, and therefore, high-speed operation is required. Accordingly, the channel length or the like of a transistor constituting a driver is preferably set to be in micrometer rule. According to the present invention, a microscopic pattern can be formed good controllability, it can be formed in the micrometer rule.

The method for mounting driver ICs is not particularly limited, and COG method, wire bonding method, or TAB method, which is known, can be used.

By adjusting the thickness of a driver IC to equal to the thickness of a counter substrate, the height between the driver IC and the counter substrate is approximately equal, thereby contributing to the reduction in thickness of a display device as a whole. Also, by forming respective substrates using the same material, heat stress is not generated and the characteristics of a circuit manufactured using a TFT are not impaired even when a temperature of the display device is changed. Additionally, by forming driver circuits using longer driver ICs than IC chips as shown in this embodiment mode, the number of the driver ICs mounted on one pixel region can be reduced.

As above mentioned, the driver circuits can be incorporated into a display panel.

Embodiment Mode 6

An example of a protective circuit provided in the display device of the present invention is described.

Figure 27A:
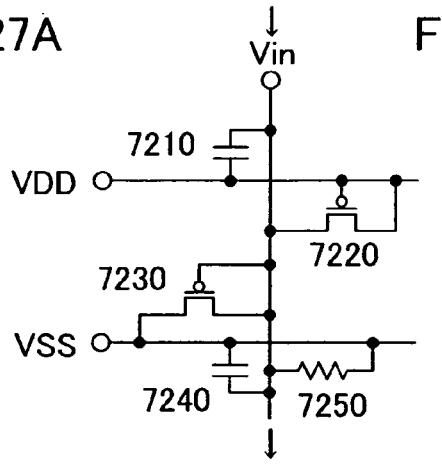
FIGS. 27(A) to 27(E) illustrate protection circuits to which the present invention is applied.

A protective circuit 2713 can be formed between an external circuit and an internal circuit as shown FIGS. 30(A) and 30(B). The protective circuit includes one or more elements selected from a TFT, a diode, a resistor element, or a capacitor element, hereinafter structures and the operation of some protective circuits are described. First, a structure of an equivalent circuit diagram of a protective circuit corresponding to one input terminal, which is a protective circuit disposed between an external circuit and an internal circuit, is described with reference to FIGS. 27(A) to 27(E). A protective circuit shown in FIG. 27(A) comprises P-type thin film transistors 7220 and 7230, a capacitor element 7210, a capacitor element 7240, and a resistor element 7250. The resistor element 7250 is a resistor with two terminals, having an input voltage Vin (hereinafter, referred to as Vin) in one terminal and a low-side voltage VSS (hereinafter, referred to as VSS) in the other terminal.

Figure 27D:
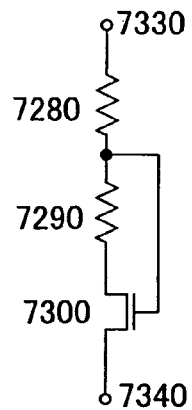
Figure 27B:
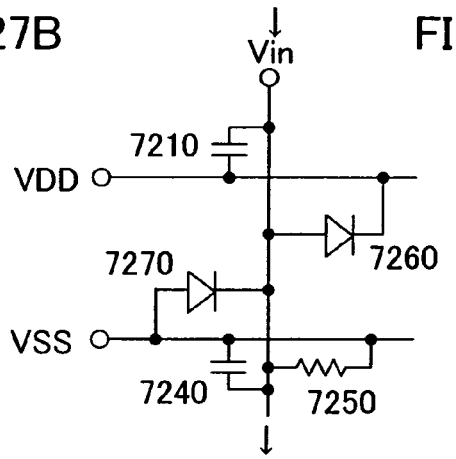
Figure 27E:
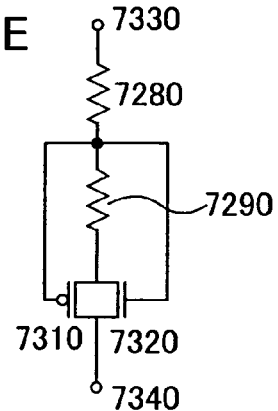
Figure 27C:
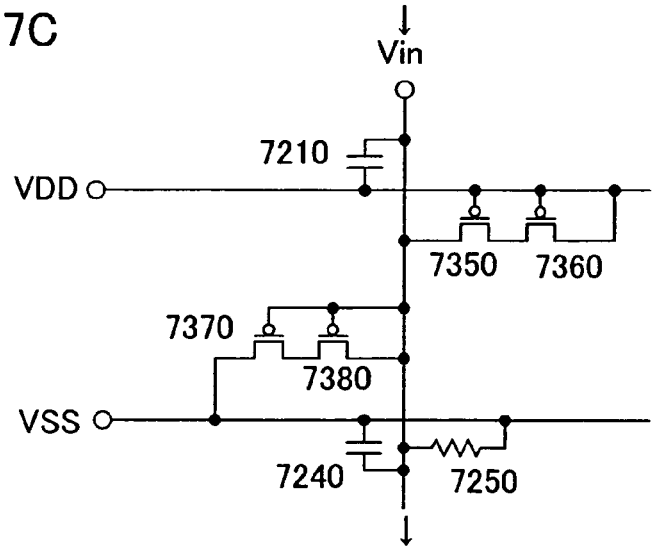

The protective circuit shown in FIG. 27(B) is an equivalent circuit diagram in which the P-channel thin film transistors 7220 and 7230 are substituted with rectifying diodes 7260 and 7270. A protective circuit shown in FIG. 27(C) is an equivalent circuit diagram in which the P-channel thin film transistors 7220 and 7230 are substituted with TFTs 7350, 7360, 7370, and 7380. In addition, a protective circuit having a still another configuration is shown in FIG. 27(D), which includes resistors 7280 and 7290, and an N-channel thin film transistor 7300. A protective circuit shown in FIG. 27(E) includes resistors 7280 and 7290, a P-channel thin film transistor 7310, and an N-channel thin film transistor 7320. By providing a protective circuit, a sudden surge of potentials can be prevented, thereby element breakdown or damage can be prevented, which results in higher reliability. Note that an element having the aforementioned protective circuit is preferably formed using an amorphous semiconductor having high withstand pressure. This embodiment mode can be freely combined with the above mentioned embodiment modes.

This embodiment mode can be implemented in combination with any of Embodiment Modes 1 to 14.

Embodiment Mode 7

Structures of pixels for a display panel shown in this embodiment mode will be described with reference to equivalent circuit diagrams illustrated in FIGS. 28(A) to 28(F). In this embodiment mode, an example that a light emitting element (EL element) is used as a display element of a pixel is shown.

Figure 28A:
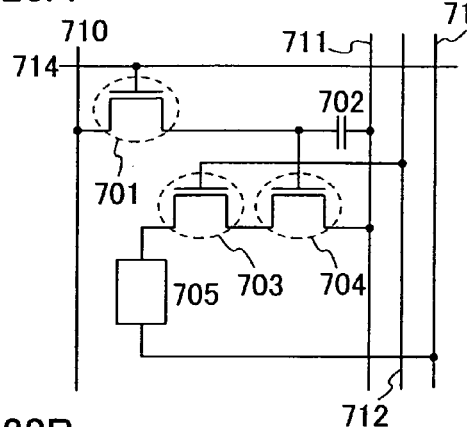
FIGS. 28(A) to 28(F) are circuit diagrams explaining structures of pixels that can be applied to an EL display panel of the present invention.

In a pixel as shown in FIG. 28(A), a signal line 710 and power supply lines 711 to 713 are arranged in columns, whereas a scanning line 714 is arranged in a row. A pixel also includes a switching TFT 701, a driving TFT 703, a current controlling TFT 704, and in addition to these a capacitor element 702 and a light emitting element 705.

Figure 28D:
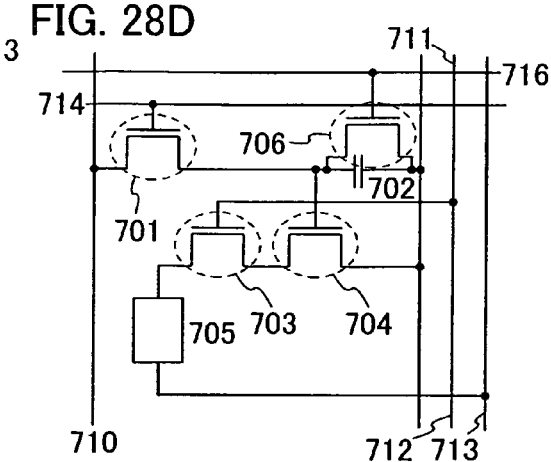
Figure 28B:
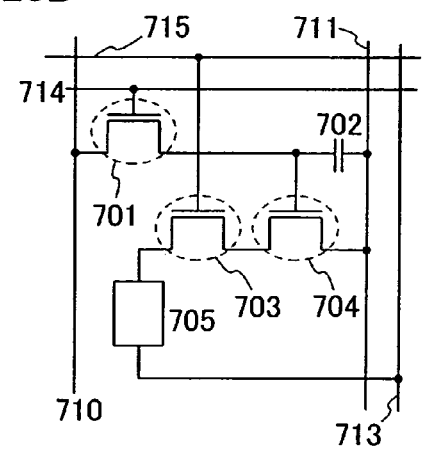
Figure 28E:
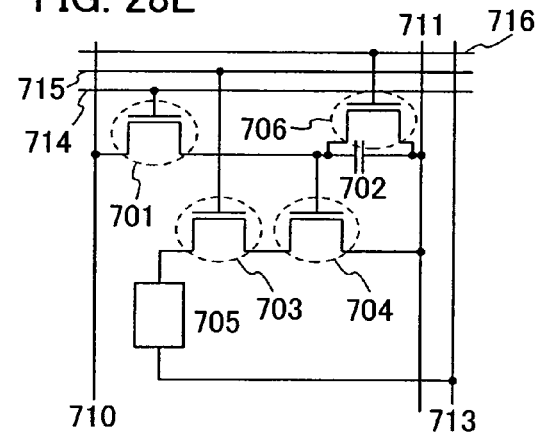
Figure 28C:
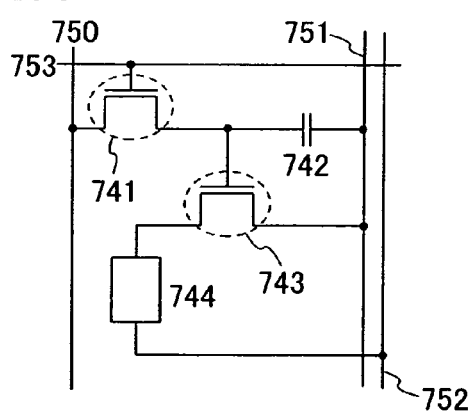

A pixel as shown in FIG. 28(C) has the same structure as the one shown in FIG. 28(A), except that a gate electrode of the TFT 703 is connected to a power supply line 715 that is arranged in a row. That is, both pixels depicted in FIGS. 28(A) and 28(C) show the same equivalent circuit diagrams. However, respective power supply lines are formed of conductive layers in different layers between the cases where the power supply line 712 is provided in a column (FIG. 28(A)) and where the power supply line 715 is arranged in a row (FIG. 28(C)). In order to focus on the lines to which the gate electrodes of the TFTs 703 are connected, they are individually illustrated in FIGS. 28(A) and 28(C) to show that they are formed in different layers.

As a feature of the pixel shown in each FIGS. 28(A) and 28(C), the TFT 703 and the TFT 704 are connected in series in each pixel, and the channel length $L_3$ and, the channel width $W_3$ of the TFT 703 and the channel length $L_4$ and the channel width $W_4$ of the TFT 704 are set to satisfy: $L_3 W_3$: $L_4/W_4$=5 to 6000:1. For example, when $L_3$ and $W_3$ are set to be 500 μm and 3 μm and $L_4$ and $W_4$ are set to be 3 μm and 100 μm, they satisfies 6000:1. Since a minute patterning can be conducted according to the present invention, such a wiring having a thin channel width can be formed stably without a short-circuit or the like. Accordingly, a TFT having electronic characteristics that are required for sufficiently functioning the pixels as shown in FIGS. 28(A) and 28(C) can be formed, thereby manufacturing a display device with an excellent display function along with high reliability.

The TFT 703 is operated in a saturation region and controls the value of current flowing through the light emitting element 705, whereas the current controlling TFT 704 is operated in a linear region and controls a current supplied to the light emitting element 705. The both TFTs preferably have the same conductivity type in view of the manufacturing process. For the TFT 703, a depletion type TFT may be used instead of an enhancement type one. According to the present invention having the above structure, slight variations in $V_{GS}$ of the TFT 704 does not adversely affect the value of current flowing through the light emitting element 705, since the TFT 704 is operated in the linear region. That is, the value of current flowing through the light emitting element 705 is determined by the TFT 703 operated in the saturation region. Accordingly, it is possible to provide a display device in which image quality is improved by improving variations in luminance of the light emitting element due to variation of the TFT characteristics according to the present invention having the above structure.

The TFT 701 of each pixel as shown in FIGS. 28(A) to 28(D) controls a video signal input to the pixel. When the TFT 701 is turned on and a video signal is input into the pixel, the video signal is held in the capacitor element 702. Although the structure of each pixel includes the capacitor element 702 are shown in FIGS. 28(A) and 28(C), the present invention is not limited to these structures. When a gate capacitance or the like can serve as a capacitor for holding a video signal, the capacitor element 702 may not be provided explicitly.

The light emitting element 705 has a structure in which an electroluminescent layer is sandwiched between two electrodes. A potential difference is maintained between a pixel electrode and a counter electrode (between an anode and a cathode) such that a forward bias voltage is applied. The electroluminescent layer is formed of various kinds of materials such as an organic material and an inorganic material. Luminescence in the electroluminescent layer includes luminescence that is generated when a singlet excited state returns to a ground state (fluorescence), and luminescence that is generated when a triplet exited state returns to a ground state (phosphorescence).

A pixel as shown in FIG. 28(B) has the same structure as the one shown in FIG. 28(A), except that a TFT 706 and a scanning line 716 are added thereto. Similarly, a pixel as shown in FIG. 28(D) has the same structure as the one shown in FIG. 28(C), except that a TFT 706 and a scanning line 716 are added thereto.

On/off of the TFT 706 is controlled by the newly provided scanning line 716. When the TFT 706 is turned on, charges held in the capacitor element 702 are discharged, thereby turning the TFT 706 off. That is, supply of current flowing through the light emitting element 705 can be forcibly stopped by providing the TFT 706. Therefore, a lighting period can start simultaneously with or immediately after a writing period starts before signals are written into all the pixels according to the structures shown in FIGS. 28(B) and 28(D), and hence, the duty ratio can be improved.

Figure 28F:
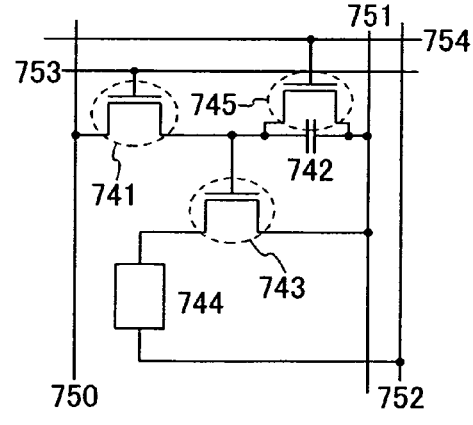

In a pixel as shown in FIG. 28(E), a signal line 750 and power supply lines 751 and 752 are provided in columns while a scanning line 753 is provided in a row. The pixel includes a TFT 741 for switching, a TFT 743, for driving, further a capacitor element 742, and a light emitting element 744. A pixel shown in FIG. 28(F) has the same structure as the one shown in FIG. 28(E), except that a TFT 745 and a scanning line 754 are added. Further, the structure as shown in FIG. 28(F) also allows a duty ratio to be improved by providing the TFT 745.

As described above, according to the present invention, a pattern of a wiring or the like can be formed stably and precisely without defects in formation which results in a TFT having excellent electronic characteristics and high reliability. The present invention can be applicable to an applied technology for improving a displaying function of a pixel in accordance with an intended purpose.

This embodiment mode can be implemented in combination with any of Embodiment Modes 1 to 16.

Embodiment Mode 8

Figure 18:
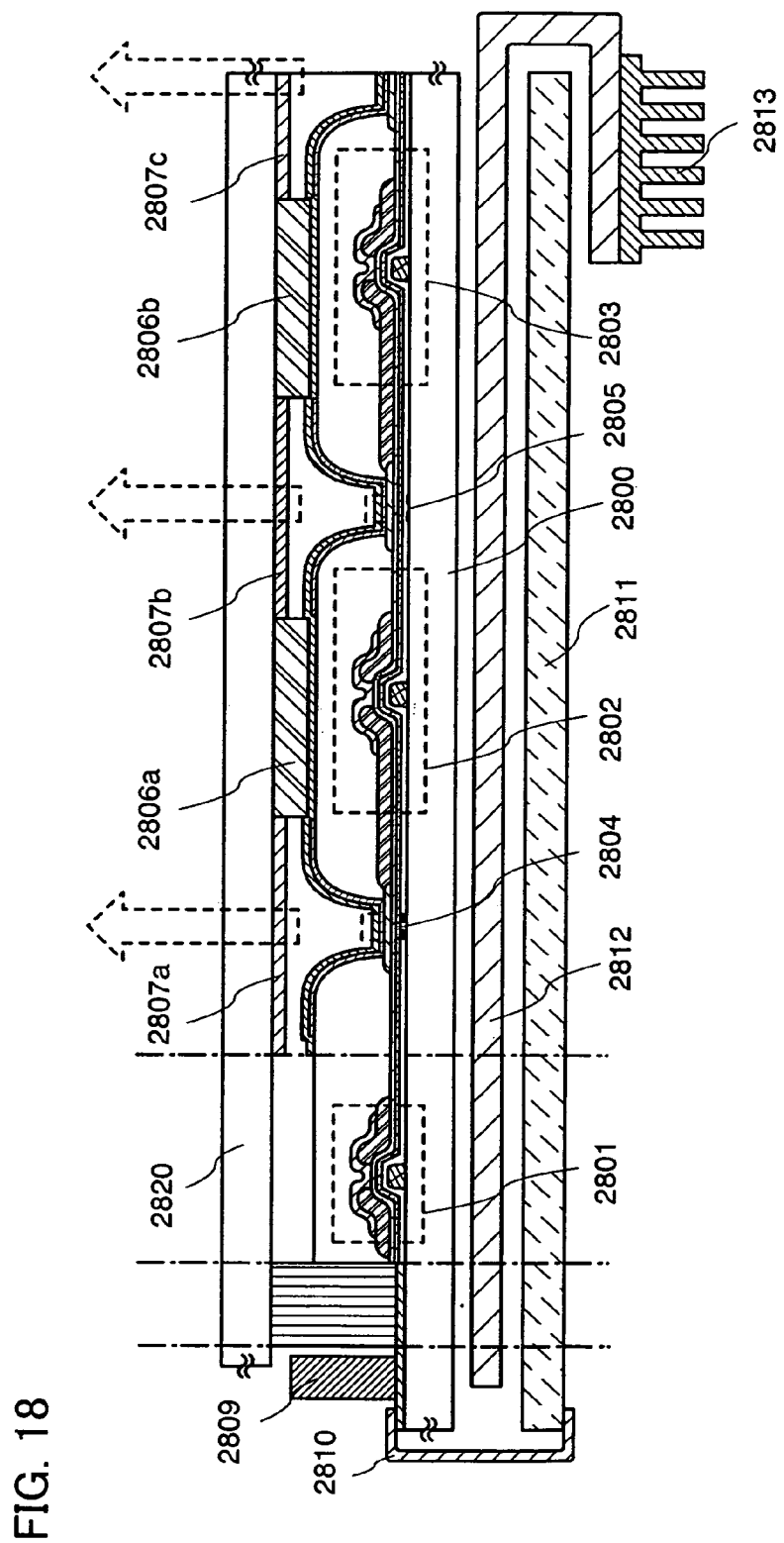
FIG. 18 is a cross-sectional view explaining a structural example of an EL display module according to the present invention.

This embodiment mode is described as shown in FIG. 18. FIG. 18 shows an example of a structure of an EL display module formed by using a TFT substrate 2800 manufactured according to the present invention. In FIG. 18, a pixel portion including pixels is formed over the TFT substrate 2800.

In FIG. 18, a protective circuit portion 2801 including a TFT that is same as one formed in a pixel or in which a gate and a source or drain of the TFT are connected to each other and are performed in the same manner as a diode is formed between a driver circuit and the pixel and in the outside of the pixel portion. A driver IC formed of a single crystal semiconductor, a stick driver IC formed of a polycrystalline semiconductor film over a glass substrate, a driver circuit formed using an SAS, or the like is applied for a driver circuit 2809.

The TFT substrate 2800 is firmly attached to a sealing substrate 2820 through a spacer 2806a and a spacer 2806b, which are formed by a droplet discharging method, therebetween. The spacers are preferably provided to keep a constant gap between the two substrates, even when, the substrates are thin and a region of the pixel portion is increased. A resin material having a light-transmitting property may be provided to fill at least in a visible region the gap between the TFT substrate 2800 and the sealing substrate 2820, over a light emitting element 2804 and a light emitting element 2805 connecting to a TFT 2802 and a TFT 2803 and then be cured. Alternatively, the gap therebetween may be filled with anhydrous nitrogen or an inert gas.

FIG. 18 shows a case where the light emitting element 2804, the light emitting element 2805 and a light emitting element 2815 have a structure in which light is emitter upwardly (a top emission type structure), wherein light is emitted in a direction indicated by arrows as illustrated in the drawing. By forming pixels having different luminescent colors of red, green and blue, multicolor display can be carried out. In addition, in this case, color purity of light emitted to the outside can be increased by forming a colored layer 2807a, a colored layer 2807b and a colored layer 2807c corresponding to each color on the sealing substrate 2820 side. Alternatively, the pixels may be formed as white light emitting elements in combination with the colored layer 2807a, the colored layer 2807b and the colored layer 2807c.

The driver circuit 2809, which is an external circuit, is connected to a scanning line or a signal line connection terminal provided in an edge of the TFT substrate 2800 with a wiring substrate 2810. Alternatively, a heat pipe 2813 and a radiator plate 2812 may be provided to be in contact with or adjacent to the TFT substrate 2800 so as to enhance the effect of heat release.

Although a top emission EL module is shown in FIG. 18, a bottom emission structure or a dual emission structure in which light is emitted upwardly and downwardly may also be employed by changing the structure of a light emitting element or the arrangement of an external circuit substrate. In the case of the top emission type structure, an insulating layer serving as a partition wall may be colored to be used as a black matrix. This partition wall can be formed by a droplet discharging method. For example, it can be formed by mixing a black pigment resin, a carbon black or the like into a resin material such as polyimide. Further, a lamination of them may also be used.

In addition, an EL display module can also be constructed in which a retardation plate or a polarizing plate is used to shield the reflected light which enters from the outside. In the case of top emission structure, an insulating layer to serve as a partition wall is colored to be used as a black matrix. This partition wall can be formed by a droplet discharging method using a resin material such as a black pigment resin and polyimide mixed with a carbon black or the like, or laminations thereof may be used. By the droplet discharging method, different materials can be discharged to the same region over a plurality of times to form a partition wall. As a retardation plate, it is designed that a λ/4 plate and a λ/2 plate may be used to control light. The EL display module has a structure in which the TFT substrate 2800, the light-emitting element 2804, the sealing substrate (sealant) 2820, the first retardation plate and the second retardation plate (λ/4 plate and λ/2 plate), and a polarizing plate are provided in this order, and light emitted from the light-emitting element travels through these layers to be emitted outside from the polarizing plate. The retardation plates and the polarizing plate may be disposed on the side from which light is emitted, and in the case of a dual-emission display device which emits light to both sides, they may be disposed on both sides. In addition, an antireflection film may be provided outside the polarizing plate. Accordingly, higher-resolution and more precise images can be displayed.

Alternatively, a resin film may be attached to the pixel portion side of the TFT substrate 2800 side using a sealing material or an adhesive resin. Although a glass sealing using a glass substrate is shown in this embodiment mode, it can be sealed using various materials such as a resin, plastic and a film. A gas barrier film is preferably formed on the surface of the resin film to prevent moisture vapor from penetrating therethrough. By sealing it with the film, a display device can be made thinner and lighter.

This embodiment mode can be implemented in combination with any of Embodiment Modes 1 to 17.

Embodiment Mode 9

Figure 19:
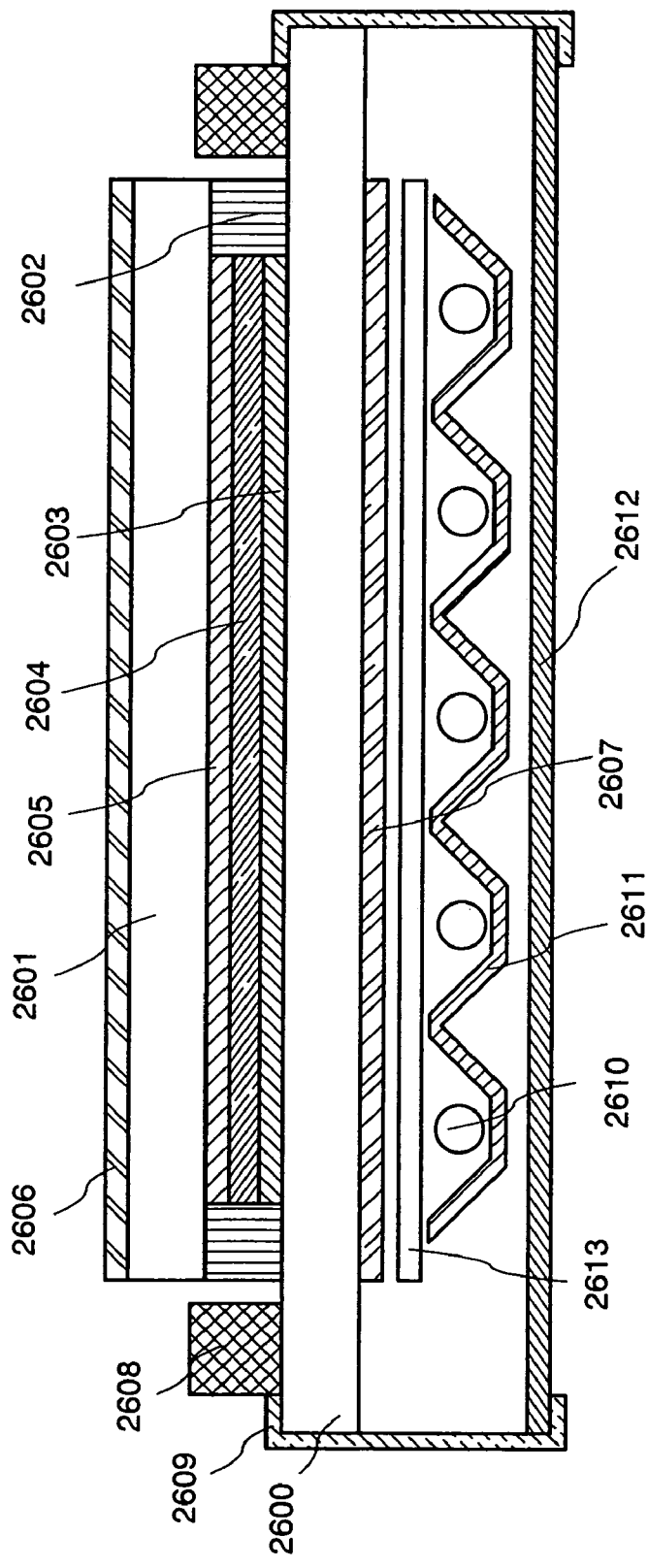
FIG. 19 is a cross-sectional view describing a structural example of a liquid crystal display module of the present invention.
Figure 20:
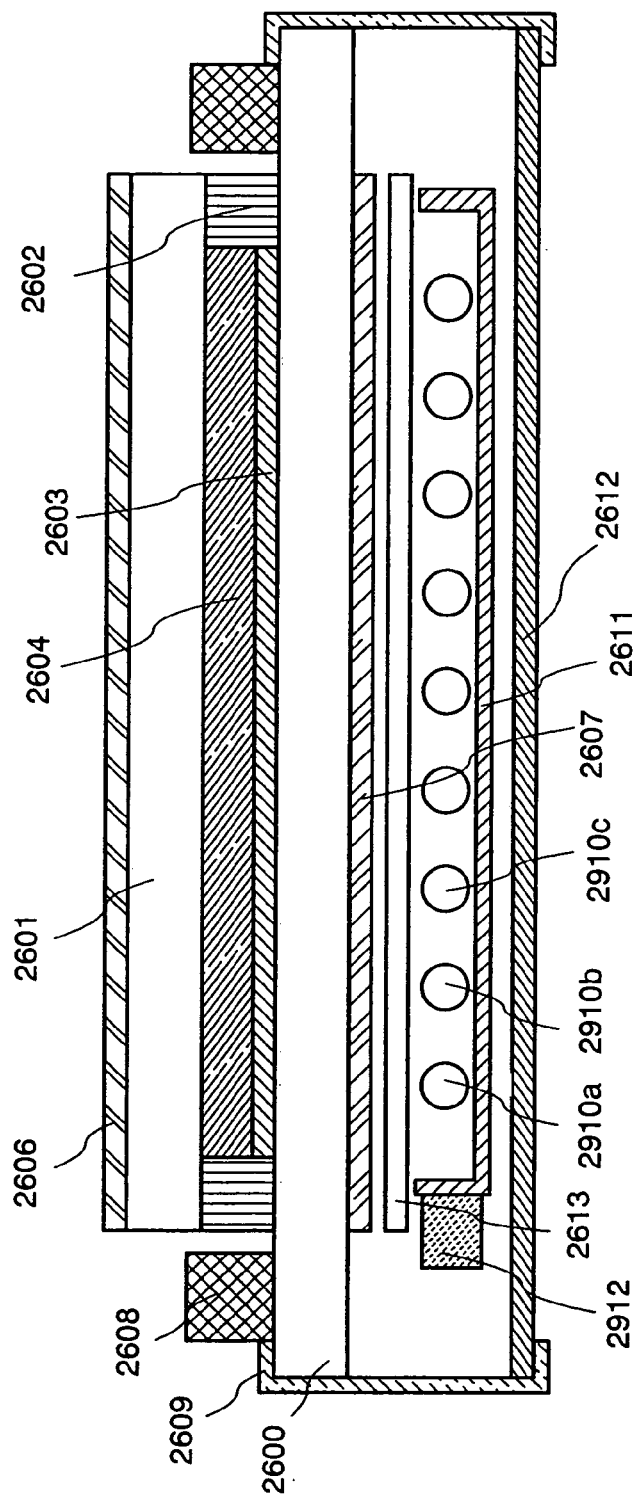
FIG. 20 is a cross-sectional view describing a structural example of a liquid crystal display module of the present invention.

This embodiment mode will be described with reference to FIG. 19 and FIG. 20. FIG. 19 and FIG. 20 show examples of forming liquid crystal display modules by using a TFT substrate 2600 that are manufactured according to the present invention.

FIG. 19 shows an example of a liquid crystal display module, wherein a TFT substrate 2600 and a counter substrate 2601 are firmly attached to each other by a sealing material 2602 and a pixel portion 2603 and a liquid crystal layer 2604 are provided between the substrates to form a display region. A colored layer 2605 is necessary to perform a color display. In the case of the RGB system, colored layers corresponding to respective colors of red, green and blue are provided to each pixel. In the outsides of the TFT substrate 2600 and the counter substrate 2601, polarizing plates 2606 and 2607 and a lens film 2613 are provided. A light source includes cold-cathode tubes 2610 and a reflecting plate 2611. A circuit substrate 2612 is connected to the TFT substrate 2600 by a flexible wiring substrate 2609. External circuits such as a control circuit and a power supply circuit are incorporated in the circuit substrate 2612. The liquid crystal display module can employ a TN (Twisted Nematic) mode, an IPS (In-Plane-Switching) mode, an MVA (Multi-domain Vertical Alignment) mode, an ASM (Axially Symmetric aligned Microcell) mode, an OCB (Optical Compensated Birfringenence) mode or the like.

Especially, properties of a display device manufactured according to the present invention can be improved by using the OCB mode that can response at high speed. FIG. 20 shows an example in which the OCB mode is applied to a liquid crystal display module of FIG. 19, so that it becomes an FS-LCD (a field sequential-LCD). The FS-LCD performs each of red light emission, green light emission and blue light emission in one flame period. An image is synthesized by using a time division system so that a color display can be performed. Also, emission of each color is made using light emitting diodes, cold-cathode tubes or the like, and hence, a color filter is not required. Therefore, since the arrangement of color filters of red, green and blue is not required, nine times the pixels can be displayed in the same region as the case of using the color filters. On the other hand, since light emission of three colors is performed in one flame period, a high speed response of a liquid crystal is needed. When an FS system and the OCB mode can be applied to the display device of the present invention, a high-definition display device and a high-definition liquid crystal television device with higher performance can be completed.

The liquid layer of OCB mode have so-called a π cell structure. In the π cell structure, liquid crystal molecules are aligned such that pre-tilt angles of the molecules are symmetrical with respect to the center plane between the active matrix substrate and the opposing substrate. The orientation in the π cell structure is splay orientation when the voltage is not applied to the substrates, and shifts into bend orientation when the voltage is applied. Further application of voltage brings liquid crystal molecules in bend orientation to an orientation perpendicular to the substrates, which allows light to transmit therethrough. Note that using the OCB mode, a high-speed response about ten times faster than that of the conventional TN mode can be realized.

Further, as a mode corresponding to the FS system, an HV-FLC, an SS-FLC, or the like using ferroelectric liquid crystal (FLC: Ferroelectric Liquid Crystal) that can be operated at high speed, can also be used. A nematic liquid crystal that has relatively low viscosity is used for the OCB mode. A smectic liquid crystal is used for the HV-FLC and SS-FLC. As liquid crystal materials, materials such as an FLC, a nematic liquid crystal and a smectic liquid crystal can be used.

An optical response speed of a liquid crystal display module is increased by narrowing a cell gap of the liquid crystal display module. Alternatively, the optical response speed can be increased by lowering the viscosity of a liquid crystal material. Increasing the response speed is more effective in the case where a pixel or a dot pitch of a pixel region of a TN mode liquid crystal display module is 30 µm or less.

The liquid-crystal display module of FIG. 20 is of a transmissive type, where a red light source 2910a, a green light source 2910b and a blue light source 2910c are provided as light sources. A controlling portion 2912 is installed to control on/off of the red light source 2910a, the green light source 2910b and the blue light source 2910c as the light sources. The light emission of each color is controlled by the controlling portion 2912 and light enters the liquid crystal to generate an image using a time division system, thereby performing a color display.

As set forth above, a high-definition, highly reliable liquid crystal display module can be manufactured by using the present invention.

The present embodiment mode can be implemented by being combined with any of Embodiment Modes 1 to 17.

Embodiment Mode 10

A television device can be completed by using a display module (also referred to as a display panel) that is manufactured according to the above mentioned embodiment modes. There are a case in which only a pixel portion is formed and a scanning line driver circuit and a signal line driver circuit are mounted on the substrate by the TAB technology like FIG. 30(B) as the structure as shown in FIG. 25(A); a case in which the scanning line driver circuit and the signal line driver circuit are mounted on the substrate by the COG technique like FIG. 30(A); a case in which a TFT is formed using an SAS, a pixel portion and a scanning line side driver circuit are also formed over the substrate and a signal line side driver circuit is independently mounted as a driver IC as shown in FIG. 25(B); and a case in which a pixel portion, a signal line driver circuit and a scanning line driver circuit are formed over the same substrate as shown in FIG. 25(C); and the like. Any types of display panels may be used.

In addition, as other external circuits, a display device may include a video signal amplifier circuit which amplifies a video signal among signals received by a tuner, a video signal processing circuit which converts signals output from the video signal amplifier circuit into chrominance signals corresponding to each color of red, green and blue, a control circuit which converts the video signal into an input specification of a driver IC, and the like in an input side of a video signal. The control circuit outputs signals to both a scanning line side and a signal line side. In the case of digital driving, a signal dividing circuit may be provided in the signal line side and an input digital signal may be divided into m pieces to be supplied.

An audio signal among signals received by the tuner is sent to an audio signal amplifier circuit and is supplied to a speaker through an audio signal processing circuit. A control circuit receives control information about a receiving station (reception frequency) or sound volume from an input portion and transmits signals to the tuner and the audio signal processing circuit.

Figure 26A:
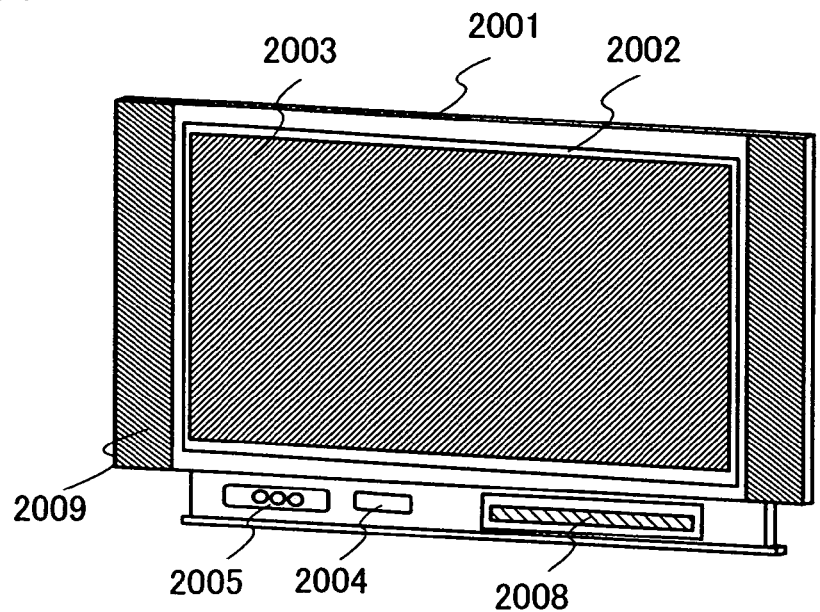
FIGS. 26(A) and 26(B) are views showing electronic appliances to which the present invention is applied.
Figure 26B:
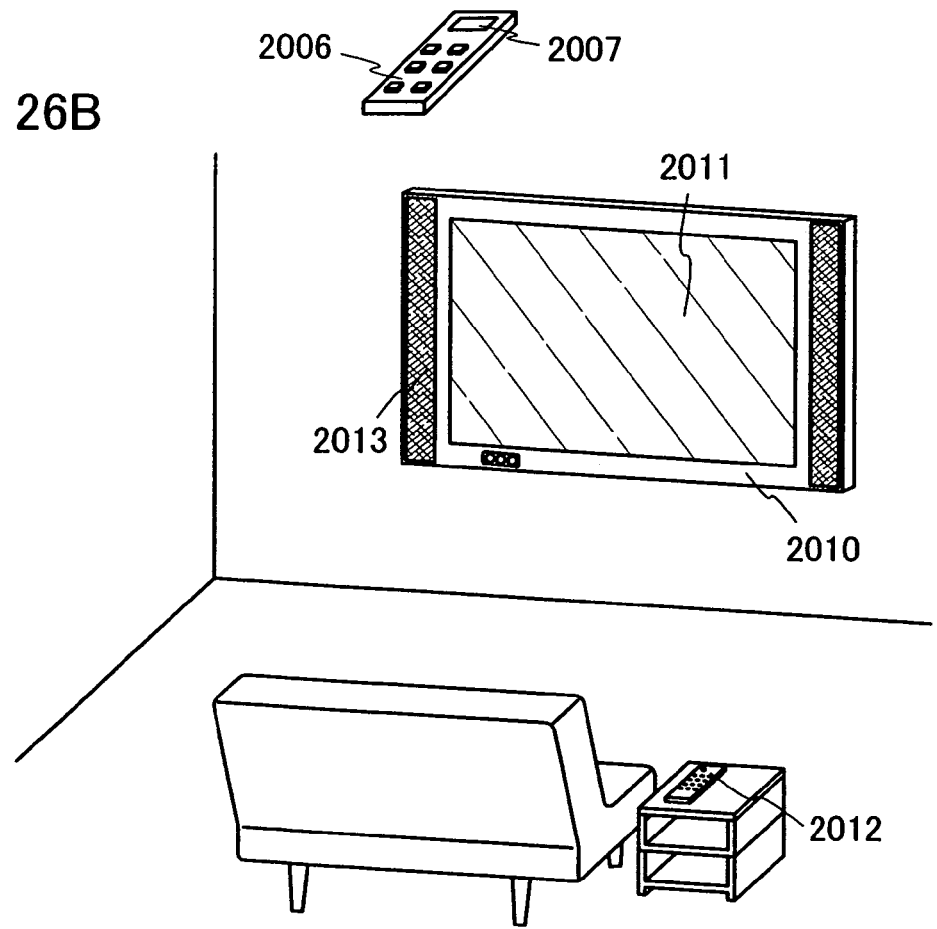

A television device can be completed by incorporating such a liquid crystal display module or an EL display module into a housing as shown in FIGS. 26(A) and 26(B). When an EL display module as shown in FIG. 18 is used, an EL television device can be completed. When using a liquid crystal display module as shown in FIG. 19 and FIG. 20, a liquid crystal television can be obtained. A main display screen 2003 is formed using the display module, and speaker portions 2009, an operation switch, and the like are provided as its accessory equipment. Thus, television devices can be completed according to the present invention.

A display panel 2002 is incorporated in a housing 2001 and a receiver 2005 used to receive general TV broadcast and further, is connected to a communication network by wired or wireless connections via a modem 2004 so that one-way (from a sender to a receiver) or two-way (between a sender and a receiver or between receivers) information communication can be carried out. The television device can be operated by using a switch built in the housing or a remote control unit 2006 which is prepared separately. Also, a display portion 2007 for displaying output information may also be provided in the remote control unit.

Additionally, the television device may include a sub screen 2008 formed using a second display panel for displaying channels, volume, and the like, in addition to the main screen 2003. In this structure, the main screen 2003 may be formed by using an EL display panel having wide viewing angle and the sub screen may be formed by using a liquid crystal display panel capable of displaying images at lower power consumption. In addition, in order to reduce the power consumption preferentially, the main screen 2003 may be formed with a liquid crystal display panel and the sub screen may be formed with an EL display panel, which can be blinked. According to the present invention, a highly reliable display device can be, formed even when a large size substrate is used and a large number of TFTs or electronic parts are used.

FIG. 26(B) shows a television device having a display portion of, e.g., 20 to 80 inches. The television device includes a housing 2010, a display portion 2011, a remote-control unit 2012 that is an operation portion; speaker portions 2013 and the like. The present invention is applied to the fabrication of the display portion 2011. Since the display portion of FIG. 26(B) is a wall-hanging type, it does not require a large installation space.

Of course, the present invention is not limited to the television device, and can be applied to various use applications, e.g., specifically, a large-size display medium such as an information display board in a train station, an airport, and the like, or an advertisement display board on the street, as well as a monitor of a personal computer.

Embodiment Mode 11

According to the present invention, various kinds of display devices can be manufactured. Namely, the present invention can be applied to various kinds of electronic appliances incorporating such display devices in display portions.

As examples of the electronic appliances, video cameras and digital cameras; projectors; head-mounted displays (a goggle type display); car navigation systems; car stereos; personal computers; game machines; portable information terminals (such as a mobile computer, a cellular phone and an electronic book); image reproduction devices provided with a recording medium (concretely, a device which can replay the recording medium such as a digital versatile disc (DVD) and display images thereof); and the like can be given. Specific examples thereof are shown in FIGS. 24(A) to 24(D).

Figure 24A:
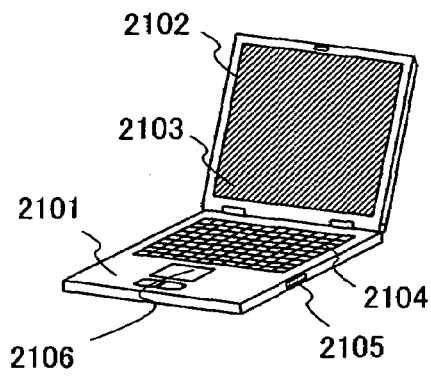
FIGS. 24(A) and 24(D) are views showing electronic devices to which the present invention is applied.

FIG. 24(A) shows a personal computer, which includes a main body 2101, a housing 2102, a display portion 2103, a keyboard 2104, an external connection port 2105, a pointing mouse 2106, and the like. The display portion 2103 can be manufactured according to the present invention. According to the present invention, a highly reliable, high-quality image can be displayed even if it is miniaturized and a wiring and the like become highly-refined.

Figure 24B:
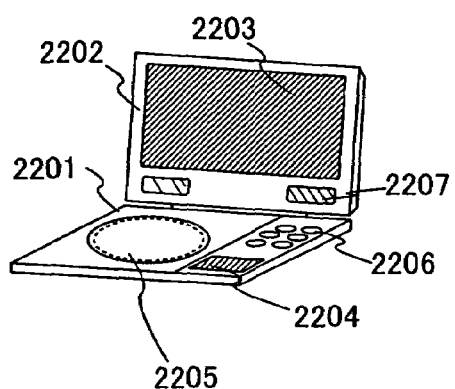

FIG. 24(B) shows an image reproduction device comprising a recording medium (specifically, a DVD player), which includes a main body 2201, a housing 2202, a display portion A 2203, a display portion B 2204, a recording medium (a DVD and the like) reading portion 2205, operation keys 2206, speaker portions 2207, and the like. The display portion A 2203 mainly displays image information, while the display portion B 2204 mainly displays character information. These display portion A 2203 and display portion B 2204 can be manufactured according to the present invention. According to the present, invention, a highly reliable, high-quality image can be displayed even if it is miniaturized and a wiring and the like become highly-refined.

Figure 24C:
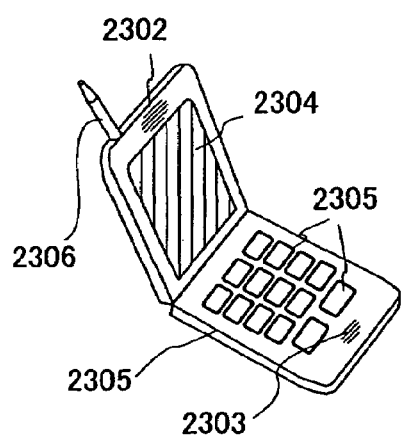

FIG. 24(C) shows a cellular phone, which includes a main body 2301, an audio output portion 2302, an audio input portion 2303, a display portion 2304, operation switches 2305, an antenna 2306, and the like. By applying a display device formed according to the present invention to the display portion 2304, a highly reliable, high-quality image can be displayed on the display portion even if it is miniaturized and a wiring and the like become highly-refined.

Figure 24D:
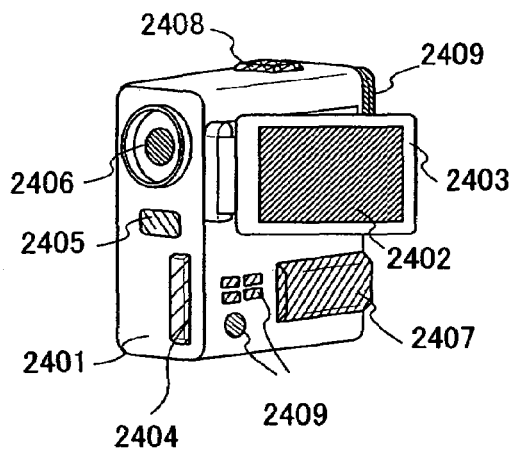

FIG. 24(D) shows a video camera, which includes a main body 2401, a display portion 2402, a housing 2403, an external connection port 2404, a remote control receiver 2405, an image receiving portion 2406, a battery 2407, an audio input portion 2408, operation keys 2409, and the like. The present invention can be applied to the display portion 2402. By applying a display device formed according to the present invention to the display portion 2304, a highly reliable, high-quality image can be displayed even if it is miniaturized and a wiring and the like become highly-refined. The present embodiment mode can be freely combined with the above mentioned embodiment modes.

The present invention is further applied to a semiconductor device. A semiconductor device manufactured according to the present invention is used for various purposes. For example, ID chips that are, one mode of the semiconductor devices according to the present invention can be used for bills, coins, securities documents, certificates, unregistered bonds, packing containers, books, recording media, personal belongings, carriages, foods, clothes, health goods, livingwares, medicals, electronic devices and the like. Moreover, the present invention can be used for a processor chip that is an aggregate having various signal processing functions.

The invention claimed is:

1. A method for manufacturing a display device, comprising the steps of:
    forming a first conductive layer which has a non-light-transmitting property over a substrate which has a light-transmitting property;
    forming an insulating layer over the substrate and the first conductive layer;
    forming a mask layer selectively over the insulating layer overlapping with the first conductive layer;
    forming a photoactive substance over the insulating layer and the mask layer;
    forming at least a first region and a second region by passing light through the substrate and irradiating the photoactive substance with light; and
    removing the mask layer and the photoactive substance which is formed over the mask layer and forming a third region; and
    forming a second conductive layer at the second region and the third region,
    wherein the second conductive layer includes a conductive material,
    wherein a wettability of the second region with respect to the conductive material is higher than a wettability of the first region with respect to the conductive material, and
    wherein a wettability of the third region with respect to the conductive material is higher than a wettability of the first region with respect to the conductive material.

2. A method for manufacturing a display device, comprising the steps of:
    forming a first conductive layer which includes a gate electrode region and a gate wiring region and has a non-light-transmitting property over a substrate having a light-transmitting property;
    forming an insulating layer over the substrate and the first conductive layer;
    forming a semiconductor layer over an insulating layer overlapping with the gate electrode region;
    forming a mask layer selectively over the insulating layer overlapping with the gate wiring region;
    forming a photoactive substance over the semiconductor layer and the mask layer;
    forming at least a first region and a second region by irradiating the photoactive substance with light passed through the substrate;
    removing the mask layer and the photoactive substance which is formed over the mask layer and forming a third region, and
    forming a second conductive layer at the second region and the third region,
    wherein the second conductive layer includes a conductive material,
    wherein a wettability of the second region with respect to the conductive material is higher than a wettability of the first region with respect to the conductive material, and
    wherein a wettability of the third region with respect to the conductive material is higher than a wettability of the first region with respect to the conductive material.

3. A method for manufacturing a display device, comprising the steps of:
    forming a first conductive layer which includes a gate electrode region and has a non-light transmitting property over a substrate having a light-transmitting property;
    forming an insulating layer over the substrate and the first conductive layer;
    forming a semiconductor layer over an insulating layer overlapping with the gate electrode region;
    forming a photoactive substance over the semiconductor layer;
    forming at least a first region and a second region by irradiating the photoactive substance with light passed through the substrate, and
    forming a second conductive layer at the second region,
    wherein the second conductive layer includes a conductive material, and
    wherein a wettability of the second region with respect to the conductive material is higher than a wettability of the first region with respect to the conductive material.

4. The method for manufacturing a display device according to claim 1, wherein a substance containing a triphenylmethane derivative, a substance containing an azobenzene derivative, or a spiropyran derivative is formed as the photoactive substance.

5. The method for manufacturing a display device according to claim 2, wherein a substance containing a triphenylmethane derivative, a substance containing an azobenzene derivative, or a spiropyran derivative is formed as the photoactive substance.

6. The method for manufacturing a display device according to claim 3, wherein a substance containing a triphenylmethane derivative, a substance containing an azobenzene derivative, or a spiropyran derivative is formed as the photoactive substance.

7. The method for manufacturing a display device according to claim 1, further comprising:
    forming a pixel electrode after forming the second conductive layer.

8. The method for manufacturing a display device according to claim 2, further comprising:
    forming a pixel electrode after forming the second conductive layer.

9. The method for manufacturing a display device according to claim 3, further comprising:
    forming a pixel electrode after forming the second conductive layer.

10. The method for manufacturing a display device according to claim 1, wherein the mask layer comprises a resin material.

11. The method for manufacturing a display according to claim 2, wherein the mask layer comprises a resin material.

* * * * *